United States Patent
Yamamoto et al.

(10) Patent No.: US 8,975,002 B2
(45) Date of Patent: Mar. 10, 2015

(54) POSITIVE RESIST COMPOSITION FOR IMMERSION EXPOSURE AND PATTERN FORMING METHOD

(71) Applicant: FUJIFILM Corporation, Minato-Ku, Tokyo (JP)

(72) Inventors: Kei Yamamoto, Shizuoka (JP); Hiroshi Saegusa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/967,402

(22) Filed: Aug. 15, 2013

(65) Prior Publication Data
US 2013/0337384 A1    Dec. 19, 2013

Related U.S. Application Data

(63) Continuation of application No. 13/057,287, filed as application No. PCT/JP2009/067192 on Sep. 25, 2009, now Pat. No. 8,541,159.

(30) Foreign Application Priority Data

Sep. 26, 2008  (JP) .................................. 2008-249216
Sep. 24, 2009  (JP) .................................. 2009-219717

(51) Int. Cl.
| | |
|---|---|
| *G03F 7/004* | (2006.01) |
| *G03F 7/028* | (2006.01) |
| *G03F 7/26* | (2006.01) |
| *G03F 7/039* | (2006.01) |
| *C09D 133/16* | (2006.01) |
| *C09D 133/26* | (2006.01) |
| *C09D 143/04* | (2006.01) |
| *G03F 7/075* | (2006.01) |
| *G03F 7/20* | (2006.01) |

(52) U.S. Cl.
CPC .............. *G03F 7/039* (2013.01); *C09D 133/16* (2013.01); *C09D 133/26* (2013.01); *C09D 143/04* (2013.01); *G03F 7/0045* (2013.01); *G03F 7/0046* (2013.01); *G03F 7/0048* (2013.01); *G03F 7/0397* (2013.01); *G03F 7/0758* (2013.01); *G03F 7/2041* (2013.01); *Y10S 430/122* (2013.01); *Y10S 430/126* (2013.01)
USPC ......... 430/270.1; 430/326; 430/921; 430/925

(58) Field of Classification Search
USPC .................. 430/270.1, 326, 910, 921, 925
See application file for complete search history.

(56) References Cited

U.S. PATENT DOCUMENTS

| | | | |
|---|---|---|---|
| 6,596,458 B1 | 7/2003 | Sato et al. | |
| 8,541,159 B2 * | 9/2013 | Yamamoto et al. | ........ 430/270.1 |
| 2006/0008736 A1 | 1/2006 | Kanada et al. | |
| 2006/0078823 A1 | 4/2006 | Kanda et al. | |
| 2007/0059639 A1 | 3/2007 | Kanda et al. | |
| 2007/0065753 A1 * | 3/2007 | Mizutani et al. | ........... 430/270.1 |
| 2007/0122750 A1 * | 5/2007 | Yamaguchi et al. | .......... 430/311 |
| 2007/0149702 A1 | 6/2007 | Ando et al. | |
| 2008/0081290 A1 | 4/2008 | Wada et al. | |
| 2008/0090171 A1 | 4/2008 | Irie et al. | |
| 2008/0248425 A1 | 10/2008 | Nishiyama et al. | |

(Continued)

FOREIGN PATENT DOCUMENTS

| | | |
|---|---|---|
| EP | 1 645 908 A1 | 4/2006 |
| EP | 1 739 483 A1 | 1/2007 |

(Continued)

OTHER PUBLICATIONS

J. A. Hoffnagle, et al.; "Liquid Immersion deep-ultraviolet interferometric lithography"; Japanese Vacuum Sci. Technol. B. vol. 17 No. 6; Nov./Dec. 1999; pp. 3306-3309.

(Continued)

*Primary Examiner* — Anca Eoff
(74) *Attorney, Agent, or Firm* — Sughrue Mion, PLLC

(57) ABSTRACT

A positive resist composition for immersion exposure includes the following (A) to (D): (A) a resin capable of decomposing by an action of an acid to increase a solubility of the resin in an alkali developer; (B) a compound capable of generating an acid upon irradiation with an actinic ray or radiation; (C) a resin having at least either one of a fluorine atom and a silicon atom; and (D) a mixed solvent containing at least one kind of a solvent selected from the group consisting of solvents represented by any one of the following formulae (S1) to (S3) as defined in the specification, in which a total amount of the at least one kind of the solvent is from 3 to 20 mass % based on all solvents of the mixed solvent (D).

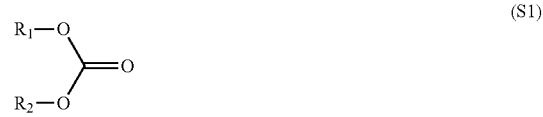

(S1)

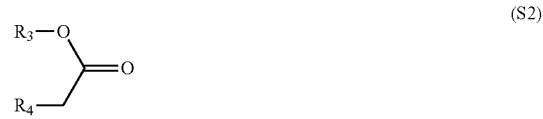

(S2)

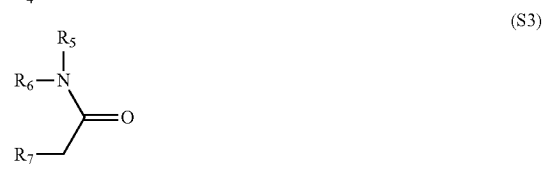

(S3)

27 Claims, No Drawings

(56) References Cited

U.S. PATENT DOCUMENTS

| | | | |
|---|---|---|---|
| 2008/0305432 A1* | 12/2008 | Kanna | 430/285.1 |
| 2009/0202945 A1 | 8/2009 | Nakagawa et al. | |
| 2009/0214960 A1 | 8/2009 | Takeda et al. | |
| 2012/0076996 A1 | 3/2012 | Yamamoto et al. | |

FOREIGN PATENT DOCUMENTS

| | | |
|---|---|---|
| EP | 1 975 705 A2 | 10/2008 |
| JP | 3-288855 A | 12/1991 |
| JP | 07-220990 A | 8/1995 |
| JP | 2005-002105 A | 1/2005 |
| JP | 2006-048029 A | 2/2006 |
| JP | 2006-091772 A | 4/2006 |
| JP | 2007-197718 A | 8/2007 |
| JP | 2007-322660 A | 12/2007 |
| JP | 2008-056810 A | 3/2008 |
| JP | 2008-065098 A | 3/2008 |
| JP | 2008-96816 A | 4/2008 |
| JP | 2008-107793 A | 5/2008 |
| JP | 2008-107806 A | 5/2008 |
| JP | 2008-127462 A | 6/2008 |
| JP | 2008-139549 A | 6/2008 |
| JP | 2008-145667 A | 6/2008 |
| JP | 2008-165146 A | 7/2008 |
| JP | 2008-174652 A | 7/2008 |
| JP | 2008-195868 A | 8/2008 |
| JP | 2009-223297 A | 10/2009 |
| TW | 2006-28984 A | 8/2006 |
| WO | 2007-0116664 A1 | 10/2007 |
| WO | 2009-119894 A1 | 10/2009 |

OTHER PUBLICATIONS

Hiroshi Ito, et al.; Dissolution/swelling behavior of cycloolefin polymers in aqueous base; Advances in Resist Technology and Processing XVII, Proceedings of SPIE vol. 3999 (2000) pp. 2-12.

B.J. Lin; "Plenary Paper"; Semiconductor Foundry, Lithography and Partners; Emerging Lithographic Technologies VI; Proceedings of SPIE vol. 4688; 2002; pp. 11-24.

International Search Report issued in PCT/JP2009/067192, dated Oct. 27, 2009.

Written Opinion (PCT/ISA/237) issued in PCT/JP2009/067192, dated Oct. 27, 2009.

Office Action dated Jun. 26, 2012 in Japanese Patent Application No. 2009-219717.

Extended European Search Report, dated Oct. 2, 2012, issued by the European Patent Office in European Application No. 09816304.1.

Office Action dated Sep. 25, 2012 in Japanese Patent Application No. 2009-219717.

Office Action dated Feb. 5, 2013 in Japanese Application No. 2009-219717.

Office Action from the Japanese Patent Office dated Nov. 26, 2013, in a counterpart Japanese Application No. 2012-281421.

Office Action dated Feb. 27, 2014, issued by the Taiwanese Patent Office in counterpart Taiwanese Application No. 098132454.

Office Action, dated Apr. 22, 2014, issued by the Japanese Patent Office in counterpart Japanese Application No. 2012-281421.

Registry (STN), Megafac F 170, retrieved on Apr. 11, 2014, p. 1.

Registry (STN), Megafac F 177, retrieved on Apr. 14, 2014, p. 1.

* cited by examiner

POSITIVE RESIST COMPOSITION FOR IMMERSION EXPOSURE AND PATTERN FORMING METHOD

This is a Continuation Application of U.S. application Ser. No. 13/057,287, filed Feb. 3, 2011; which is a U.S. National Stage Entry of PCT/JP2009/067192 filed Sep. 25, 2009, which claims priority under 35 U.S.C. §119 from Japanese Application No. 2008-249216 filed Sep. 26, 2008, and from Japanese Application No. 2009-219717, filed Sep. 24, 2009, the contents of all of which are incorporated herein by reference.

TECHNICAL FIELD

The present invention relates to a positive resist composition for immersion exposure, which is used in the process of producing a semiconductor such as IC, in the production of a circuit board for liquid crystal, thermal head and the like, and in the lithography process of other photo-applications, and a pattern forming method using the same. More specifically, the present invention relates to a positive resist composition for immersion exposure, which is suitable for exposure by an immersion projection exposure apparatus using a light source that emits far ultraviolet light at a wavelength of 300 nm or less, and a pattern forming method using the same.

BACKGROUND ART

Along with the miniaturization of a semiconductor device, the trend is moving into shorter wavelength of the exposure light source and higher numerical aperture (high NA) of the projection lens. At present, an exposure machine with NA of 0.84 has been developed, where an ArF excimer laser having a wavelength of 193 nm is used as the light source. As commonly well known, these factors can be expressed by the following formulae:

(Resolution)=$k_1 \cdot (\lambda/NA)$ (Depth of focus)=$\pm k_2 \cdot \lambda/NA^2$ wherein $\lambda$ is the wavelength of the exposure light source, NA is the numerical aperture of the projection lens, and $k_1$ and $k_2$ are coefficients related to the process.

For more shortening the wavelength and thereby obtaining higher resolution, a so-called immersion method of filling a high refractive-index liquid (hereinafter sometimes referred to as an "immersion liquid") between the projection lens and the sample has been conventionally known as a technique for raising the resolution in an optical microscope.

As for the "effect of immersion", assuming that $NA_0=\sin\theta$, the above-described resolution and depth of focus in the immersion can be expressed by the following formulae:

(Resolution)=$k_1 \cdot (\lambda_0/n)/NA_0$ (Depth of focus)=$\pm k_2 \cdot (\lambda_0/n)/NA_0^2$ wherein $\lambda_0$ is the wavelength of exposure light in air, n is the refractive index of the immersion liquid based on air, and $\theta$ is the convergence half-angle of beam.

That is, the effect of immersion is equal to use of an exposure wavelength of 1/n. In other words, in the case of a projection optical system with the same NA, the depth of focus can be made n times larger by the immersion. This is effective for all pattern profiles and can be combined with the super-resolution technology under study at present, such as phase-shift method and modified illumination method.

An example of the apparatus where immersion exposure is applied to the transfer of a fine image pattern of a semiconductor device is described in JP-A-7-220990 (the term "JP-A" as used herein means an "unexamined published Japanese patent application") and the like.

The latest technical progress of immersion exposure is reported, for example, in Proc. SPIE, Vol. 4688, page 11 (2002), J. Vac. Sci. Technol., B, 17 (1999) and Proc. SPIE, Vol. 3999, page 2 (2000). In the case of using an ArF excimer laser as the light source, pure water (refractive index at 193 nm: 1.44) is considered to be most promising as the immersion liquid in view of safety in handling as well as the transmittance and refractive index at 193 nm.

With the advent of a resist for a KrF excimer laser (248 nm), an image forming method called chemical amplification is used as the image forming method for a resist so as to compensate for the reduction in sensitivity due to light absorption. To explain the image-forming method of positive chemical amplification by example, this is an image forming method of exposing a resist to decompose an acid generator in the exposed area to thereby generate an acid, utilizing the generated acid as the reactive catalyst to change an alkali-insoluble group to an alkali-soluble group by the bake after exposure (PEB: Post Exposure Bake), and removing the exposed area by alkali development.

A resist for an ArF excimer laser (wavelength: 193 nm) using this chemical amplification mechanism is becoming predominant at present.

In the immersion exposure process, when exposure is performed using a scan-type immersion exposure machine, unless the immersion liquid moves following the movement of lens, the exposure speed decreases and this may affect the productivity. For this reason, it is preferred that the resist film has a high receding angle for the immersion liquid.

In JP-A-2006-048029, International Publication No. 07/116,664, JP-A-2008-65098, it is indicated that the resist film surface can be hydrophobed by adding a specific resin or the like.

SUMMARY OF INVENTION

In the immersion exposure, a circular defect called watermark is sometimes produced due to the action of a water droplet remaining on the resist film after exposure.

An object of the present invention is to provide a positive resist composition for immersion exposure, ensuring that the receding contact angle for immersion liquid at the immersion exposure can be more improved and the watermark defect can be reduced, and a pattern forming method using the same.

As a result of intensive studies to attain the above-described object, the present inventors have accomplished the present invention.

(1) A positive resist composition for immersion exposure, comprising the following (A) to (D):

(A) a resin capable of decomposing by an action of an acid to increase a solubility of the resin in an alkali developer;

(B) a compound capable of generating an acid upon irradiation with an actinic ray or radiation;

(C) a resin having at least either one of a fluorine atom and a silicon atom; and (D) a mixed solvent containing at least one kind of a solvent selected from the group consisting of solvents represented by any one of the following formulae (S1) to (S3), in which a total amount of the at least one kind of the solvent is from 3 to 20 mass % based on all solvents of the mixed solvent (D):

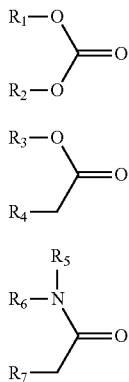

(S1)

(S2)

(S3)

wherein each of $R_1$ to $R_7$ independently represents an alkyl group, a cycloalkyl group or an aryl group; and $R_1$ and $R_2$, $R_3$ and $R_4$, and $R_6$ and $R_7$ may combine with each other to form a ring, respectively.

(2) The positive resist composition for immersion exposure as described in (1) above, wherein the resin (C) has at least one group represented by any one of the following formulae (F2) to (F4) and (CS-1) to (CS-3):

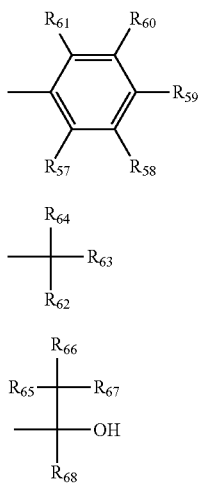

(F2)

(F3)

(F4)

wherein each of $R_{57}$ to $R_{68}$ independently represents a hydrogen atom, a fluorine atom, an alkyl group, a cycloalkyl group or an aryl group, provided that at least one of $R_{57}$ to $R_{61}$, at least one of $R_{62}$ to $R_{64}$ and at least one of $R_{65}$ to $R_{68}$ each represent a fluorine atom or an alkyl, cycloalkyl or aryl group with at least one hydrogen atom being substituted by a fluorine atom; and $R_{62}$ and $R_{63}$ may combine with each other to form a ring:

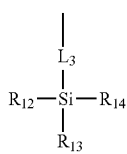

(CS-1)

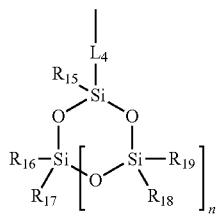

(CS-2)

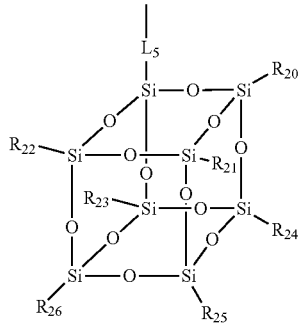

(CS-3)

wherein each of $R_{12}$ to $R_{26}$ independently represents an alkyl group or a cycloalkyl group;

each of $L_3$ to $L_5$ independently represents a single bond or a divalent linking group; and n represents an integer of 1 to 5.

(3) The positive resist composition for immersion exposure as described in (2) above, wherein the resin (C) contains at least one repeating unit derived from an acrylate or methacrylate having a group represented by any one of formulae (F2) to (F4) and (CS-1) to (CS-3).

(4) The positive resist composition for immersion exposure as described in any one of (1) to (3) above, wherein the total amount of the at least one kind of the solvent selected from the group consisting of solvents represented by any one of formulae (S1) to (S3) is from 3 to 10 mass % based on all solvents of the mixed solvent (D).

(5) The positive resist composition for immersion exposure as described in any one of (1) to (4) above, the mixed solvent (D) contains at least one kind of a solvent selected from the group consisting of solvents represented by any one of formulae (S1) and (S2).

(6) The positive resist composition for immersion exposure as described in any one of (1) to (5) above, wherein the mixed solvent (D) contains a solvent having an alkylene carbonate structure as the at least one kind of the solvent selected from the group consisting of solvents represented by any one of formulae (S1) to (S3).

(7) The positive resist composition for immersion exposure as described in any one of (1) to (6) above, wherein the mixed solvent (D) contains a solvent having a lactone structure as the at least one kind of the solvent selected from the group consisting of solvents represented by any one of formulae (S1) to (S3).

(8) The positive resist composition for immersion exposure as described in any one of (1) to (7) above, wherein the mixed solvent (D) contains a hydroxyl group-containing solvent, a hydroxyl group-free solvent and the at least one kind of the solvent selected from the group consisting of solvents represented by any one of formulae (S1) to (S3).

(9) The positive resist composition for immersion exposure as described in any one of (1) to (8) above,
wherein the mixed solvent (D) contains an alkylene glycol monoalkyl ether acetate, an alkylene glycol monoalkyl ether and the at least one kind of the solvent selected from the group consisting of solvents represented by any one of formulae (S1) to (S3).

(10) A pattern forming method, comprising:
forming a resist film from the positive resist composition for immersion exposure as described in any one of (1) to (9) above;
exposing the resist film through an immersion liquid so as to form an exposed resist film; and
developing the exposed resist film.

DESCRIPTION OF EMBODIMENTS

[1] (A) Resin Capable of Increasing the Solubility in an Alkali Developer by the Action of an Acid The resist composition of the present invention contains (A) a resin capable of increasing the solubility in an alkali developer by the action of an acid.

The resin capable of increasing the solubility in an alkali developer by the action of an acid (acid-decomposable resin) has a group capable of decomposing by the action of an acid to produce an alkali-soluble group (hereinafter sometimes referred to as an "acid-decomposable group"), in the main or side chain of the resin or in both the main chain and the side chain.

The resin (A) is preferably insoluble or sparingly soluble in an alkali developer.

The acid-decomposable group preferably has a structure where an alkali-soluble group is protected by a group capable of decomposing and leaving by the action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a carboxyl group, a fluorinated alcohol group (preferably hexafluoroisopropanol) and a sulfonic acid group.

The group preferred as the acid-decomposable group is a group where a hydrogen atom of such an alkali-soluble group is substituted by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably, for example, a cumyl ester group, an enol ester group, an acetal ester group or a tertiary alkyl ester group, more preferably a tertiary alkyl ester group.

The acid-decomposable group-containing repeating unit which can be contained in the resin (A) is preferably a repeating unit represented by the following formula (AI):

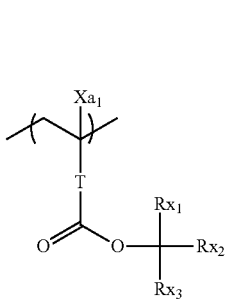

In formula (AI), $Xa_1$ represents a hydrogen atom, a methyl group which may have a substituent or a group represented by —$CH_2$—$R_9$. $R_9$ represents a hydroxyl group or a monovalent organic group. As the monovalent organic group, for example, an alkyl group having a carbon number of 5 or less or an acyl group is exemplified, and an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$, $Rx_2$ and $Rx_3$ independently represents an alkyl group (linear or branched) or a cycloalkyl group (monocyclic or polycyclic).

$Rx_2$ and $Rx_3$ may combine to form a cycloalkyl group (monocyclic or polycyclic).

Examples of the divalent linking group of T includes an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —($CH_2$)$_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining $Rx_2$ and $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The content in total of the acid-decomposable group-containing repeating units is preferably from 20 to 70 mol %, more preferably from 30 to 50 mol %, based on all repeating units in the resin.

Specific preferred examples of the repeating unit having an acid-decomposable group are set forth below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents, when a plurality of Z's are present, each independently represents, a substituent containing a polar group. Specific examples of the substituent containing a polar group are the same as those for $R_{10}$ in formula (2-1) described later. p represents 0 or a positive integer.
1
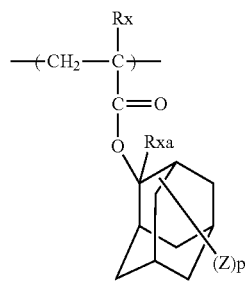
2
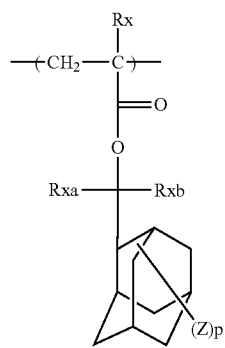
3
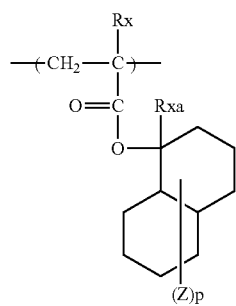
4
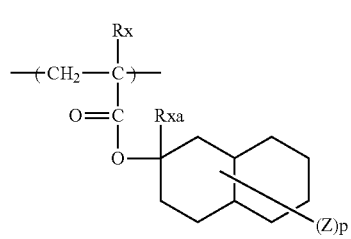
5
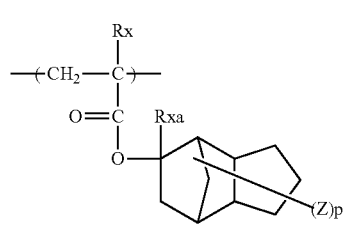
-continued
6
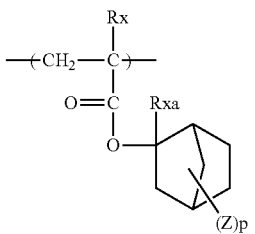
7
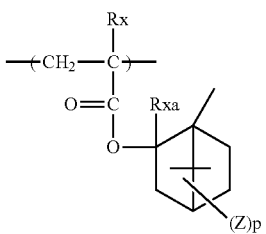
8
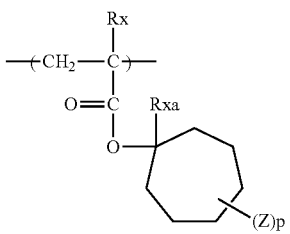
9
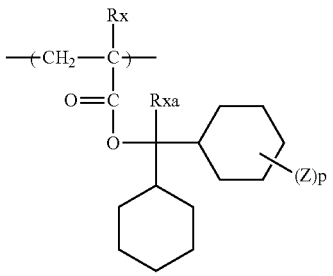
10
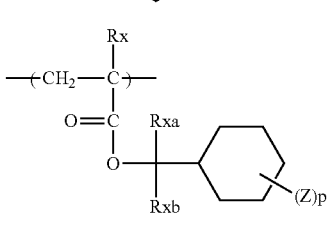
11
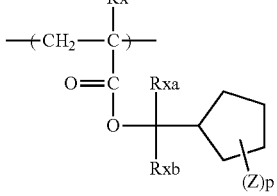
12
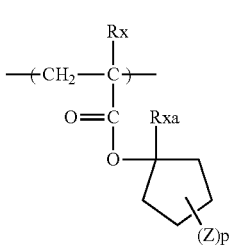

13
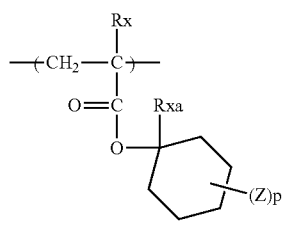
14
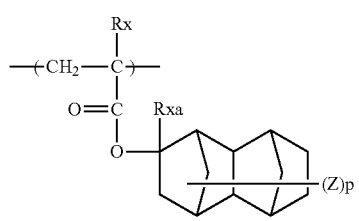
15
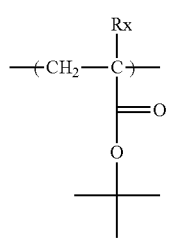
16
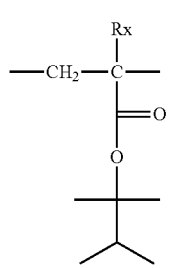
17
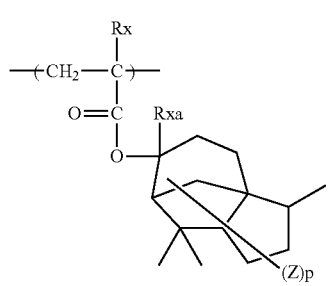
18
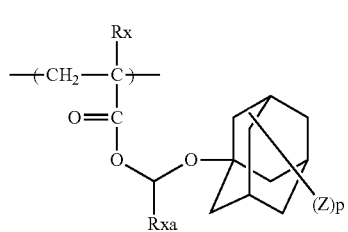
19
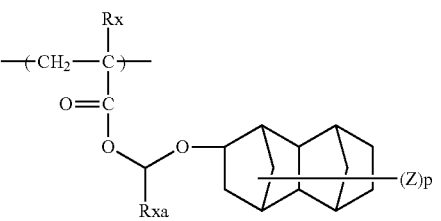
20
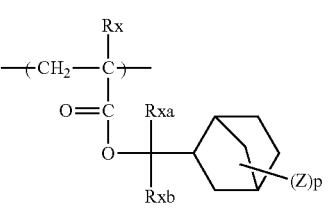
21
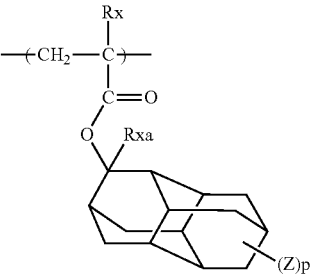
22
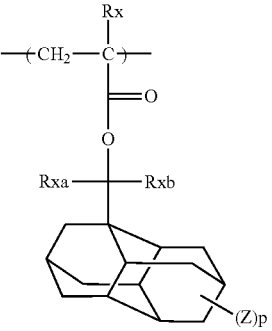
23
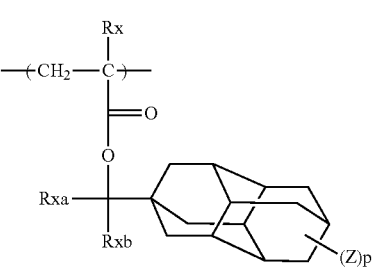
24
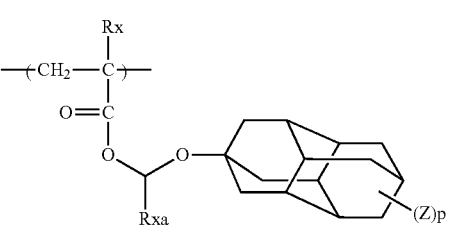

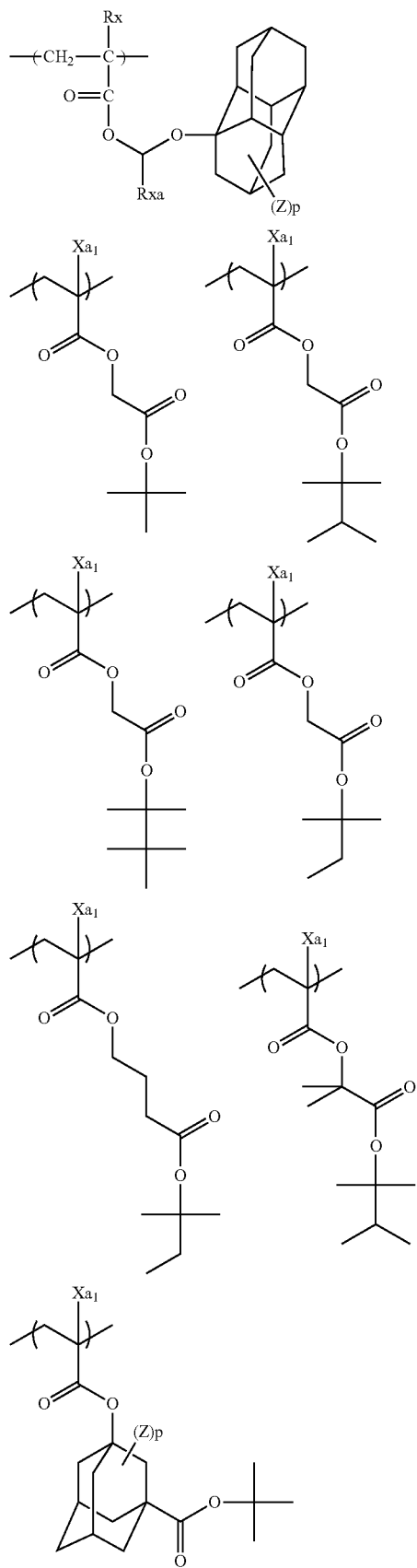
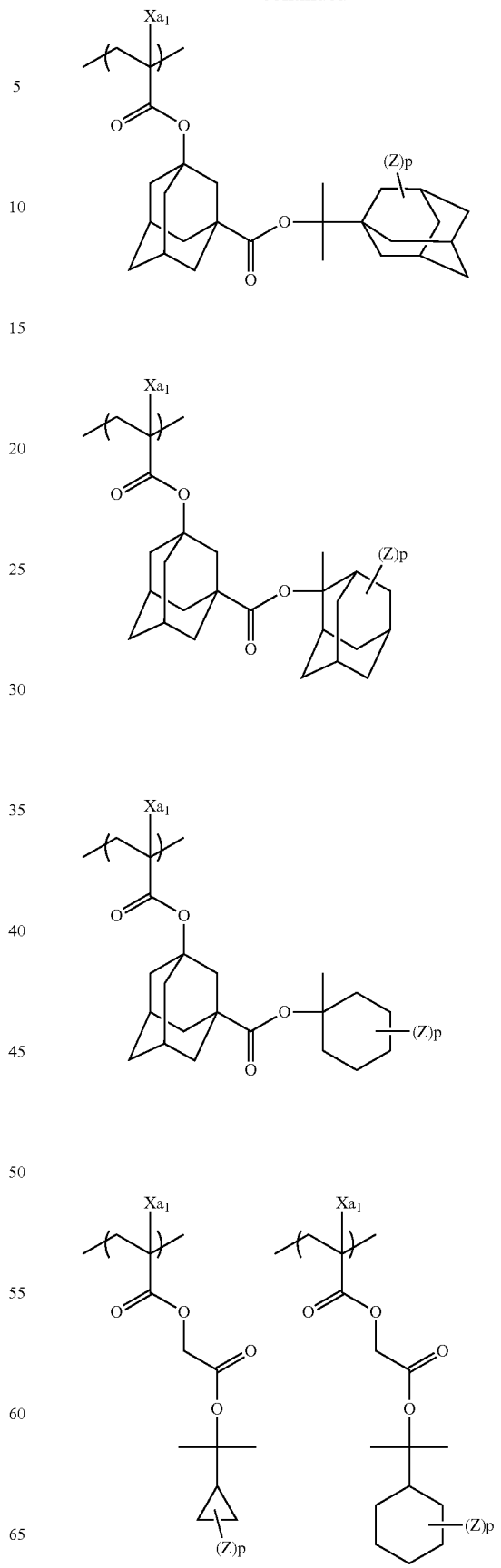

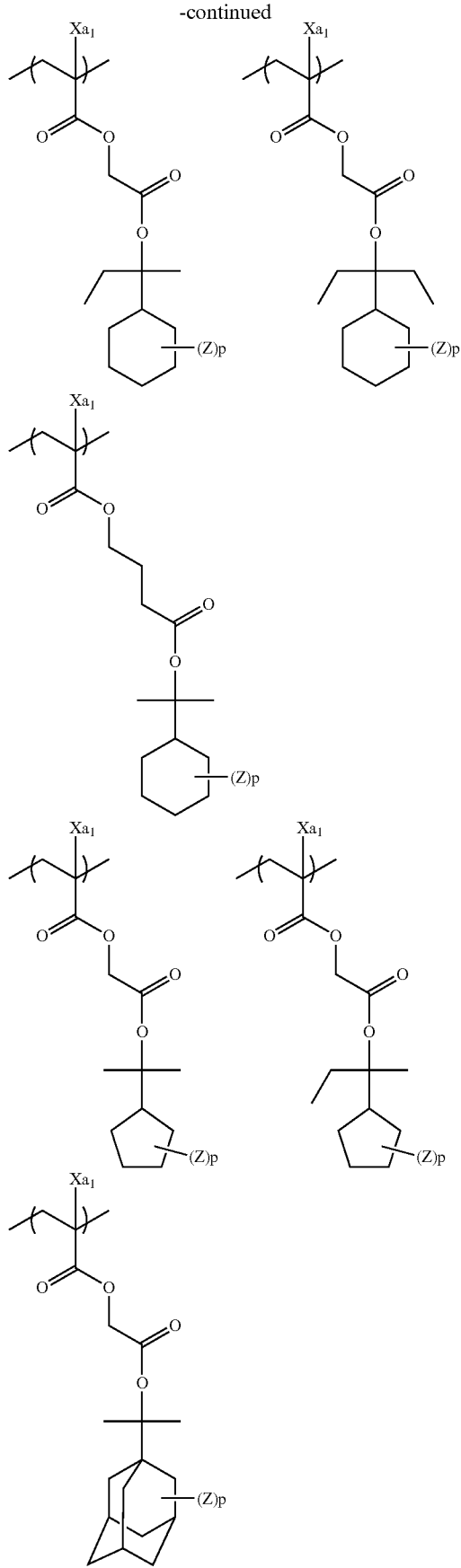
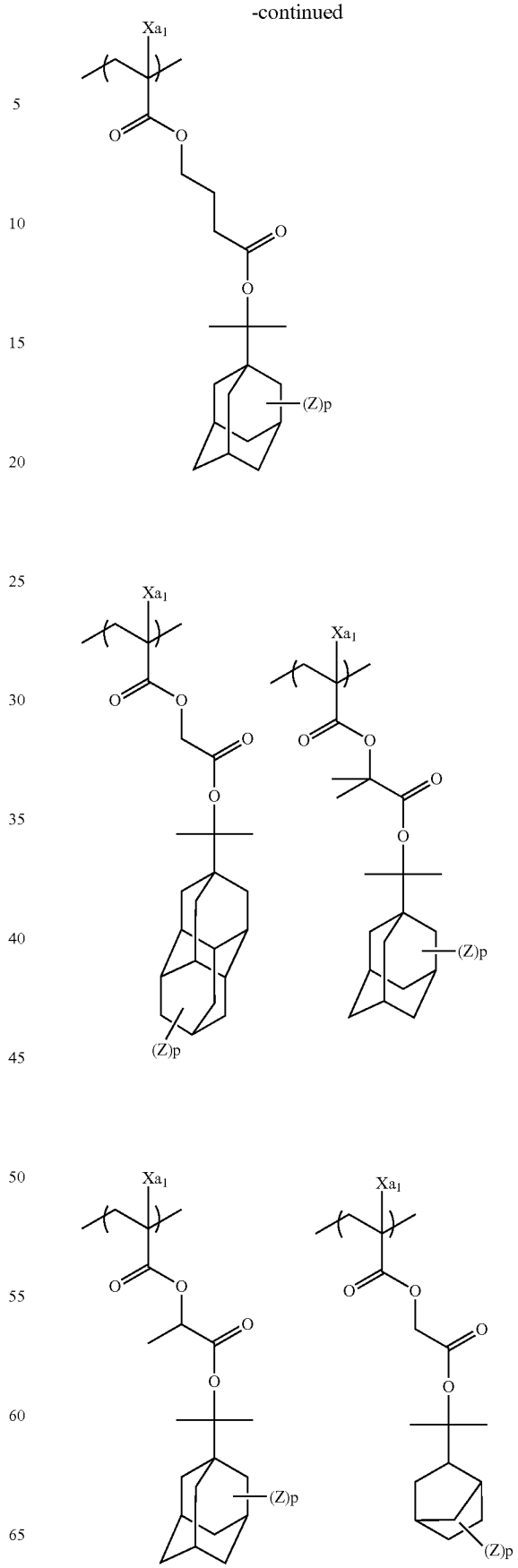

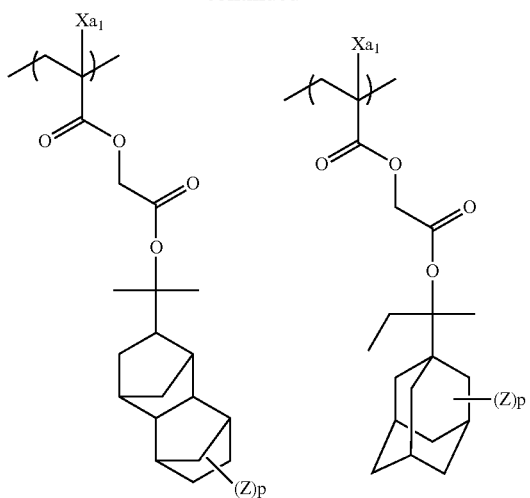
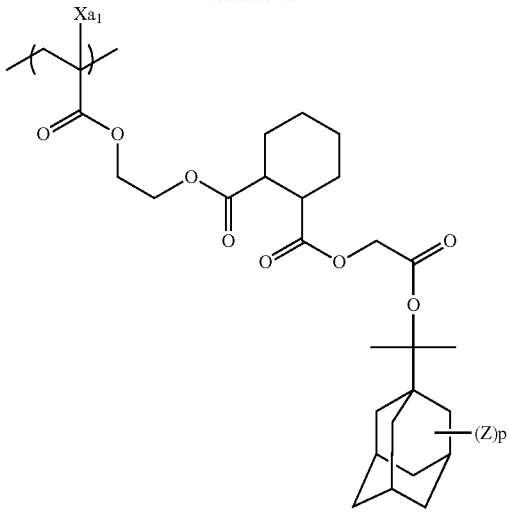
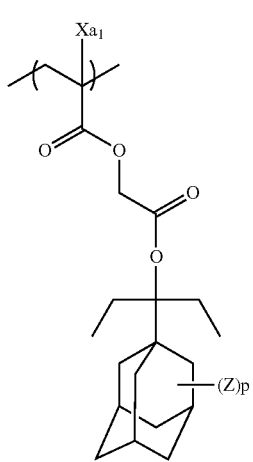
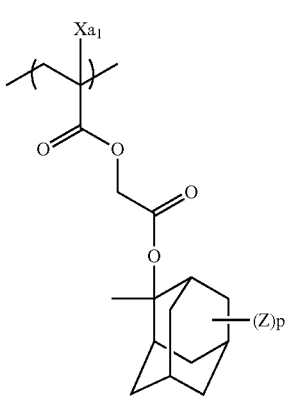
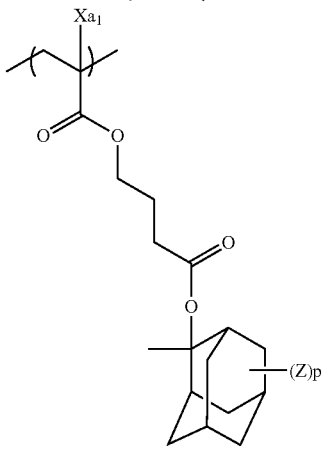
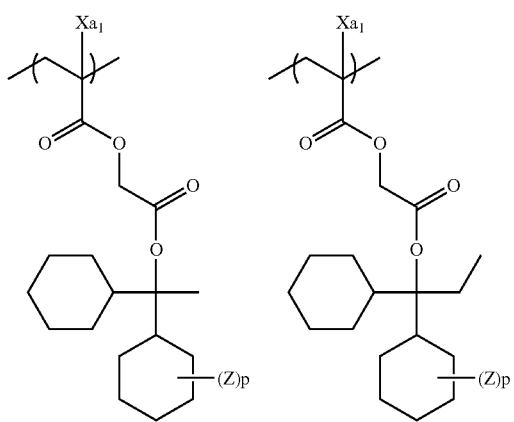
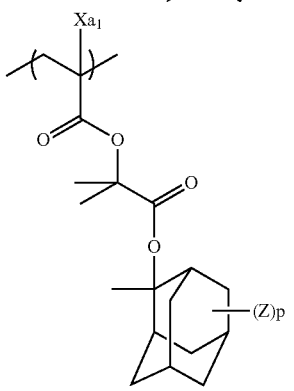

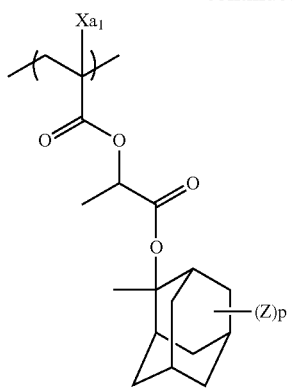
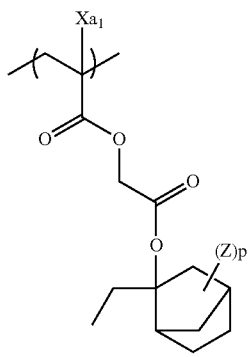
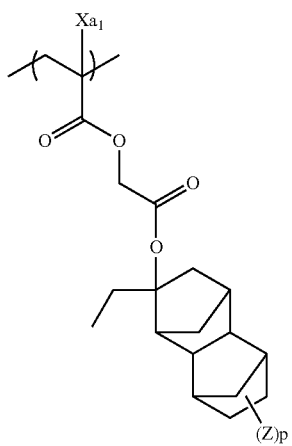
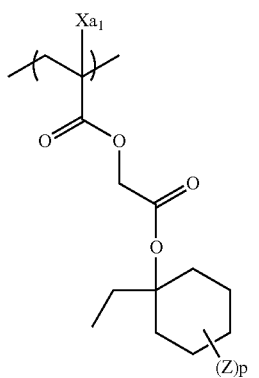
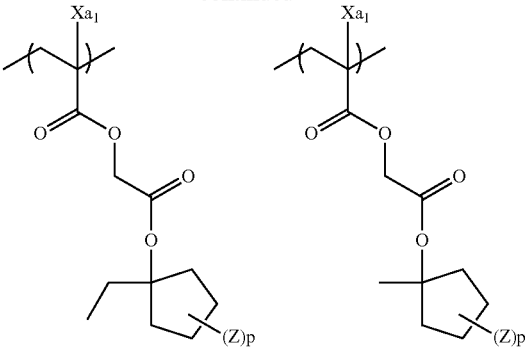
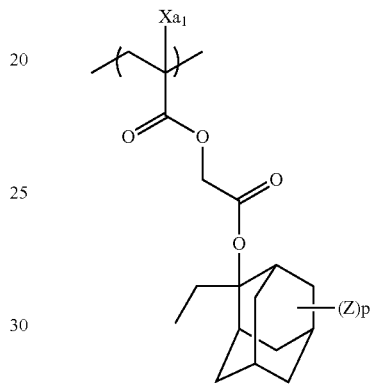
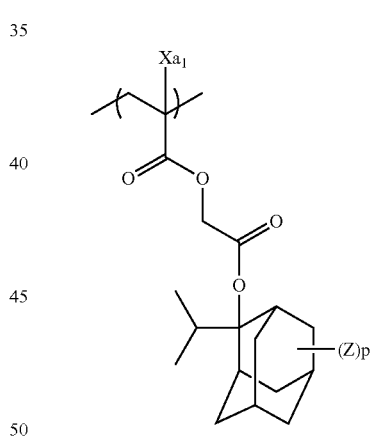
The resin (A) is more preferably a resin having, as the repeating unit represented by formula (AI), at least either one of a repeating unit represented by formula (1) and a repeating unit represented by formula (2).
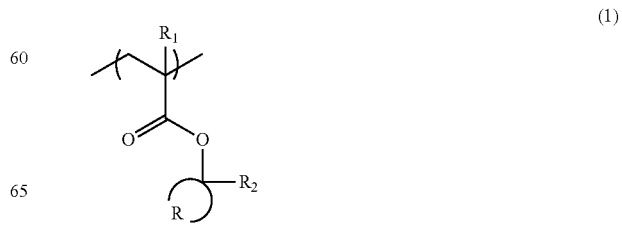

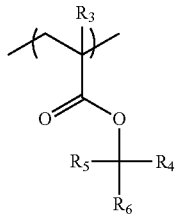

(2)

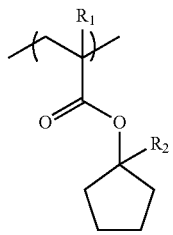

(1-a)

The repeating unit represented by formula (2) is preferably a repeating unit represented by the following formula (2-1):

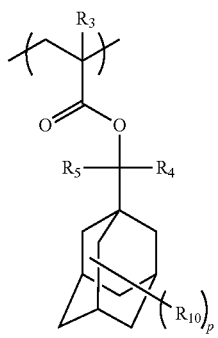

(2-1)

In formulae (1) and (2), each of $R_1$ and $R_3$ independently represents a hydrogen atom, a methyl group or a group represented by —$CH_2$—$R_9$. $R_9$ represents a monovalent organic group, and the specific examples thereof are the same as those of $R_9$ regarding formula (AI) described above.

Each of $R_2$, $R_4$, $R_5$ and $R_6$ independently represents an alkyl group or a cycloalkyl group.

Each R independently represents an atomic group necessary for forming an alicyclic structure together with the carbon atom.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

Each R independently represents an atomic group necessary for forming an alicyclic structure together with the carbon atom. The alicyclic structure formed by R and the carbon atom is preferably a monocyclic alicyclic structure, and the carbon number thereof is preferably from 3 to 7, more preferably 5 or 6.

$R_3$ is preferably a hydrogen atom or a methyl group, more preferably a methyl group.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The repeating unit represented by formula (1) includes a repeating unit represented by the following formula (1-a). In the formula, $R_1$ and $R_2$ have the same meanings as in formula (1).

In formula (2-1), $R_3$ to $R_5$ have the same meanings as in formula (2).

$R_{10}$ represents a polar group-containing substituent. In the case where a plurality of $R_{10}$'s are present, each $R_{10}$ may be the same as or different from every other $R_{10}$. The polar group-containing substituent is, for example, a linear or branched alkyl group or cycloalkyl group having a hydroxyl group, a cyano group, an amino group, an alkylamide group or a sulfonamide group, preferably an alkyl group having a hydroxyl group, more preferably an alkyl group (preferably having a carbon number of 3 to 5) having a tertiary carbon atom to which the hydroxyl group is substituted, and still more preferably —$C(CH_3)_2OH$. As for the branched alkyl group, an isopropyl group is particularly preferred.

p represents an integer of 0 to 1.5. p is preferably an integer of 0 to 2, more preferably 0 or 1.

The resin (A) may contain a plurality of repeating units each having an acid-decomposable group.

The resin (A) is preferably a resin containing, as the repeating unit represented by formula (AI), a repeating unit represented by formula (1) and a repeating unit represented by formula (2). In another embodiment, a resin containing at least two kinds of repeating units represented by formula (1) as the repeating unit represented by formula (AI) is preferred.

In the case where the resin (A) contains a plurality of acid-decomposable group-containing repeating units or where the resin (A) and after-mentioned resin (A') have different acid-decomposable group-containing repeating units, preferred examples of the combination are set forth below. In the following formulae, each R independently represents a hydrogen atom or a methyl group.

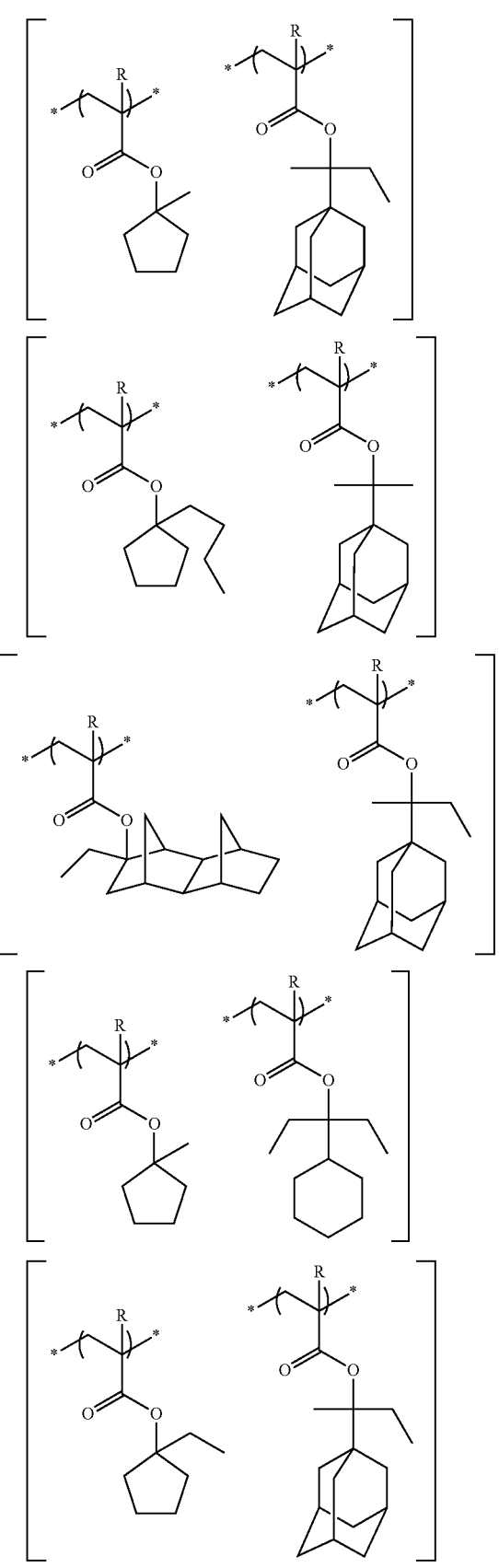
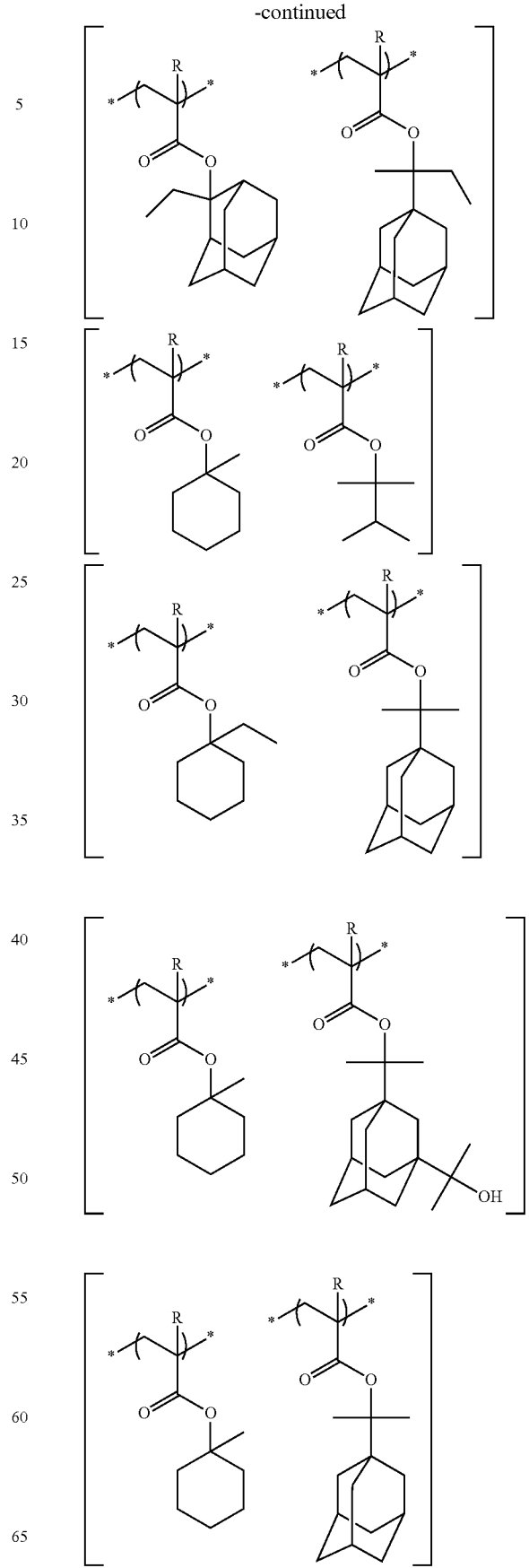

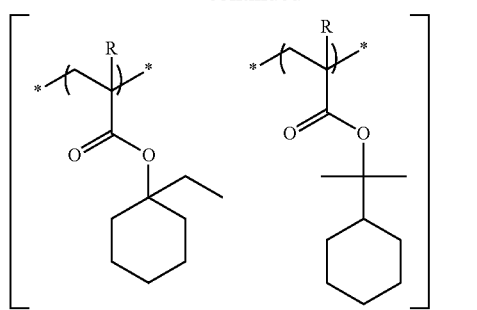
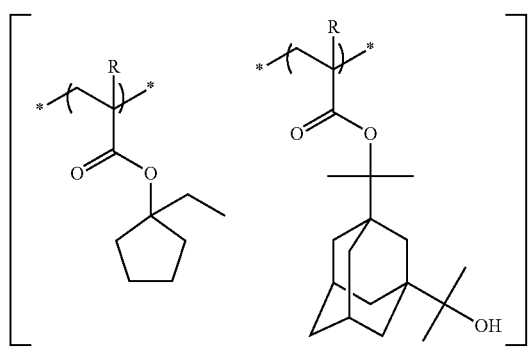
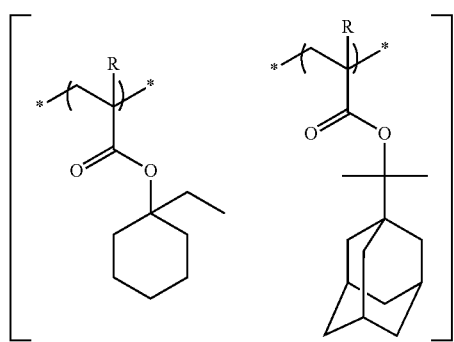
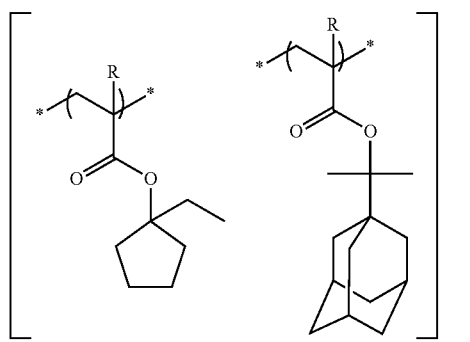
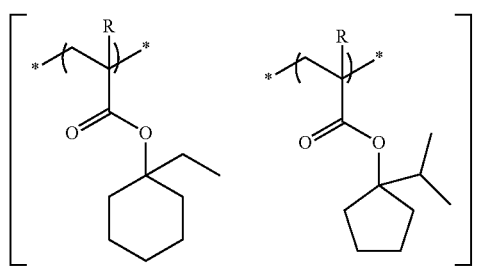
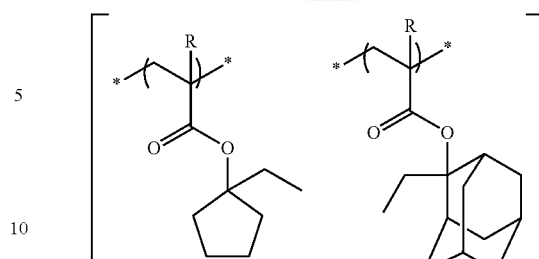
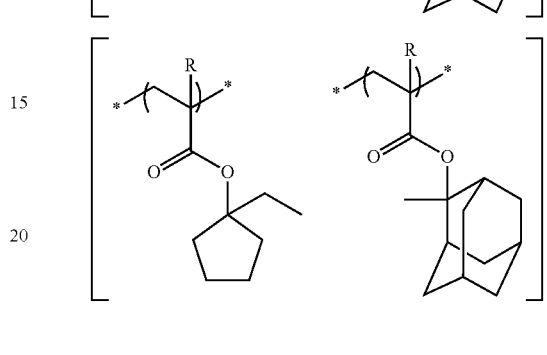
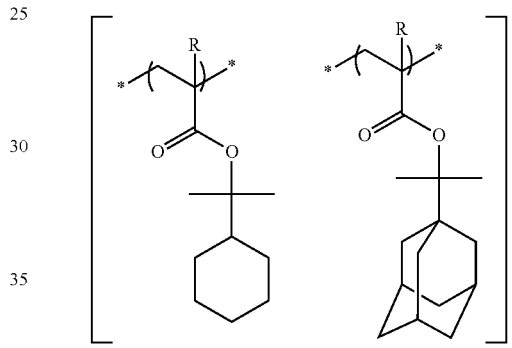
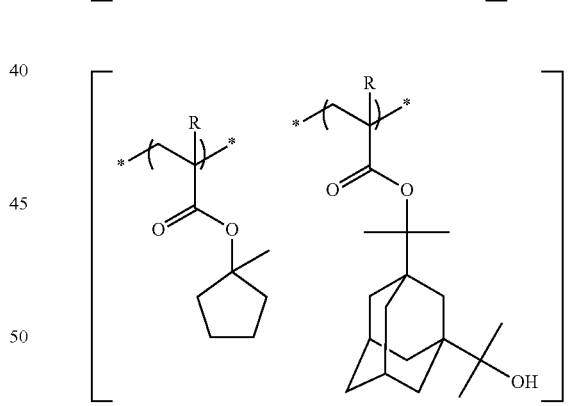
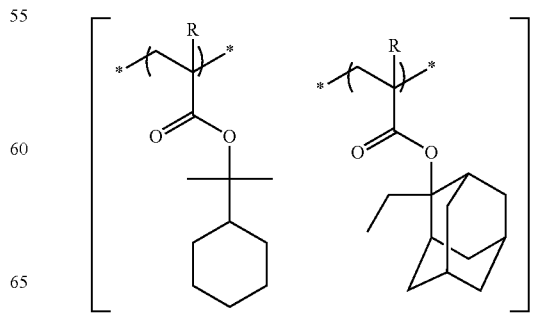

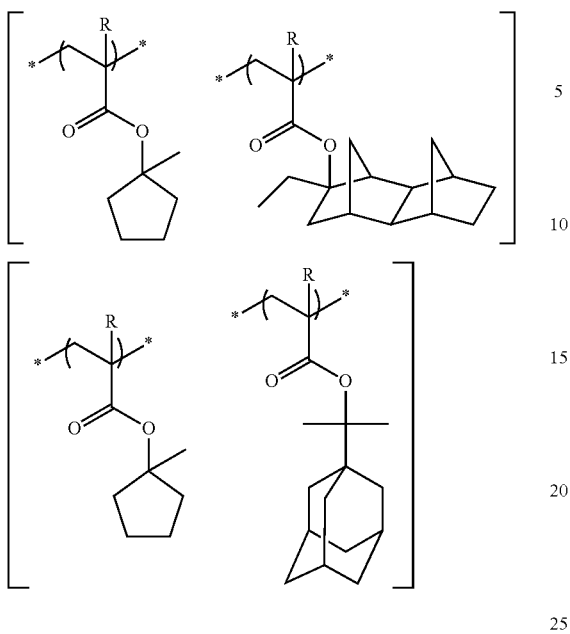

The resin (A) preferably contains a repeating unit having a lactone group.

As for the lactone group, any group may be used as long as it has a lactone structure, but the lactone structure is preferably a 5- to 7-membered ring lactone structure, and a structure where another ring structure is condensed to the 5- to 7-membered ring lactone structure in the form of forming a bicyclo or spiro structure is preferred. The resin more preferably contains a repeating unit having a lactone structure represented by any one of the following formulae (LC1-1) to (LC1-16). The lactone structure may be bonded directly to the main chain. Among these lactone structures, preferred are (LC1-1), (LC1-4), (LC1-5), (LC1-6), (LC1-13) and (LC1-14). By virtue of using a specific lactone structure, LWR and development defect are improved.

LC1-1

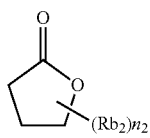

LC1-2

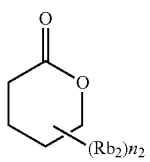

LC1-3

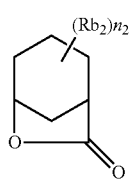

LC1-4

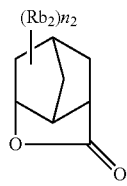

LC1-5

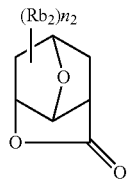

LC1-6

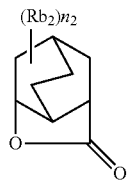

LC1-7

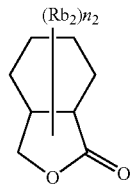

LC1-8

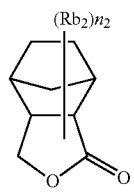

LC1-9

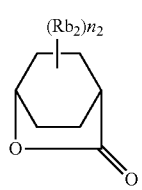

LC1-10

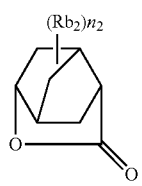

LC1-11

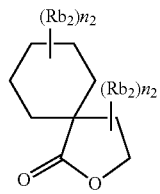

LC1-12
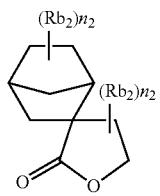

LC1-13
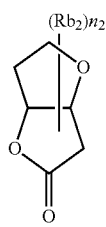

LC1-14
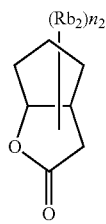

LC1-15
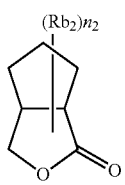

LC1-16
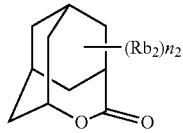

(AII)

In formula (AII), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group comprising a combination thereof, and is preferably a single bond or a divalent linking group represented by -$Ab_1$-$CO_2$—.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a structure represented by any one of formulae (LC1-1) to (LC1-16).

Specific examples of the repeating unit having a lactone group are set forth below, but the present invention is not limited thereto.

(In the formulae, Rx is H, $CH_3$, $CH_2OH$ or $CF_3$.)

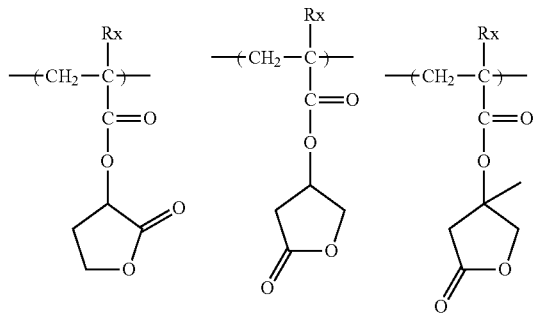

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$) and also, the plurality of substituents ($Rb_2$) may combine with each other to form a ring.

As for the repeating unit having a lactone structure, a repeating unit represented by the following formula (AII) is also preferred.

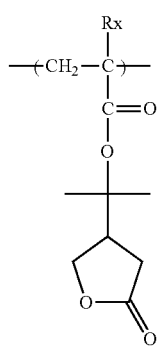

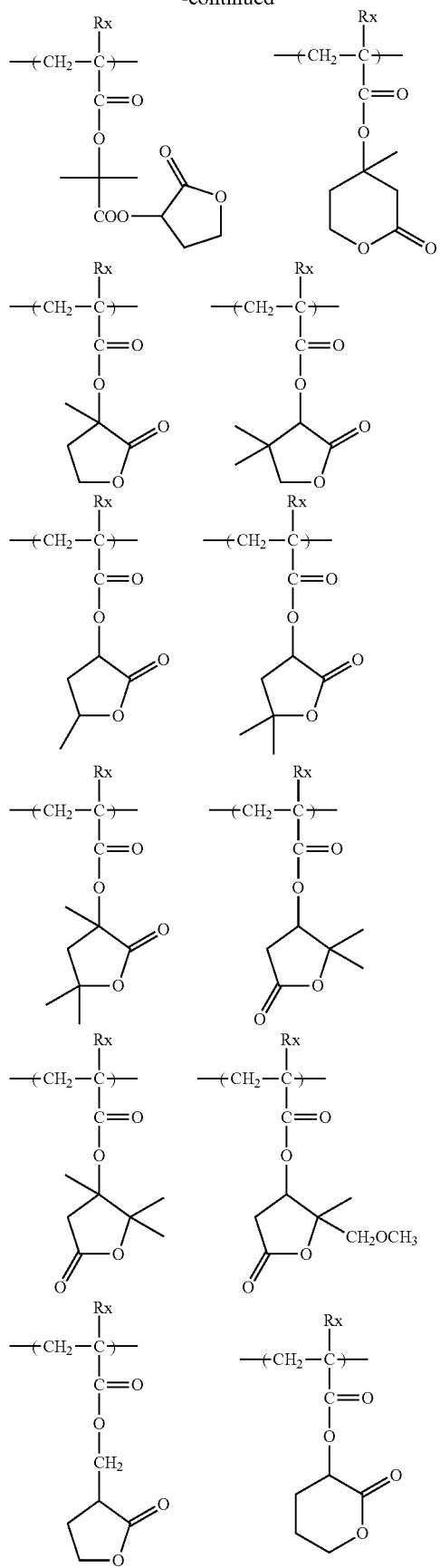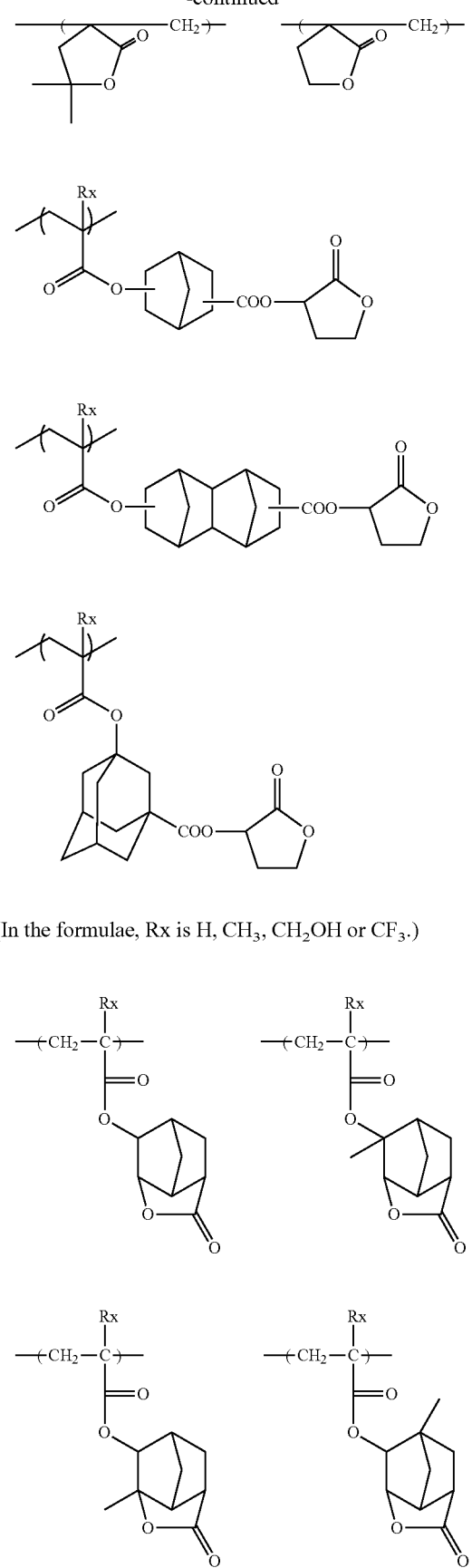
(In the formulae, Rx is H, CH₃, CH₂OH or CF₃.)

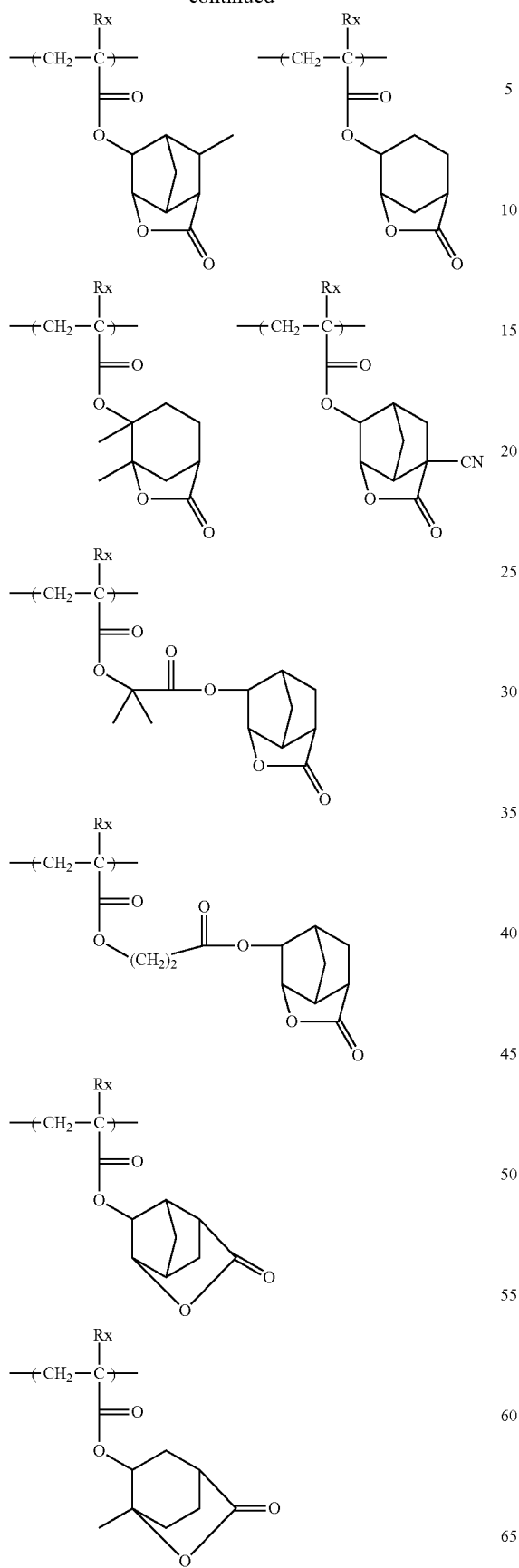
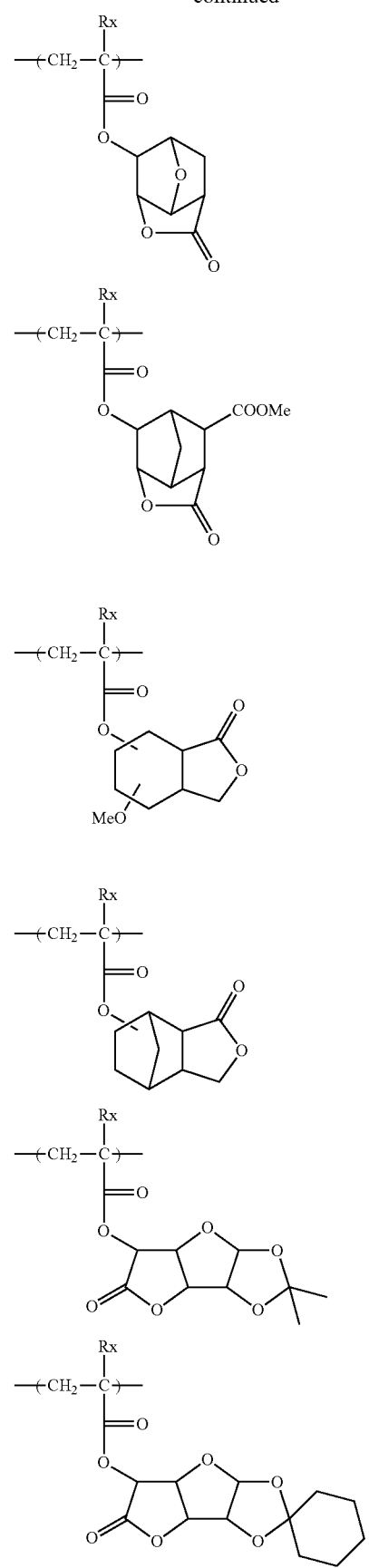

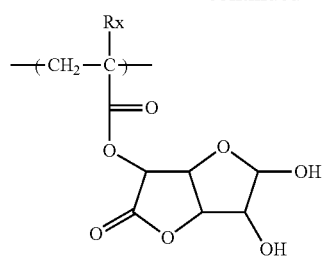
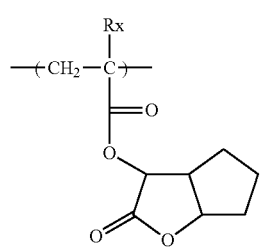
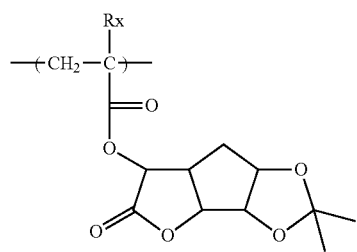
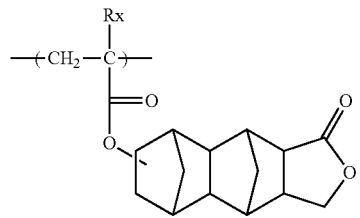
(In the formulae, Rx is H, CH$_3$, CH$_2$OH or CF$_3$.)
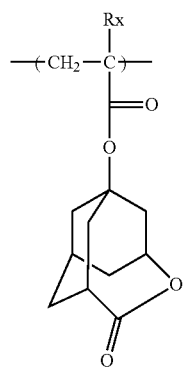
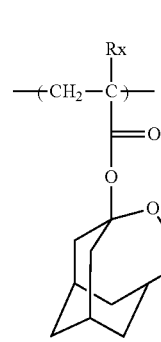
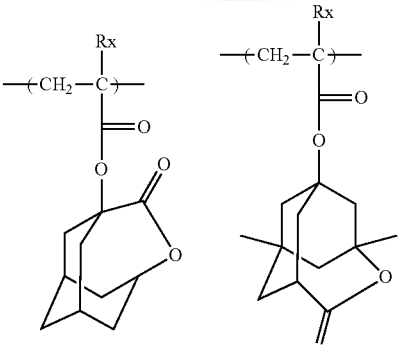
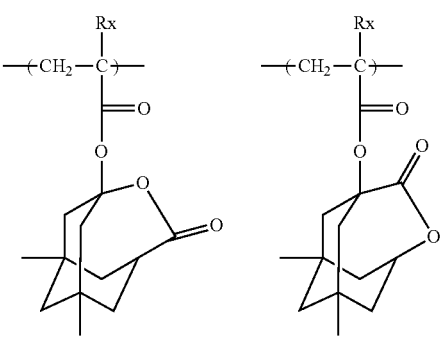
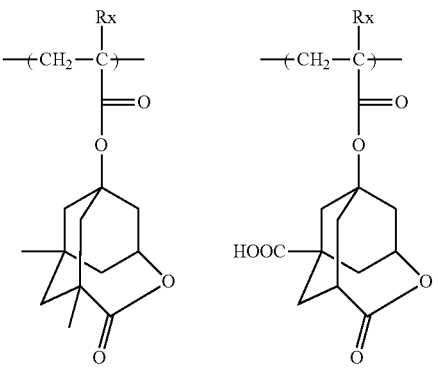
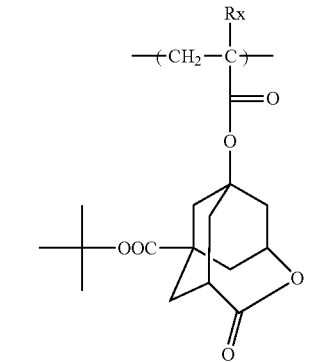

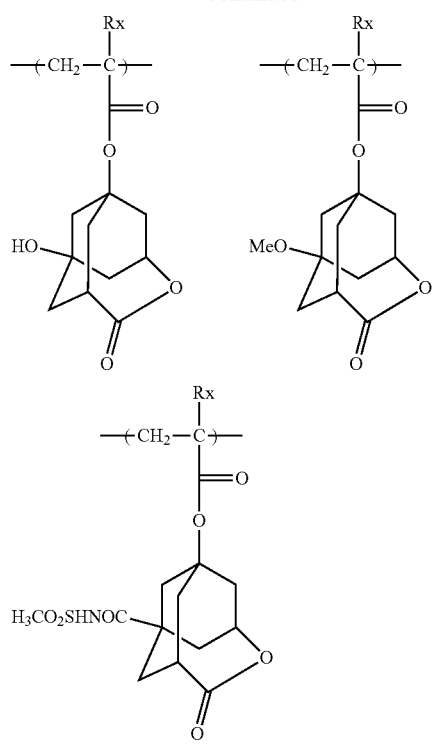
The repeating unit having a particularly preferred lactone group includes the repeating units shown below. By selecting an optimal lactone group, the pattern profile and the iso/dense bias are improved.
(In the formulae, Rx is H, $CH_3$, $CH_2OH$ or $CF_3$.)
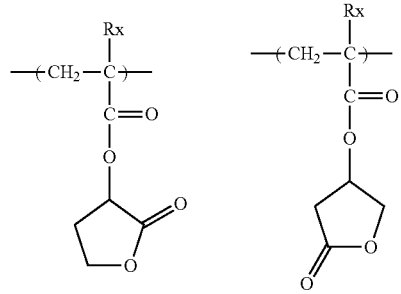
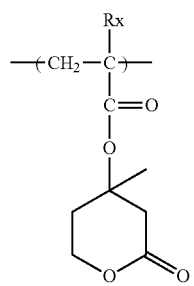
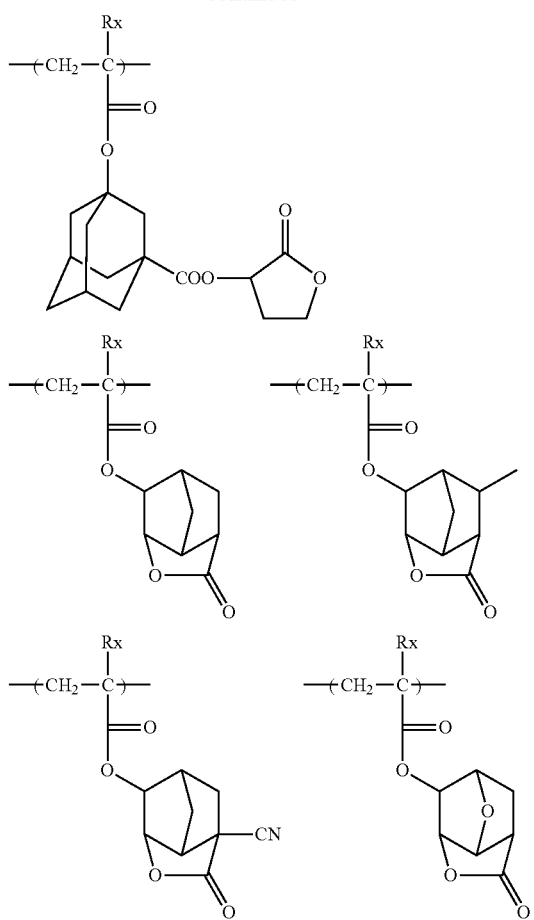
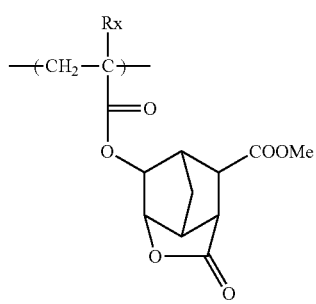
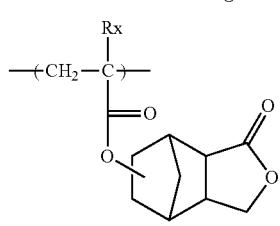
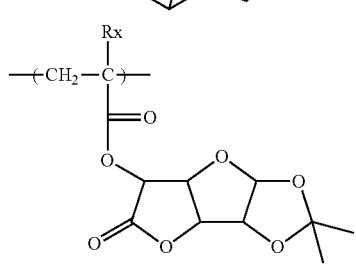

-continued

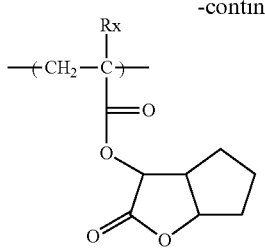

The resin (A) preferably contains a lactone structure-containing repeating unit represented by the following formula (3):

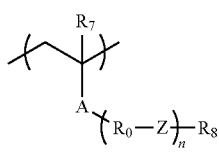

(3)

In formula (3), A represents an ester bond (a group represented by —COO—), or a group represented by —CONH—.

$R_0$ represents, in the case where a plurality of $R_0$'s are present, each independently represents, an alkylene group, a cycloalkylene group or a combination thereof.

Z represents, in the case where a plurality of Z's are present, each independently represents, an ether bond, an ester bond, an amide bond, a urethane bond or a urea bond.

$R_8$ represents a monovalent organic group having a lactone structure.

n is a repetition number of the structure represented by —$R_0$—Z— in the repeating unit represented by formula (3) and represents an integer of 1 to 5.

$R_7$ represents a hydrogen atom, a halogen atom or an alkyl group.

Each of the alkylene group and the cyclic alkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, mercapto group, hydroxy group, an alkoxy group such as methoxy group, ethoxy group, isopropoxy group, tert-butoxy group and benzyloxy group, and an acetoxy group such as acetyloxy group and propionyloxy group. $R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably from 1 to 5, and examples thereof include a methylene group, an ethylene group and a propylene group. The cyclic alkylene group is preferably a cyclic alkylene having a carbon number of 3 to 20, and examples thereof include cyclohexylene, cyclopentylene, norbornylene and adamantylene. For realizing the effects of the present invention, a chain alkylene group is more preferred.

The lactone structure-containing substituent represented by $R_8$ is not limited as long as it has a lactone structure. Specific examples thereof include lactone structures represented by formulae (LC1-1) to (LC1-16) and of these, a structure represented by (LC1-4) is preferred. Structures where $n_2$ in (LC1-1) to (LC1-16) is an integer of 2 or less are more preferred.

Also, $R_8$ is more preferably a monovalent organic group containing a lactone structure (cyanolactone) having a cyano group as the substituent.

Specific examples of the repeating unit containing a group having a lactone structure represented by formula (3) are set forth below, but the present invention is not limited thereto.

In the following specific examples, R is a hydrogen atom, an alkyl group which may have a substituent, or a halogen atom, preferably a hydrogen atom, a methyl group, or a hydroxymethyl or acetoxymethyl group which is an alkyl group having a substituent.

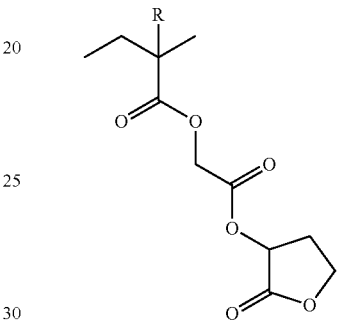

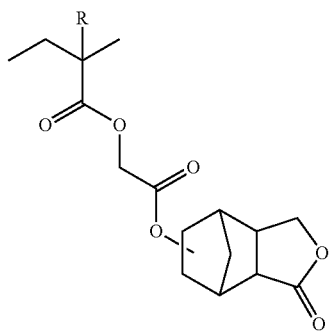

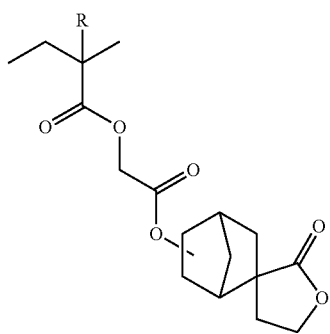

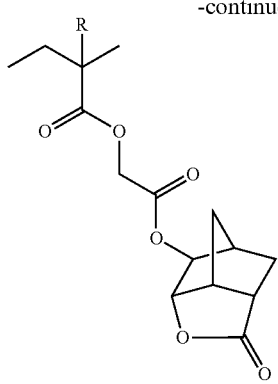

The repeating unit having a lactone structure is more preferably a repeating unit represented by the following formula (3-1):

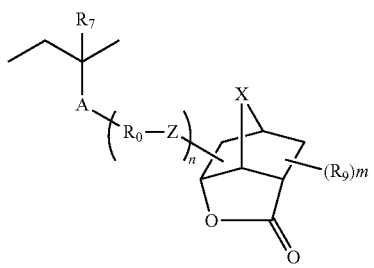

(3-1)

In formula (3-1), $R_7$, A, $R_0$, Z and n have the same meanings as in formula (3).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may form a ring.

X represents an alkylene group, an oxygen atom or a sulfur atom.

n represents an integer of 1 to 5.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group may be a cyclopropyl, cyclobutyl, cyclopentyl or cyclohexyl group. Examples of the ester group include a methoxycarbonyl group, an ethoxycarbonyl group, an n-butoxycarbonyl group and a tert-butoxycarbonyl group. Examples of the substituent include a hydroxy group, an alkoxy group such as methoxy group and ethoxy group, a cyano group, and a halogen atom such as fluorine atom. $R_9$ is preferably a cyano group.

Examples of the alkylene group of X include a methylene group and an ethylene group.

X is preferably an oxygen atom or a methylene group.

When m≥1, at least one $R_9$ is preferably substituted at the α- or β-position, more preferably at the α-position, of the carbonyl group of the lactone.

Specific examples of the lactone structure-containing repeating unit represented by formula (3-1) are set forth below, but the present invention is not limited thereto. In the following specific examples, R is a hydrogen atom, an alkyl group which may have a substituent, or a halogen atom, preferably a hydrogen atom, a methyl group, or a hydroxymethyl or acetoxymethyl group which is an alkyl group having a substituent.

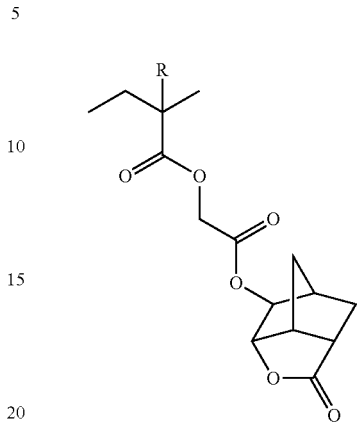

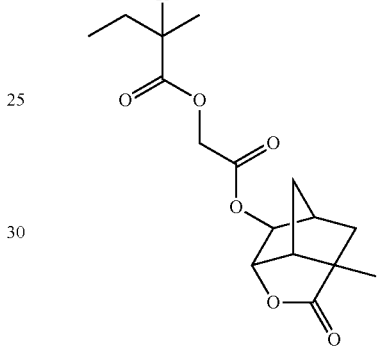

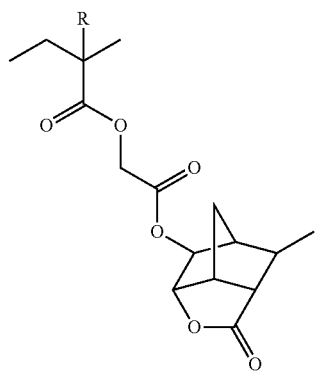

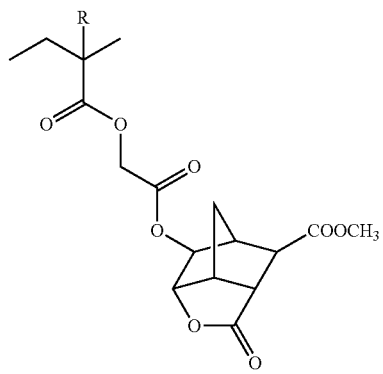

41
-continued
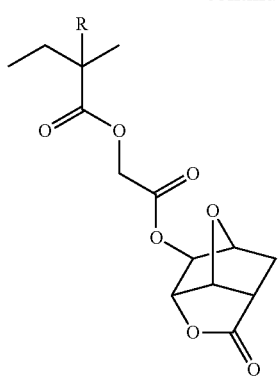
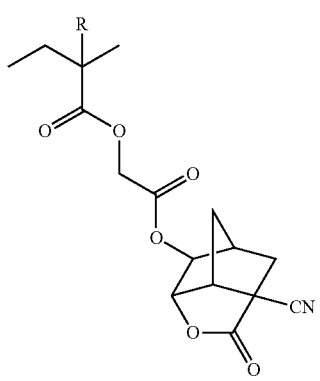
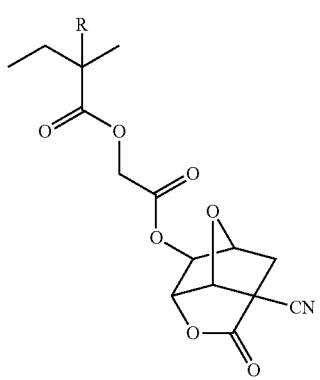
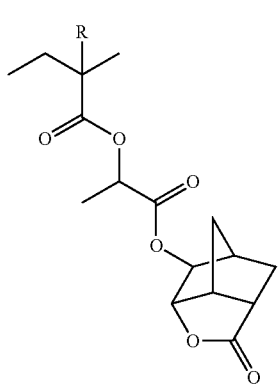
42
-continued
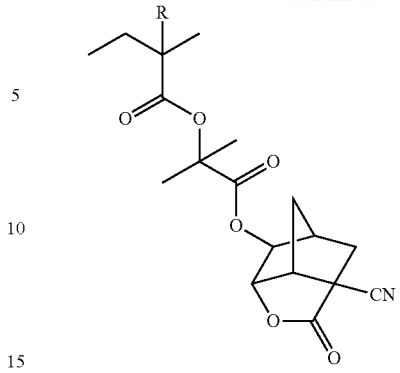
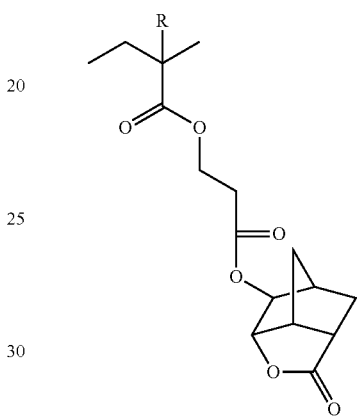
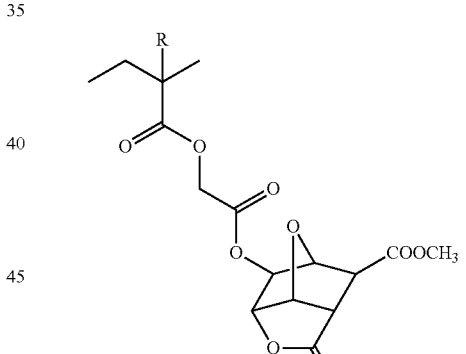
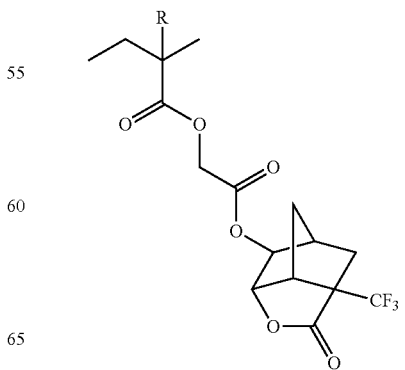

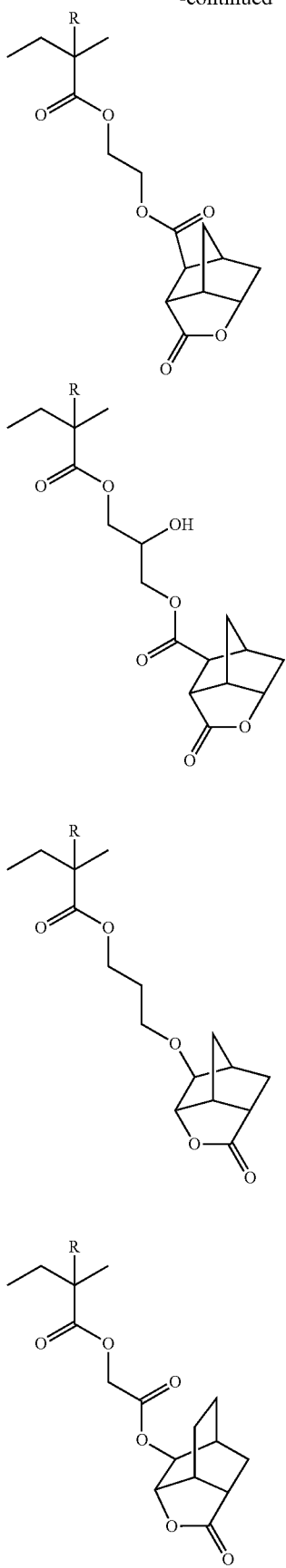
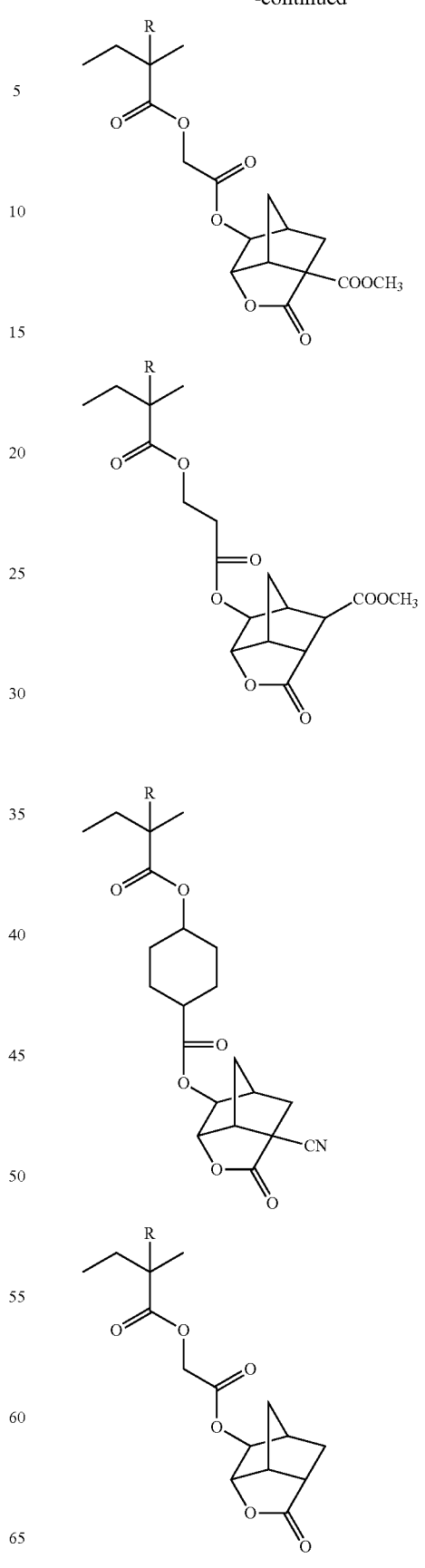

-continued
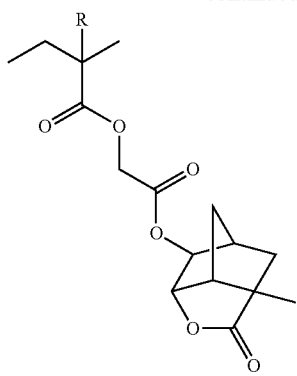
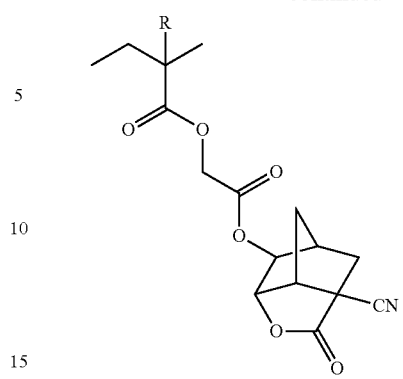
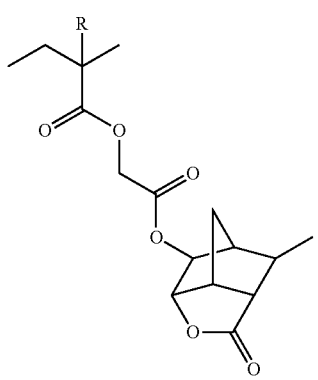
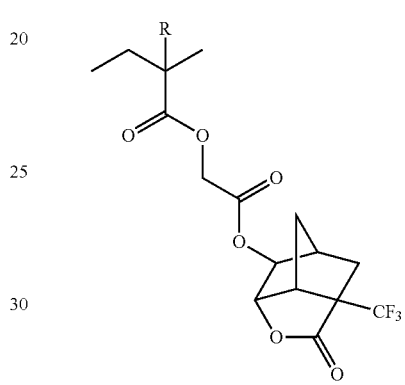
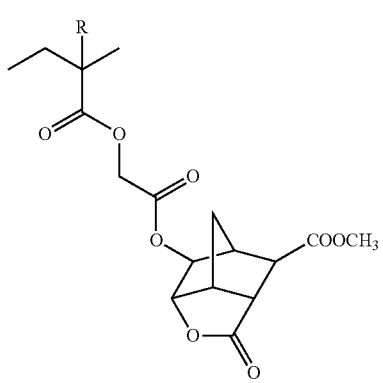
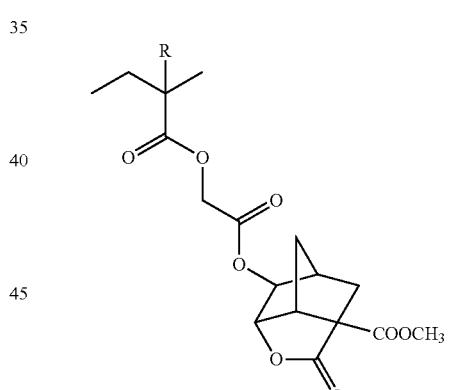
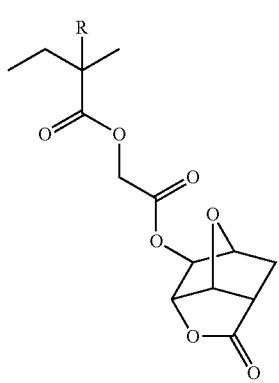
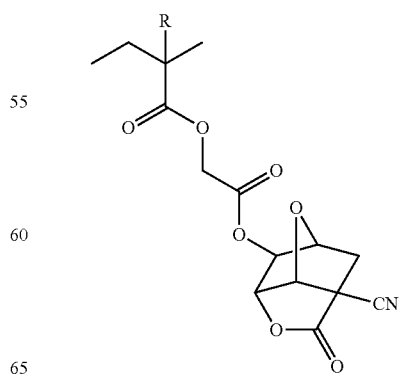

47
-continued
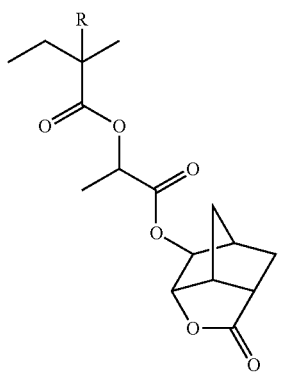
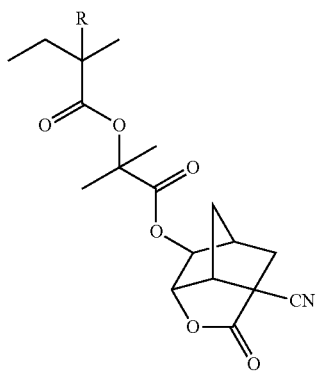
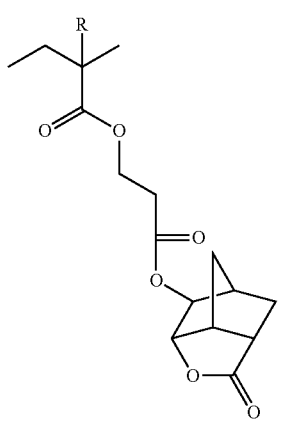
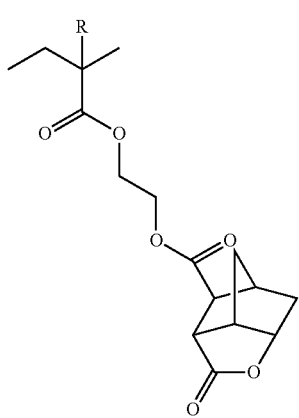
48
-continued
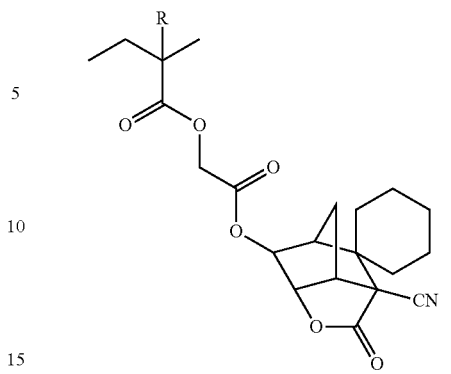
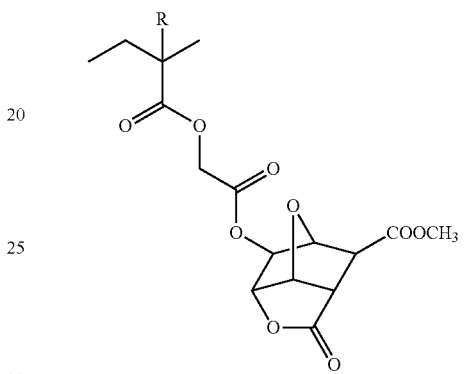
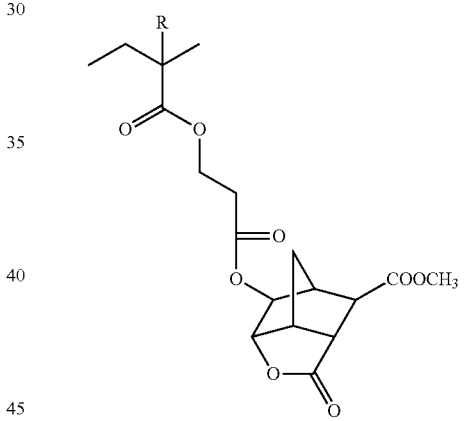
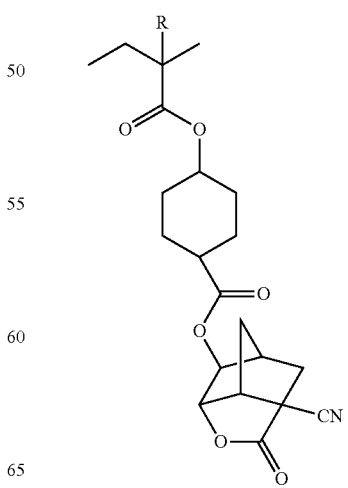

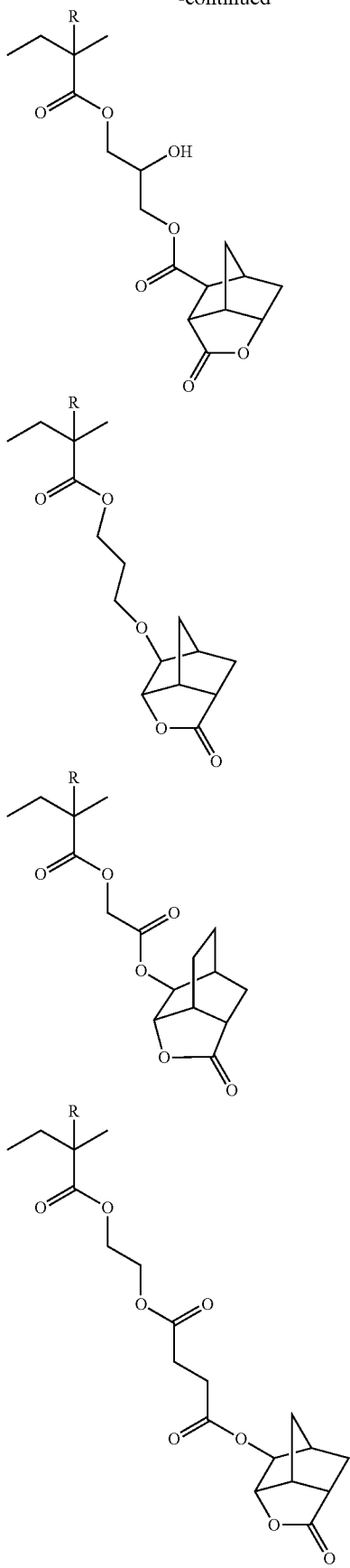
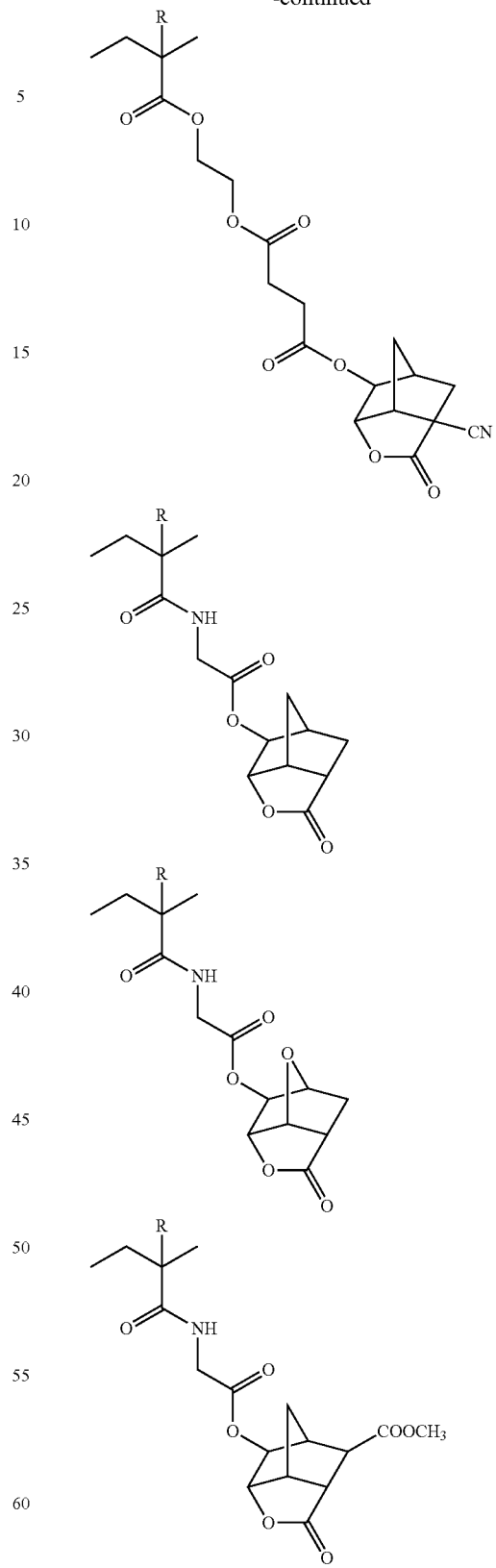
A plurality of repeating units represented by formula (3) may be combined. In this case, a combination of two or more repeating units where n=0, a combination of two or more repeating units where n=1, and a combination of a repeating unit where n=0 and a repeating unit where n=1 are preferred.

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone group is preferably from 15 to 60 mol %, more preferably from 20 to 50 mol %, still more preferably from 30 to 50 mol %, based on all repeating units in the resin.

The resin (A) preferably contains a repeating unit having a hydroxyl group or a cyano group, in addition to repeating units represented by formula (AI) and formula (AII). Thanks to this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group, and is preferably a repeating unit not having an acid decomposable group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

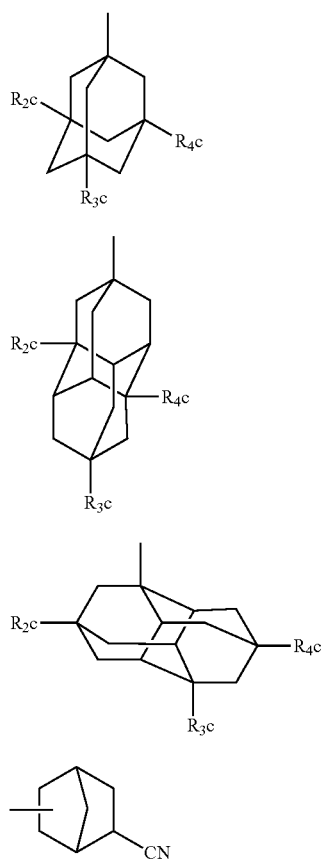

(VIIa)

(VIIb)

(VIIc)

(VIId)

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by any one of formulae (VIIa) to (VIId) includes repeating units represented by the following formulae (AIIa) to (AIId):

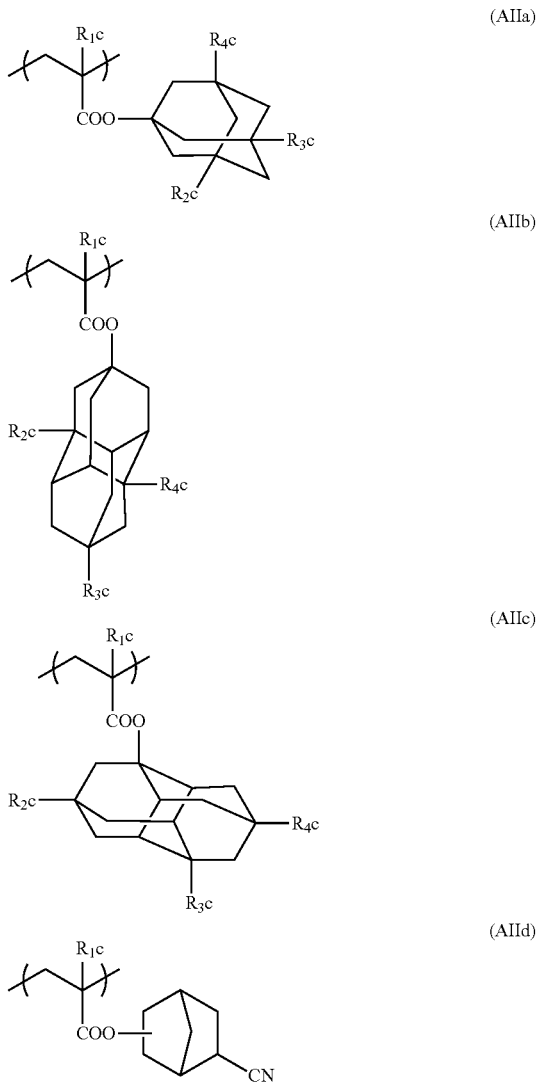

(AIIa)

(AIIb)

(AIIc)

(AIId)

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIII).

The content of the repeating unit having a hydroxyl group or a cyano group is preferably from 5 to 40 mol %, more preferably from 5 to 30 mol %, still more preferably from 10 to 25 mol %, based on all repeating units in the resin (A).

Specific examples of the repeating unit having a hydroxyl group or a cyano group are set forth below, but the present invention is not limited thereto.

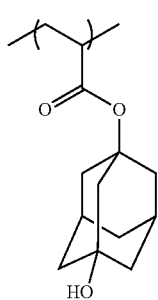
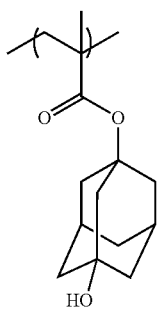
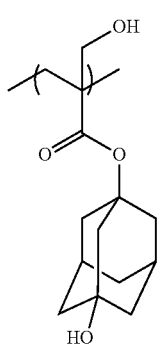
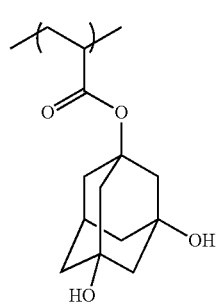
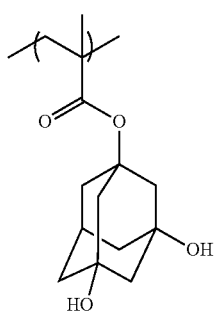
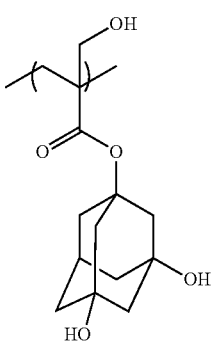
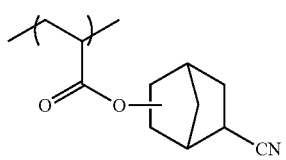
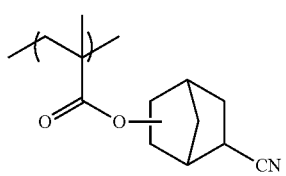
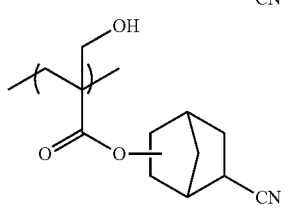

-continued

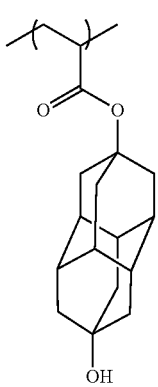
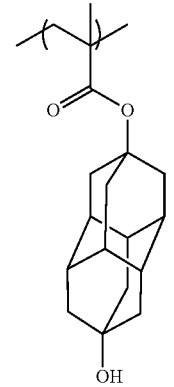
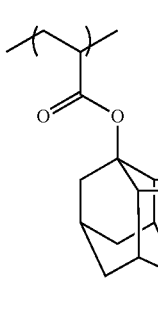
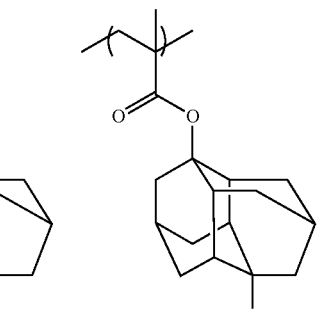

The resin for use in the positive resist composition for immersion exposure of the present invention may contain a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. A repeating unit having a carboxyl group is more preferred. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the resin (A).

Specific examples of the repeating unit having an alkali-soluble group are set forth below, but the present invention is not limited thereto.

(In the formulae, Rx is H, CH₃, CF₃ or CH₂OH.)

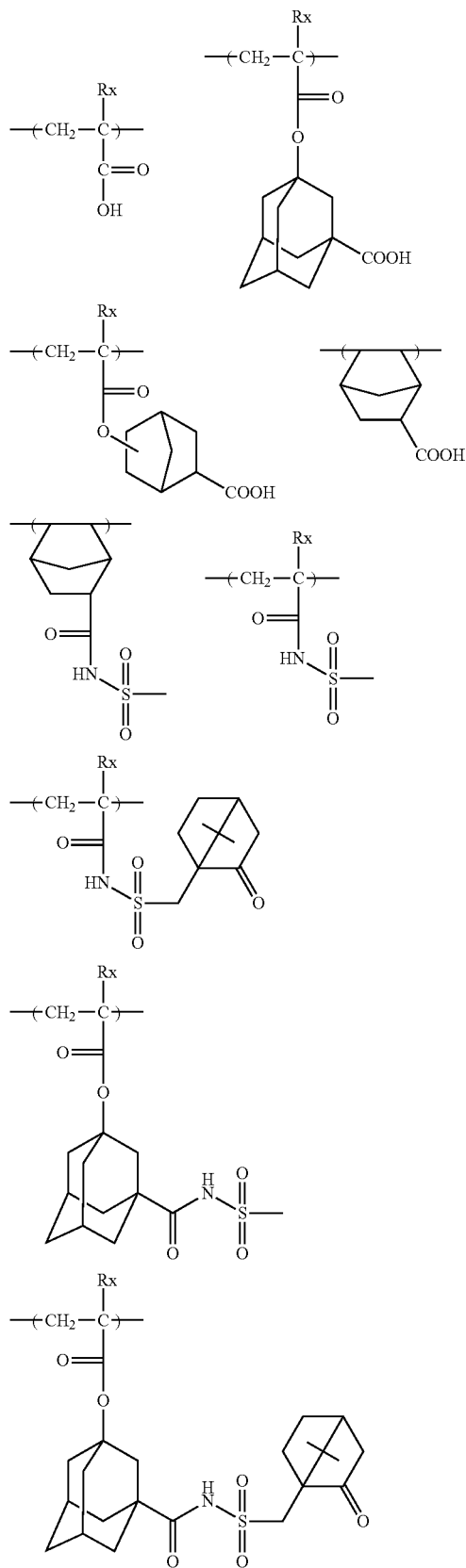

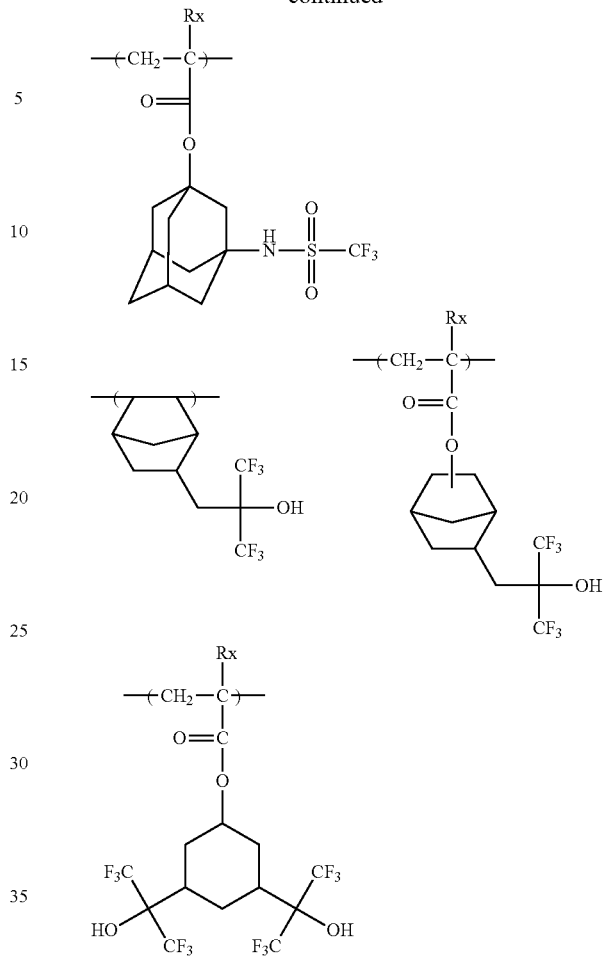

The resin (A) for use in the present invention may further contain a repeating unit having a polar group-free alicyclic hydrocarbon structure and not exhibiting acid decomposability. Thanks to this repeating unit, the dissolving out of low molecular components from the resist film to the immersion liquid at the immersion exposure can be reduced. This repeating unit includes a repeating unit represented by formula (4):

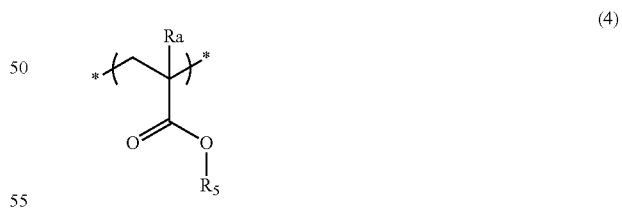

(4)

In formula (4), $R_5$ represents a hydrocarbon group having at least one cyclic structure and having neither a hydroxyl group nor a cyano group.

Ra represents a hydrogen atom, an alkyl group or a —CH₂—O—Ra₂ group, wherein Ra₂ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure possessed by $R_5$ includes a monocyclic hydrocarbon group and a polycyclic hydrocarbon group.

Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked hydrocarbon ring include bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Of these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4, the substituted methyl group is preferably a methoxymethyl group, a methoxythiomethyl group, a benzyloxymethyl group, a tert-butoxymethyl group or a 2-methoxyethoxymethyl group, the substituted ethyl group is preferably a 1-ethoxyethyl group or a 1-methyl-1-methoxyethyl group, the acyl group is preferably an aliphatic acyl group having a carbon number of 1 to 6, such as formyl group, acetyl group, propionyl group, butyryl group, isobutyryl group, valeryl group and pivaloyl group, and the alkoxycarbonyl group is preferably an alkoxycarbonyl group having a carbon number of 2 to 4.

The content of the repeating unit having a polar group-free alicyclic hydrocarbon structure and not exhibiting acid decomposability is preferably from 0 to 40 mol %, more preferably from 0 to 20 mol %, based on all repeating units in the resin (A).

Specific examples of the repeating unit having a polar group-free alicyclic hydrocarbon structure and not exhibiting acid decomposability are set forth below, but the present invention is not limited thereto. In the formulae, Ra represents H, $CH_3$, $CH_2OH$ or $CF_3$.

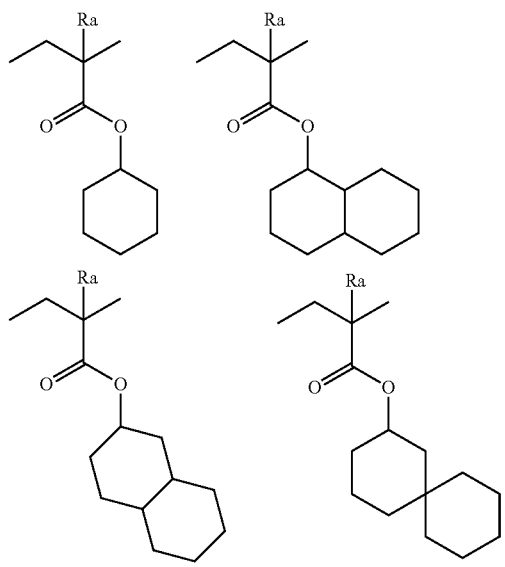

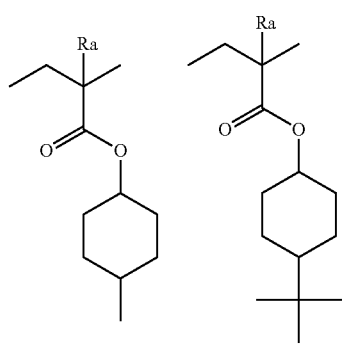

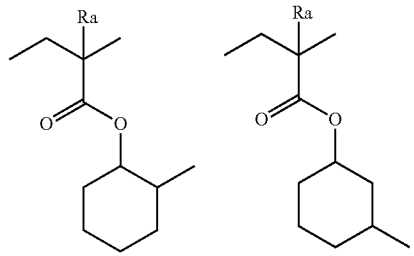

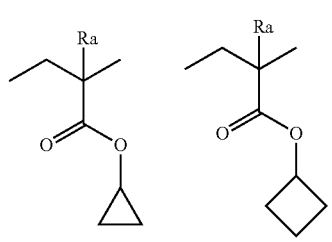

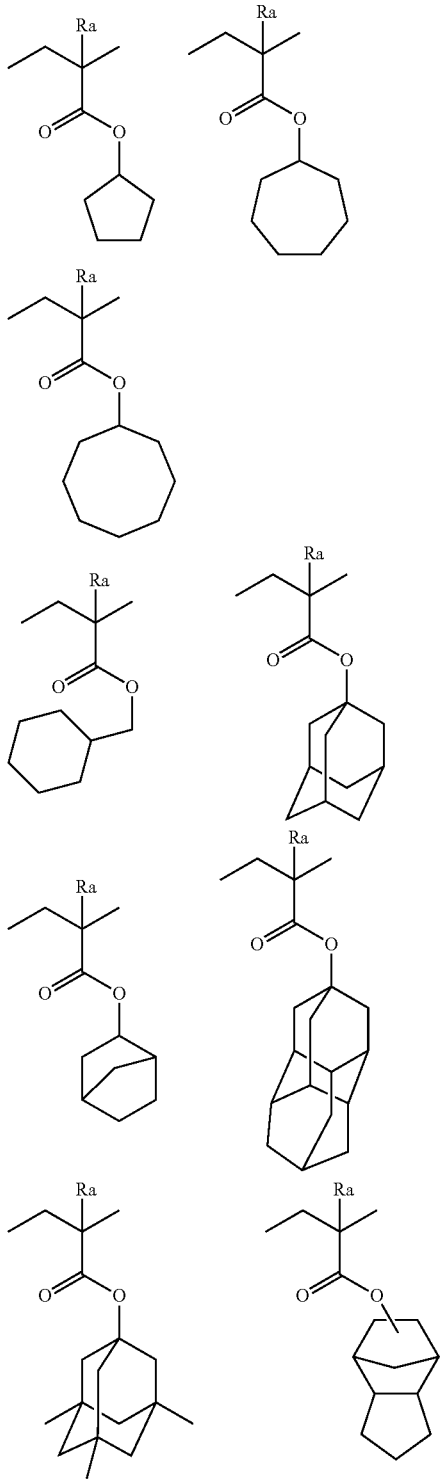

The resin for use in the positive resist composition for immersion exposure of the present invention may contain, in addition to the above-described repeating structural units, various repeating structural units for the purpose of controlling the dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

Thanks to such a repeating structural unit, the performance required of the resin for use in the positive resist composition for immersion exposure of the present invention, particularly, (1) solubility in coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A) for use in the positive resist composition for immersion exposure of the present invention, the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case where the positive resist composition for immersion exposure of the present invention is used for ArF exposure, the resin (A) for use in the positive resist composition for immersion exposure of the present invention preferably has no aromatic group in view of transparency to ArF light.

Also, the resin (A) preferably contains no fluorine atom and no silicon atom in view of compatibility with (C) a resin having at least either a fluorine atom or a silicon atom, which is described later.

The resin (A) for use in the positive resist composition for immersion exposure of the present invention is preferably a resin where all repeating units are composed of a (meth)acrylate-based repeating unit. In this case, all repeating units may be a methacrylate-based repeating unit, all repeating units may be an acrylate-based repeating unit, or all repeating unit may comprise a methacrylate-based repeating unit and an acrylate-based repeating unit, but the content of the acrylate-based repeating unit is preferably 50 mol % or less based on all repeating units. The resin is more preferably a copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units.

In the case where the positive resist composition for immersion exposure of the present invention is irradiated with KrF excimer laser light, electron beam, X-ray or high-energy beam at a wavelength of 50 nm or less (e.g., EUV), the resin (A) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl(meth)acrylate.

Preferred examples of the hydroxystyrene-based repeating unit having an acid-decomposable group include a repeating unit composed of a tert-butoxycarbonyloxystyrene, a 1-alkoxyethoxystyrene or a tertiary alkyl(meth)acrylate. A repeating unit composed of a 2-alkyl-2-adamantyl(meth)acrylate or a dialkyl(1-adamantyl)methyl(meth)acrylate is more preferred.

The resin (A) for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition for immersion exposure of the present invention. By the use of this solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The weight average molecular weight of the resin (A) for use in the present invention is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, the heat resistance, dry etching resistance and developability can be prevented from deterioration and also, the film-forming property can be prevented from deteriorating due to high viscosity.

The polydispersity (molecular weight distribution) is usually from 1 to 3, preferably from 1 to 2.6, more preferably from 1 to 2, still more preferably from 1.4 to 2.0. As the molecular weight distribution is smaller, the resolution and resist profile are more excellent, the side wall of the resist pattern is smoother, and the property in terms of roughness is more improved.

In the positive resist composition for immersion exposure of the present invention, the amount of the resin (A) blended in the entire composition is, in the case where the composition contains the following resin (A'), as a total amount of resins (A) and (A), preferably from 50 to 99.9 mass %, more preferably from 60 to 99.0 mass %, based on the entire solid content.

Resin (A'):

In the positive resist composition for immersion exposure of the present invention, two or more kinds of resins (A) may be contained, for example, an acid-decomposable resin (A') different from the resin (A) may be used in combination with the resin (A).

The acid-decomposable resin (A') is not particularly limited as long as it is different from the resin (A), and, for example, a known acid-decomposable resin may also be used.

The resin (A') may contain the repeating unit represented by formula (AI), the repeating unit having a lactone group described above, the repeating unit represented by formula (4), and the like.

As for the resin (A) and the resin (A'), there may be included, for example, a case where the kind of the repeating unit having an acid-decomposable group is different from that in the resin (A) (for example, a case where the resin (A) contains the repeating unit represented by formula (1) and the resin (A') contains the repeating unit represented by formula (2) or where the resin (A) contains the repeating unit represented by formula (1) and the resin (A') contains the repeating unit represented by formula (1) that is different from the repeating unit represented by formula (1) contained in the resin (A)), a case where the resin (A) has a lactone group and the resin (A') does not have a lactone group, a case where the kind of the lactone group is different between the resin (A) and the resin (A'), a case where the resin (A) contains the repeating unit represented by formula (4) and the resin (A') does not contain the repeating unit represented by formula (4), and a case where the kind of the repeating unit represented by formula (4) is different between the resin (A) and the resin (A').

The content of the resin (A') is preferably from 0.1 to 10 times by mass, more preferably from 0.5 to 2 times by mass, based on the resin (A).

Incidentally, a resin other than the resin (A), the resin (A') and the resin (C) described later may be used in combination within the range not impairing the effects of the present invention.

[2] (B) Compound Capable of Generating an Acid Upon Irradiation with an Actinic Ray or Radiation The positive photosensitive composition for immersion exposure of the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples of such an acid generator include a diazonium salt, a phosphonium salt, a sulfonium salt, an iodonium salt, imidosulfonate, oxime sulfonate, diazodisulfone, disulfone and o-nitrobenzyl sulfonate.

Also, a compound where a group or compound capable of generating an acid upon irradiation with an actinic ray or radiation is introduced into the main or side chain of a polymer, for example, compounds described in U.S. Pat. No. 3,849,137, German Patent 3,914,407, JP-A-63-26653, JP-A-

55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, compounds represented by the following formulae (ZI), (ZII) and (ZIII) are preferred.

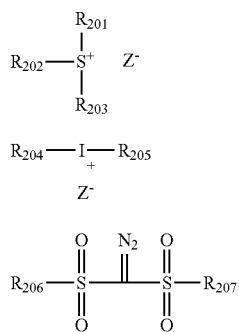

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

Each of the alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as those in the aliphatic sulfonate anion.

Examples of the aromatic group in the aromatic carboxylate anion include the same aryl group as those in the aromatic sulfonate anion.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

Each of the alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of the aryl group, alkyl group and cycloalkyl group of $R_{201}$ to $R_{203}$ may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group.

The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

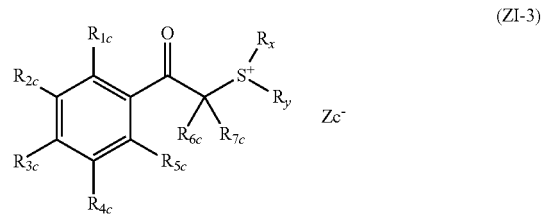

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, and a pair of $R_x$ and $R_y$ may combine together to form ring structures respectively. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

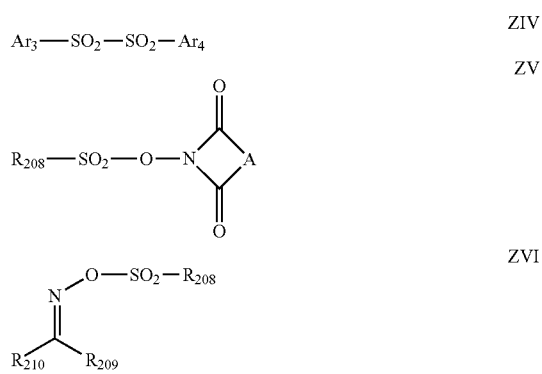

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound that generates an acid having one sulfonic acid group or imide group, more preferably a compound that generates a monovalent perfluoroalkanesulfonic acid, a compound that generates a monovalent aromatic sulfonic acid substituted by a fluorine atom or a fluorine atom-containing group, or a compound that generates a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generated from the acid generator which can be used is preferably a fluoro-substituted alkanesulfonic acid, fluoro-substituted benzenesulfonic acid or fluoro-substituted imide acid having a pKa of −1 or less and in this case, the sensitivity can be enhanced.

Out of the acid generators, particularly preferred examples are set forth below.

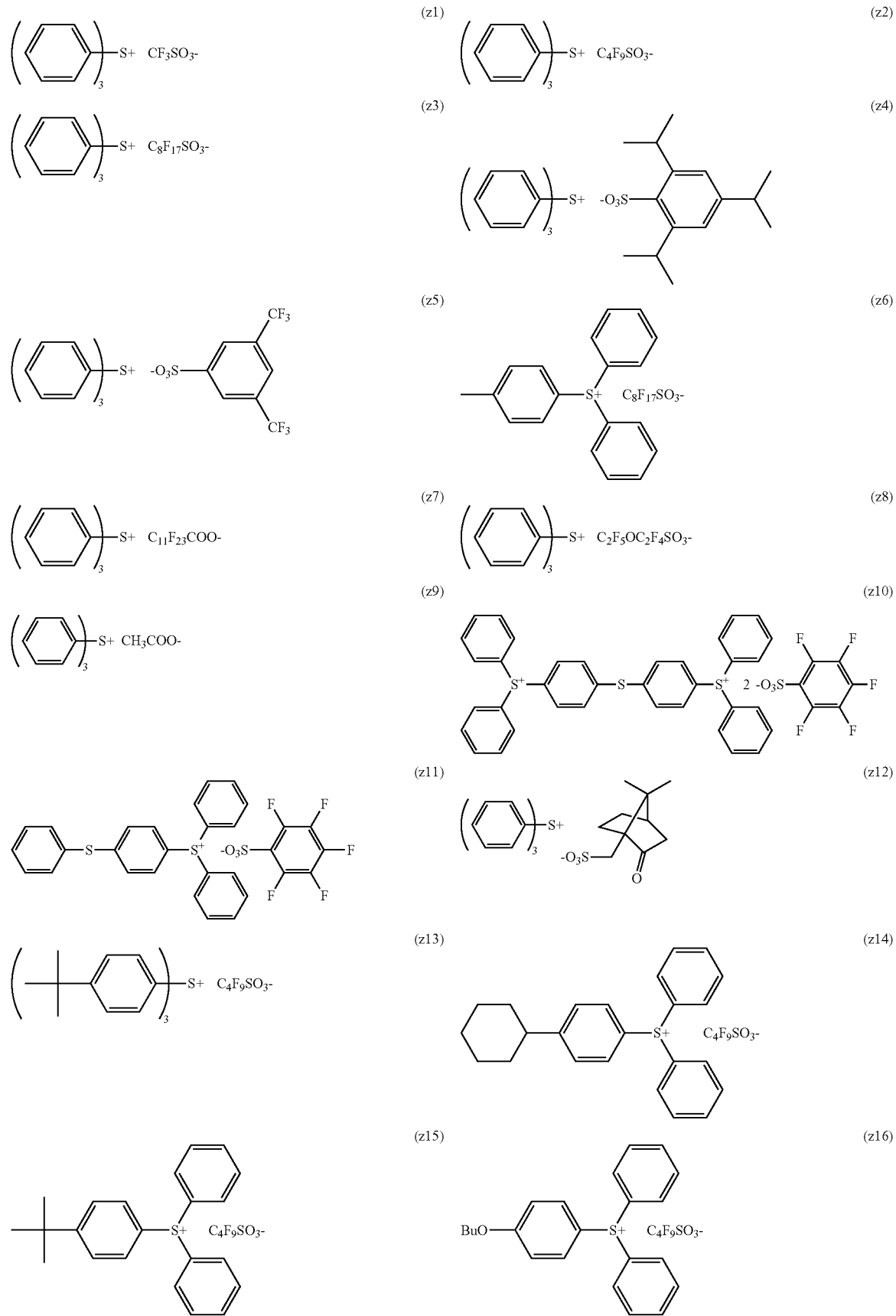

-continued
(z17) 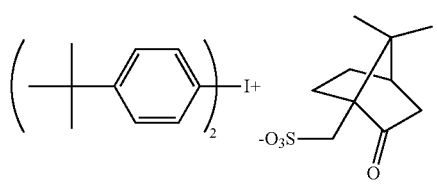
(z18) 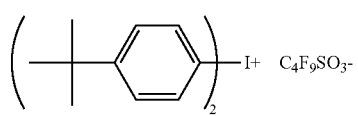
(z19) 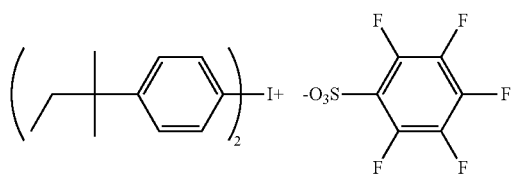
(z20) 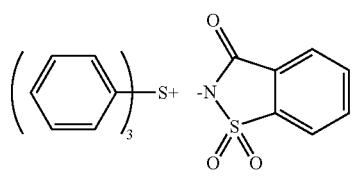
(z21) 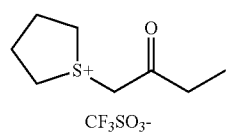
(z22) 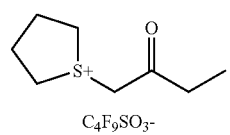
(z23) 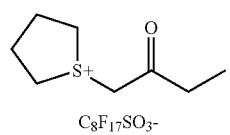
(z24) 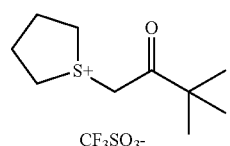
(z25) 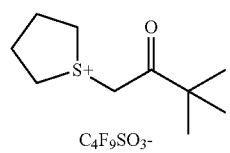
(z26) 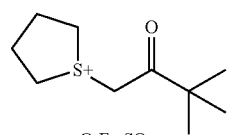
(z27) 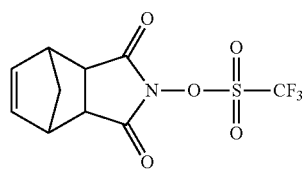
(z8) 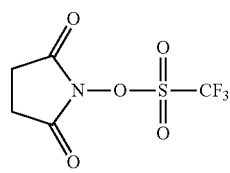
(z29) 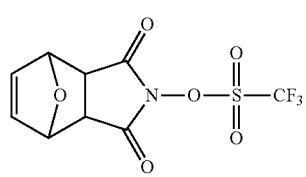
(z30) 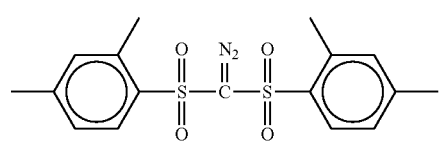
(z31) 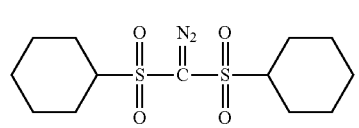
(z32) 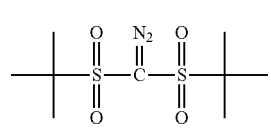
(z33) 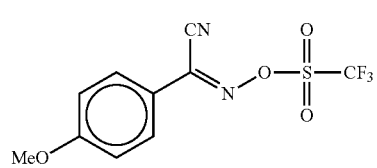
(z34) 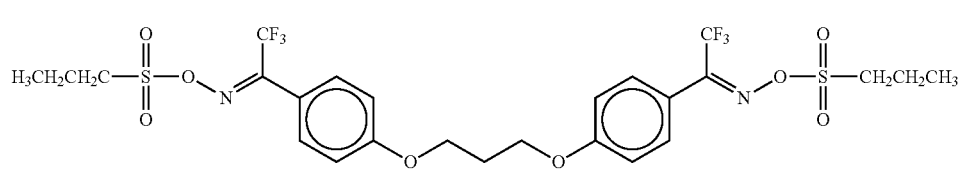

-continued
(z35) 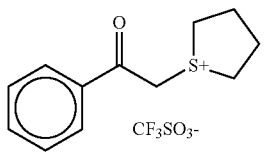
(z36) 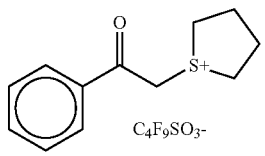
(z37) 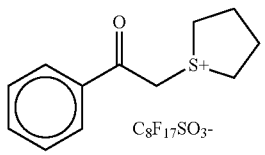
(z38) 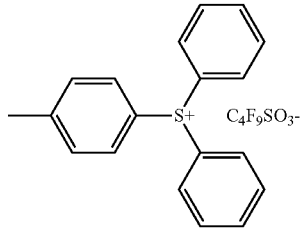
(z39) 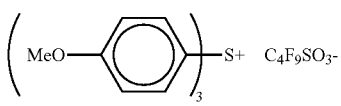
(z40) 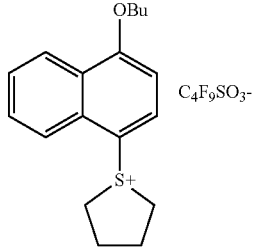
(z41) 
(z42) 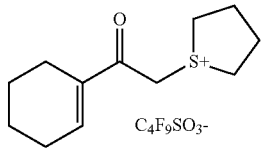
(z43) 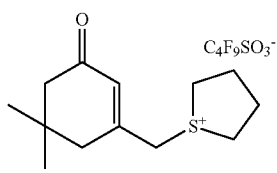
(z44) 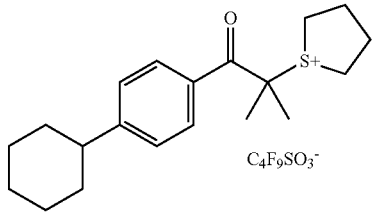
(z45) 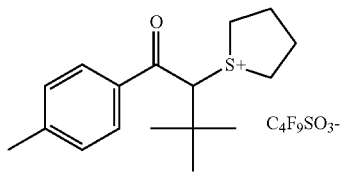
(z46) 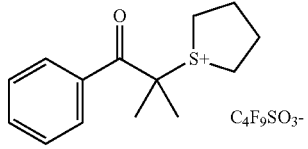
(z47) 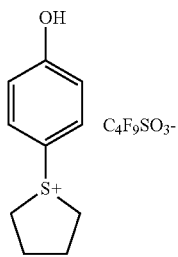
(z48) 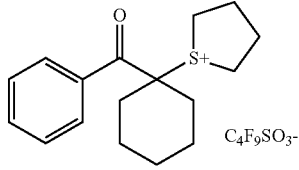

-continued
(z49) 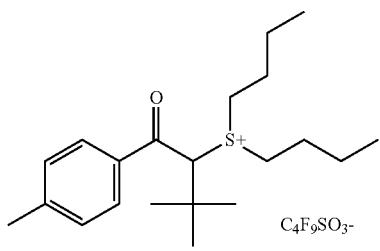
(z50) 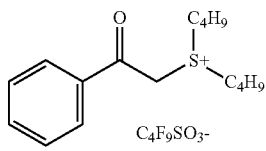
(z51) 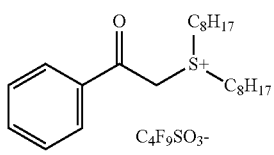
(z52) 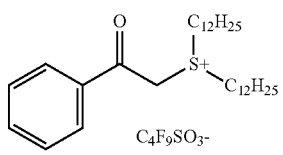
(z53) 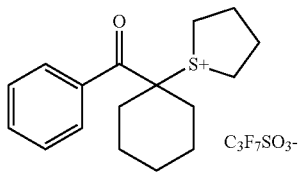
(z54) 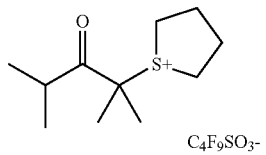
(z55) 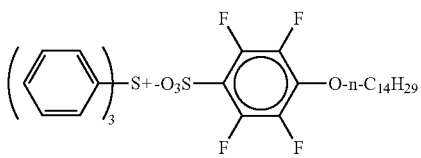
(z56) 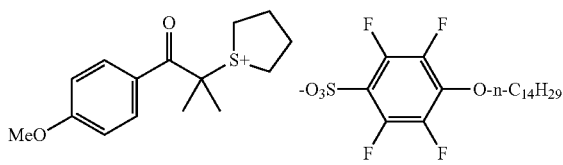
(z57) 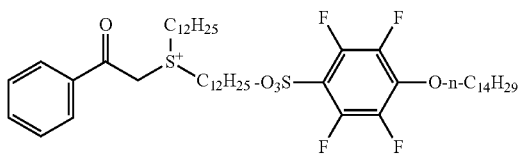
(z58) 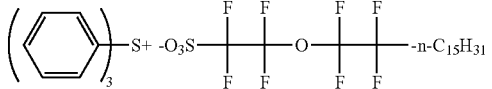
(z59) 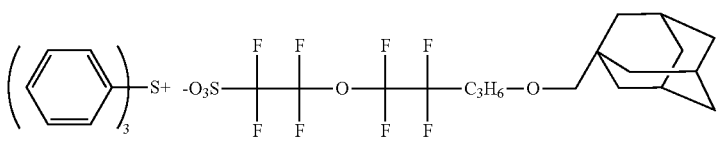
(z60) 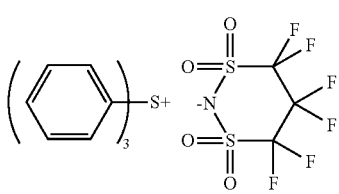
(z61) 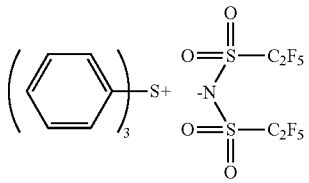
(z62) 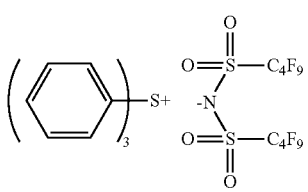
(z63) 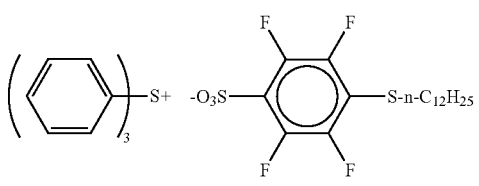

-continued

-continued
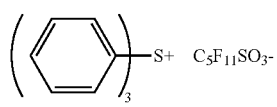
(z81)
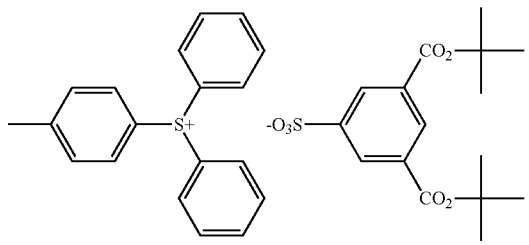
(z82)
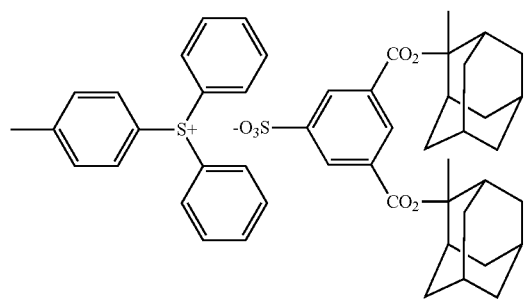
(z83)
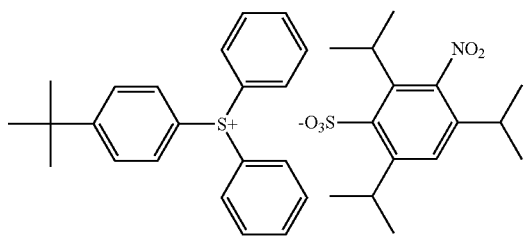
(z84)
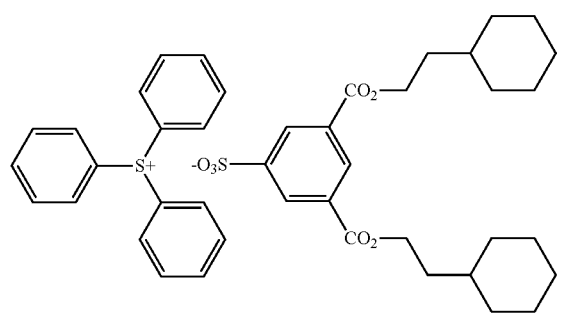
(z85)
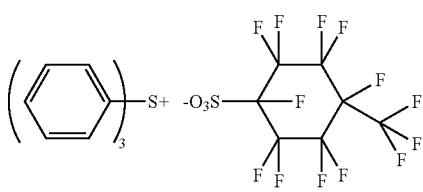
(z86)
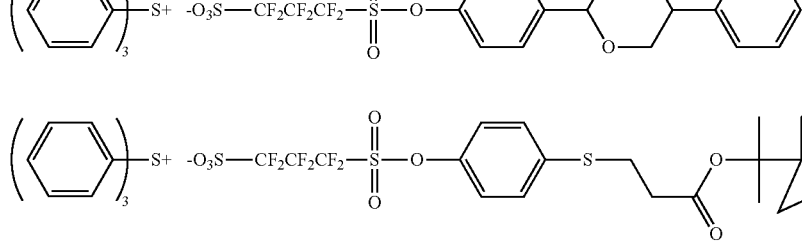
(z87)
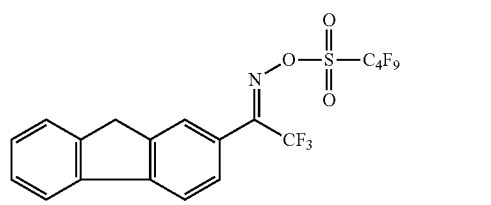
(z88)
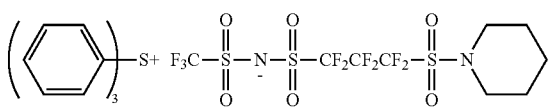
(z89)
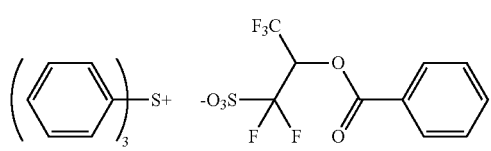
(z90)
(z91)

It is also preferred that the positive resist composition for immersion exposure of the present invention contains, as the acid generator, a compound capable of generating an acid corresponding to the anion moiety in formula (I) upon irradiation with an actinic ray or radiation.

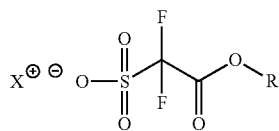
(I)

(wherein $X^+$ represents an organic counter ion, and R represents a hydrogen atom or an organic group).

In formula (I), R represents a hydrogen atom or an organic group and is preferably an organic group having a carbon number of 1 to 40, more preferably an organic group having a carbon number of 3 to 20, and most preferably an organic group represented by the following formula (II).

The organic group of R is sufficient if it has one or more carbon atoms. The organic group is preferably an organic group where the atom bonded to the oxygen atom in the ester bond shown in formula (I) is a carbon atom, and examples thereof include an alkyl group, a cycloalkyl group, an aryl group, an aralkyl group and a group having a lactone structure. The organic group may contain a heteroatom such as oxygen atom and sulfur atom in the chain. Also, one of these groups may have another as a substituent, or the organic group may have a substituent such as hydroxyl group, acyl group, acyloxy group, oxy group (=O) or halogen atom.

$$-(CH_2)_n\text{-Rc-}(Y)_m \quad (II)$$

In formula (II), Rc represents a monocyclic or polycyclic organic group having a carbon number of 3 to 30 which may contain a cyclic ether, cyclic thioether, cyclic ketone, cyclic carbonate ester, lactone or lactam structure; Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8; m=from 0 to 6; when a plurality of Y's are present, each Y may be the same as or different from every other Y; and n=from 0 to 10.

The total number of carbon atoms constituting the R group represented by formula (II) is preferably 40 or less.

It is preferred that n=from 0 to 3 and Rc is a monocyclic or polycyclic organic group having a carbon number of 7 to 16.

The molecular weight of the compound represented by formula (I) is generally from 300 to 1,000, preferably from 400 to 800, more preferably from 500 to 700.

Examples of the organic counter ion of $X^+$ include sulfonium cation and iodonium cation.

The preferred embodiment of the compound represented by formula (I) includes a compound represented by formula $(Z_{SC1})$ or $(Z_{IC1})$.

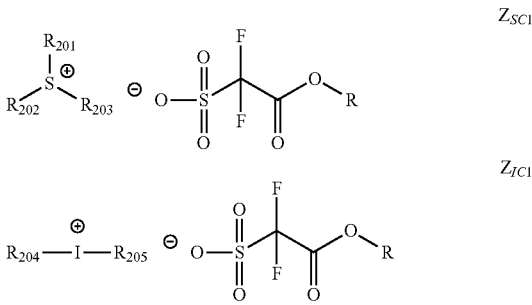

In formula $(Z_{SC1})$, the definition and preferred range of R are the same as those defined in formula (I).

Each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Examples of the organic group as $R_{201}$, $R_{202}$ and $R_{203}$ include corresponding groups in the compounds $(Z_{SC1}\text{-}1)$, $(Z_{SC1}\text{-}2)$ and $(Z_{SC1}\text{-}3)$ which are described later.

The compound may be a compound having a plurality of structures represented by formula $(Z_{SC1})$. For example, the compound may be a compound having a structure where at least one of $R_{201}$ to $R_{203}$ in the compound represented by formula $(Z_{SC1})$ is bonded to at least one of $R_{201}$ to $R_{203}$ in another compound represented by formula $(Z_{SC1})$.

The component $(Z_{SC1})$ is more preferably a compound $(Z_{SC1}\text{-}1)$, $(Z_{SC1}\text{-}2)$ or $(Z_{SC1}\text{-}3)$ described below.

The compound $(Z_{SC1}\text{-}1)$ is an arylsulfonium compound where at least one of $R_{201}$ to $R_{203}$ in formula $(Z_{SC1})$ is an aryl group, that is, a compound having arylsulfonium as the cation.

The definition and preferred range of R are the same as those defined in formula (I).

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of the aryl group, alkyl group and cycloalkyl group of $R_{201}$ to $R_{203}$ may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound ($Z_{SC1}$-2) is described below.

The definition and preferred range of R are the same as those defined in formula (I).

The compound ($Z_{SC1}$-2) is a compound where each of $R_{201}$ to $R_{203}$ in formula ($Z_{SC1}$) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound ($Z_{SC1}$-3) is a compound represented by the following formula ($Z_{SC1}$-3), and this is a compound having a phenacylsulfonium salt structure.

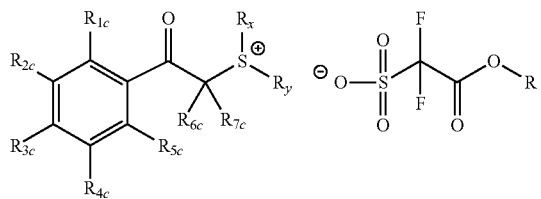

In formula ($Z_{SC1}$-3), the definition and preferred range of R are the same as those defined in formula (I).

Each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, and a pair of $R_x$ and $R_y$ may combine together to form ring structures respectively. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

In formula ($Z_{IC1}$), the definition and preferred range of R are the same as those defined in formula (I).

Each of $R_{204}$ and $R_{205}$ independently represents an aryl group, an alkyl group or a cycloalkyl group.

The aryl group of $R_{204}$ and $R_{205}$ is preferably a phenyl group or a naphthyl group, more preferably a phenyl group. The aryl group of $R_{204}$ and $R_{205}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ and $R_{205}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the aryl group, alkyl group and cycloalkyl group of $R_{204}$ and $R_{205}$ may have a substituent. Examples of the substituent which the aryl group, alkyl group and cycloalkyl group of $R_{204}$ and $R_{205}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

Specific examples of the compound represented by formula (I) include, but are not limited to, the compounds set forth below.

(Y-1)

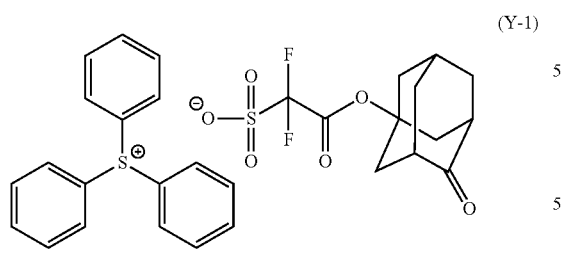

(Y-2)

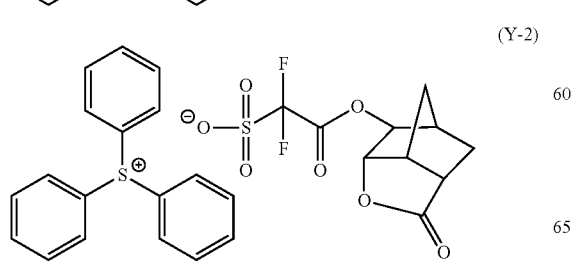

-continued (Y-3)

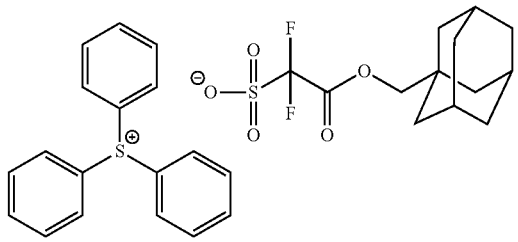

(Y-4)

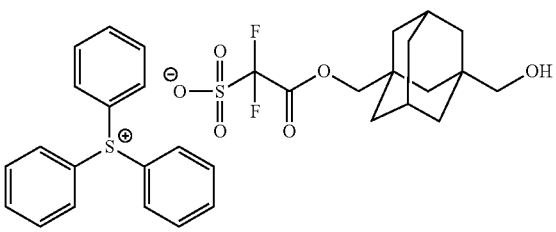

(Y-5)

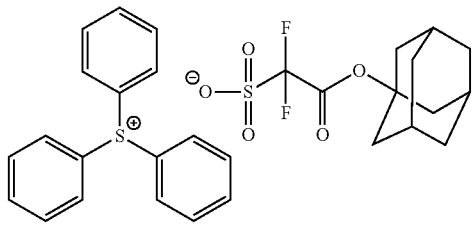

(Y-6)

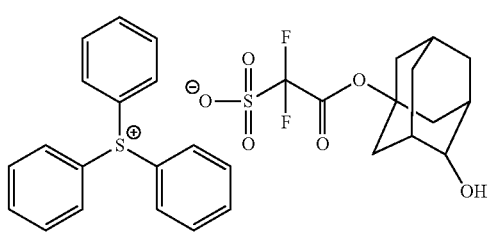

(Y-7)

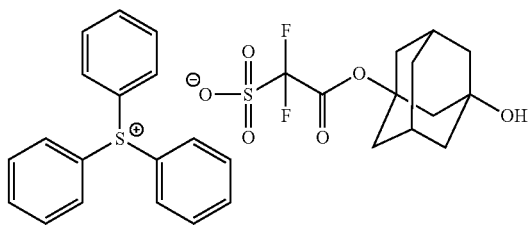

(Y-8)

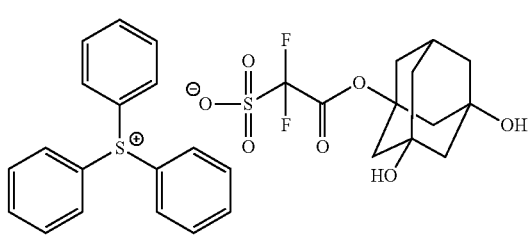

(Y-9) 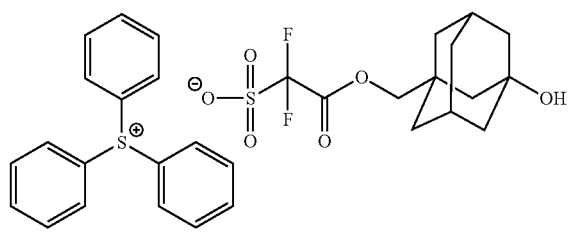
(Y-10) 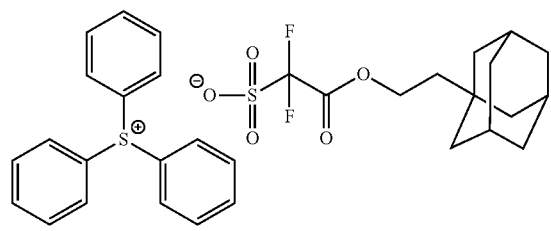
(Y-11) 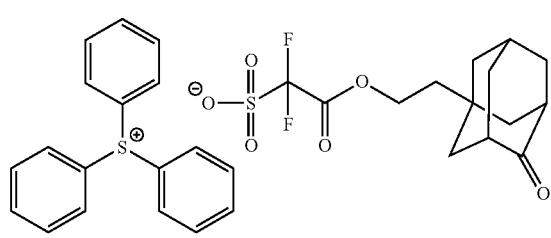
(Y-12) 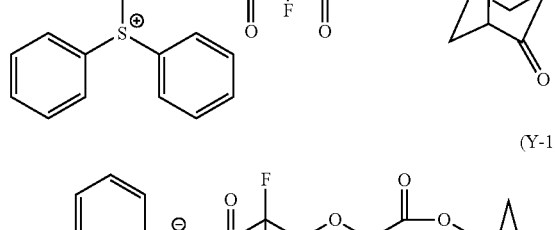
(Y-13) 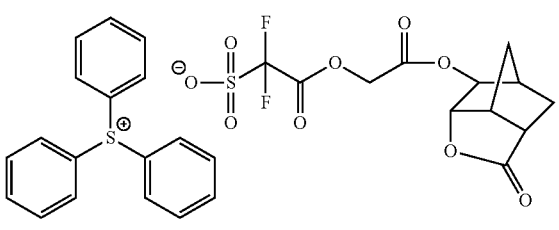
(Y-14) 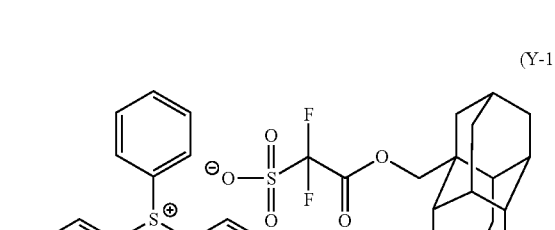
(Y-15) 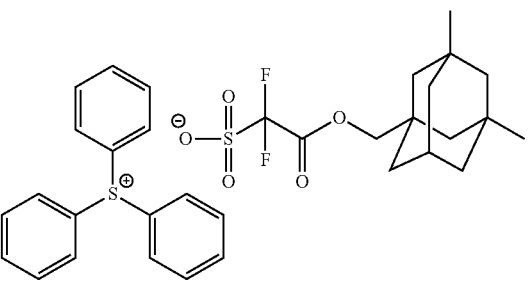
(Y-16) 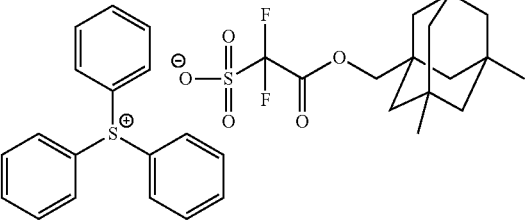
(Y-17) 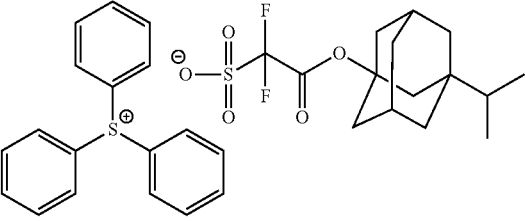
(Y-18) 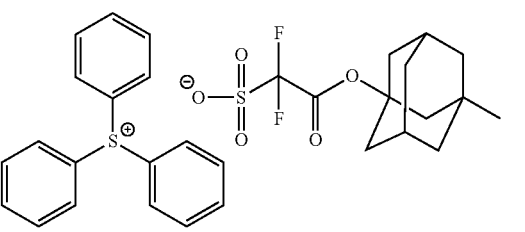
(Y-19) 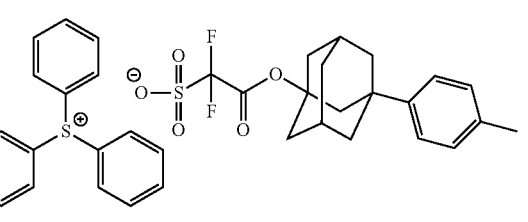
(Y-20) 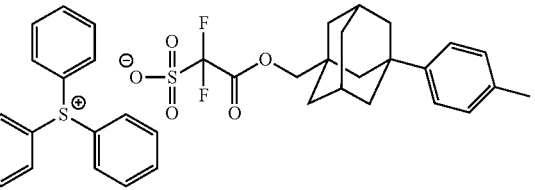

(Y-21)
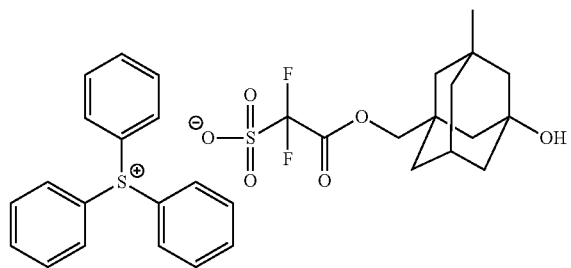
(Y-27)
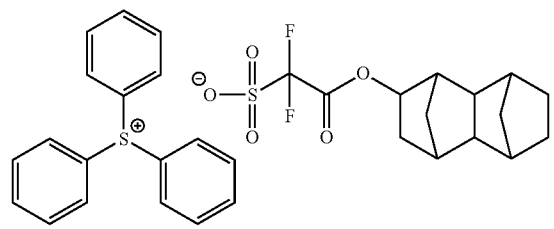
(Y-22)
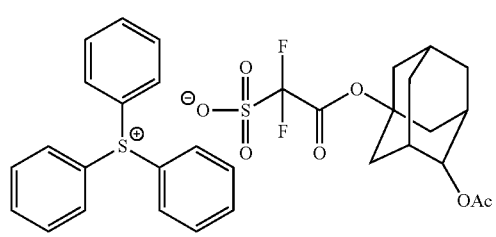
(Y-28)
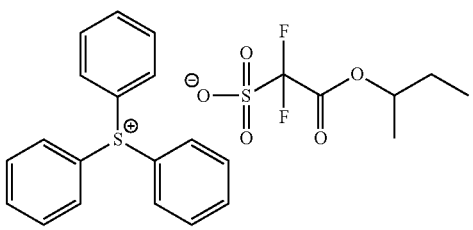
(Y-23)
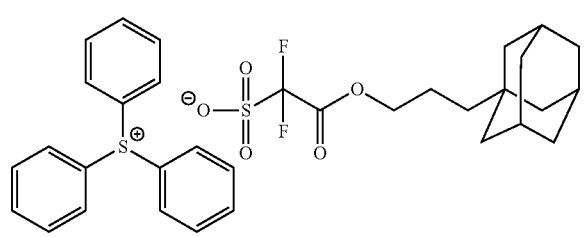
(Y-29)
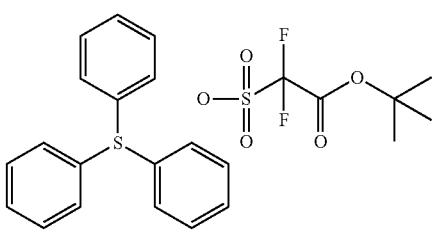
(Y-24)
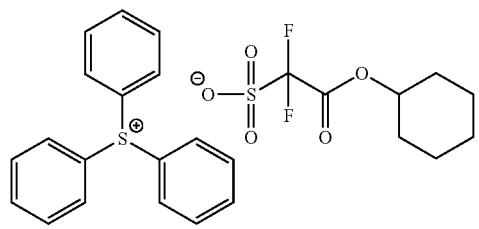
(Y-30)
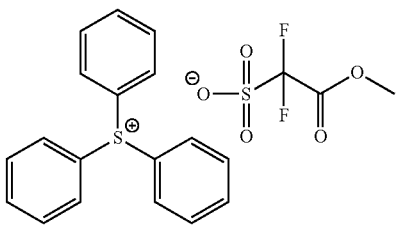
(Y-25)
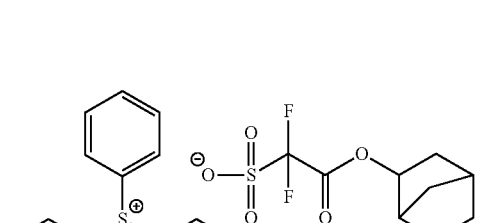
(Y-31)
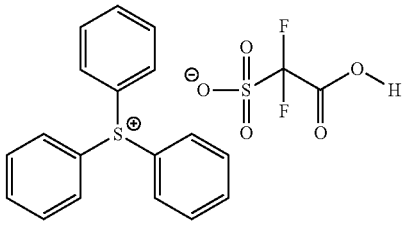
(Y-26)
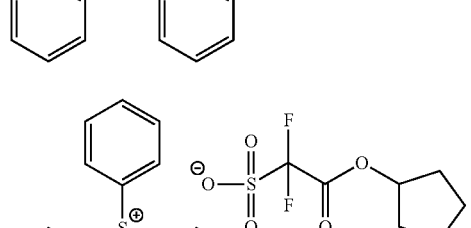
(Y-32)
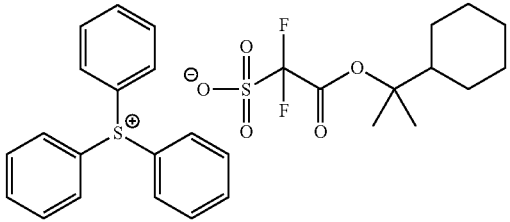

(Y-33)
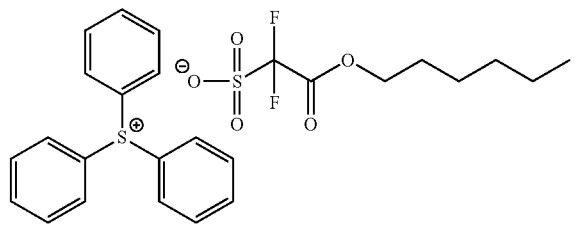
(Y-34)
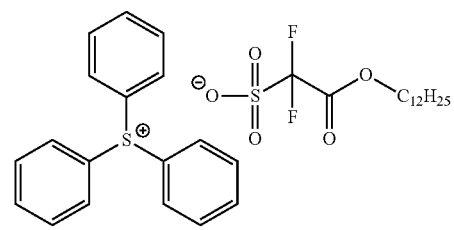
(Y-35)
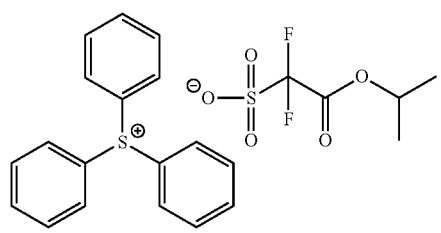
(Y-36)
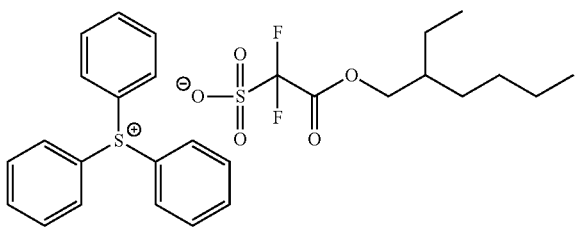
(Y-37)
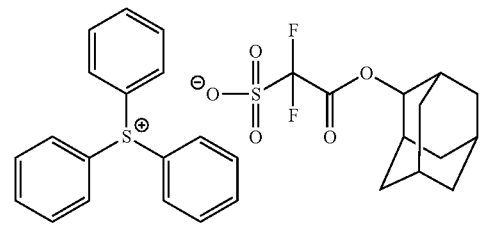
(Y-38)
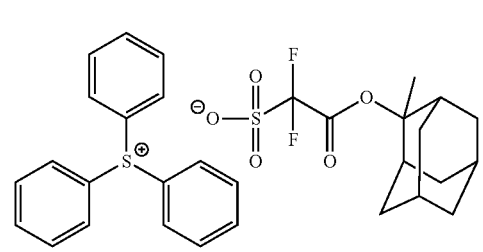
(Y-39)
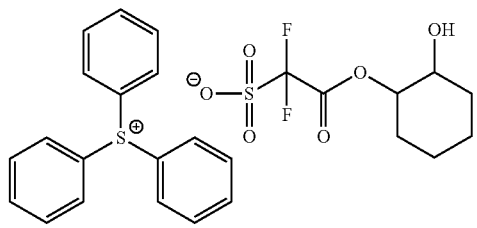
(Y-40)
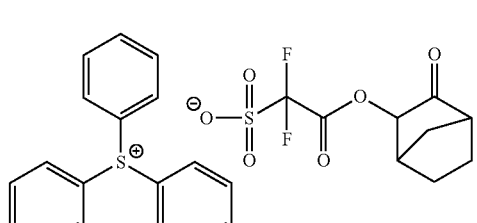
(Y-41)
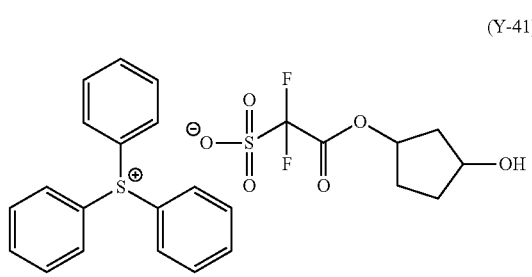
(Y-42)
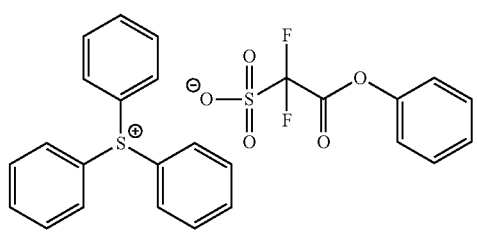
(Y-43)
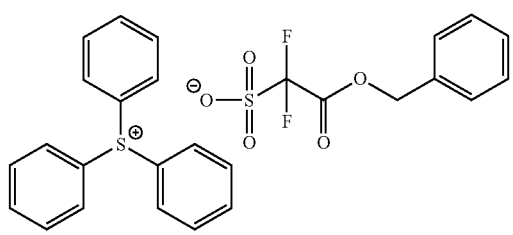
(Y-44)
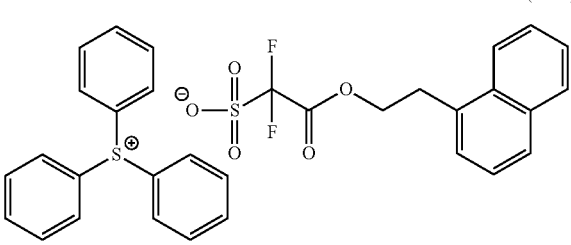

(Y-45)
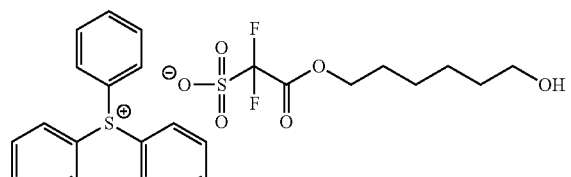
(Y-46)
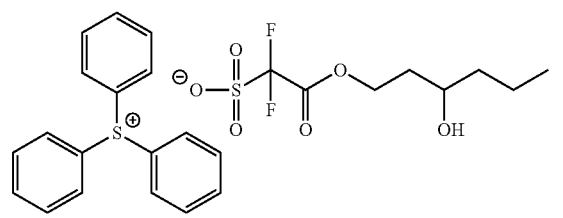
(Y-47)
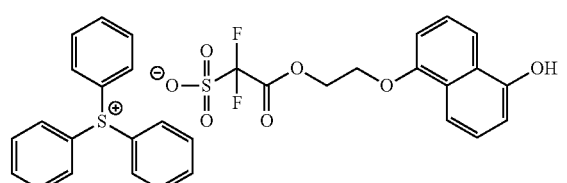
(Y-48)
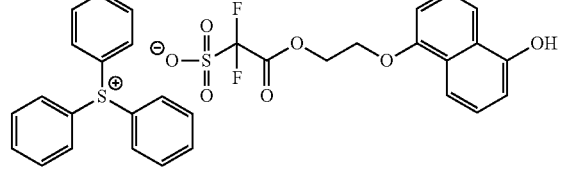
(Y-49)
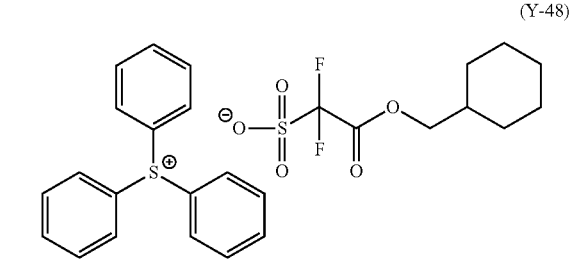
(Y-50)
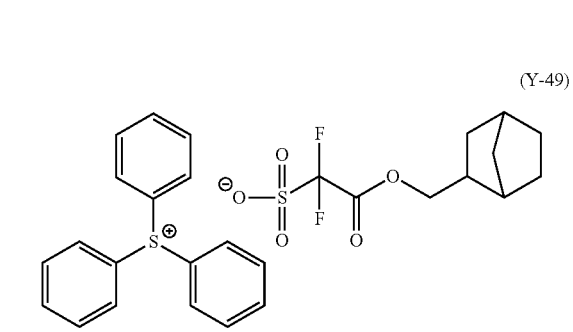
(Y-51)
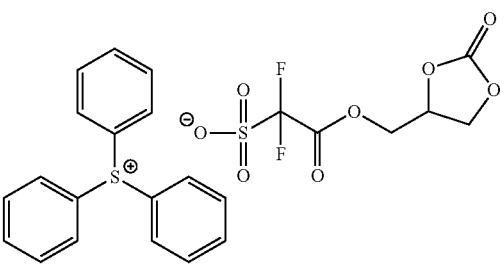
(Y-52)
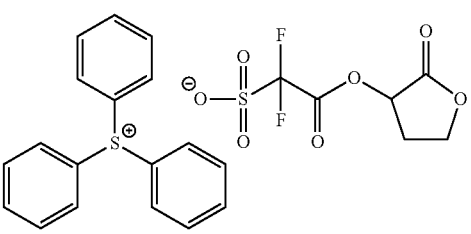
(Y-53)
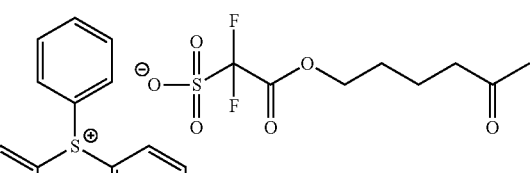
(Y-54)
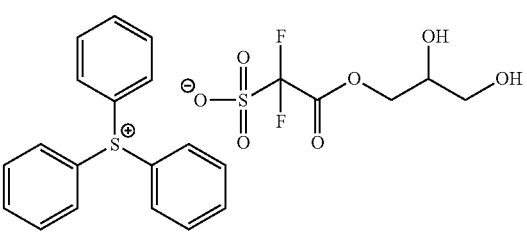
(Y-55)
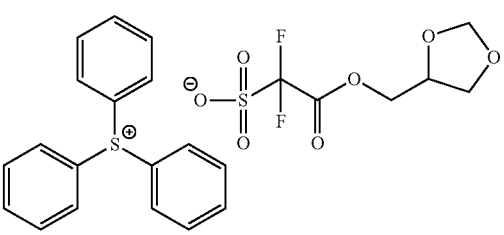
(Y-56)
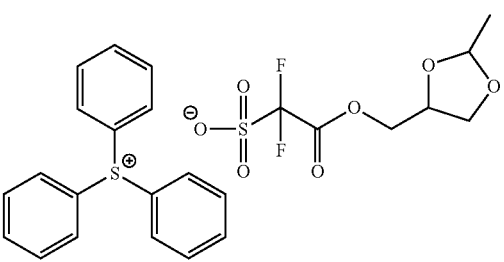

(Y-57) 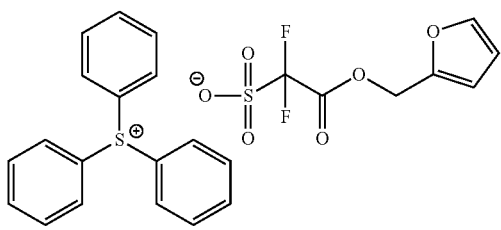
(Y-58) 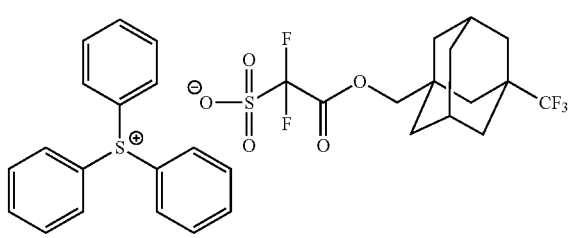
(Y-59) 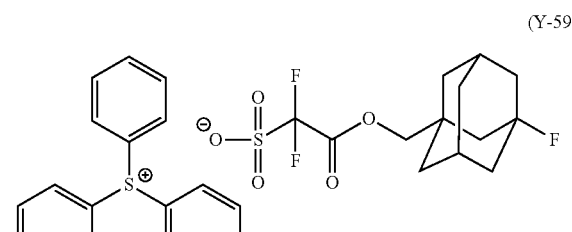
(Y-60) 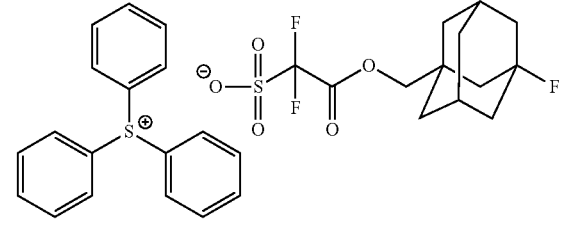
(Y-61) 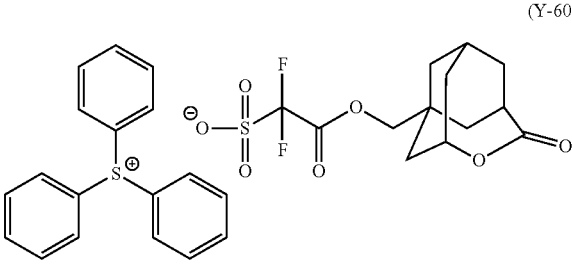
(Y-62) 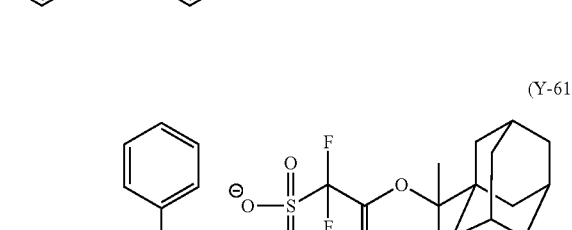
(Y-63) 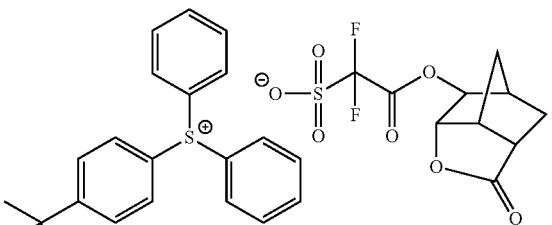
(Y-64) 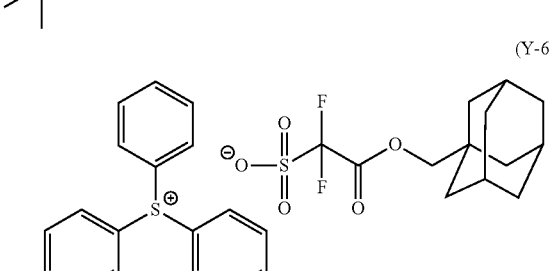
(Y-65) 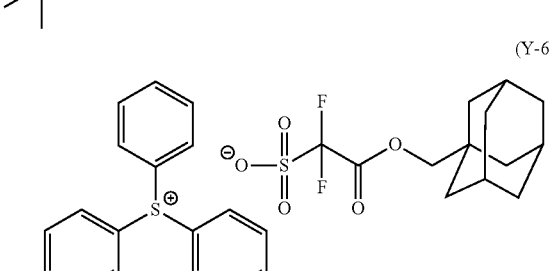
(Y-66) 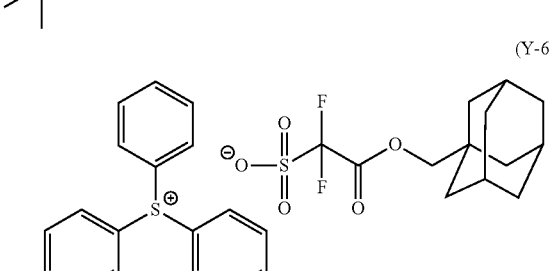
(Y-67) 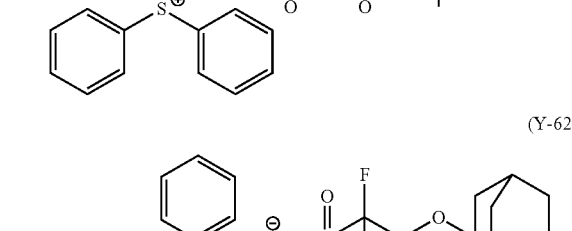
(Y-68) 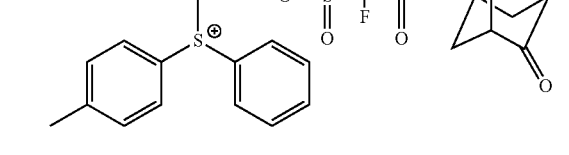

(Y-69) 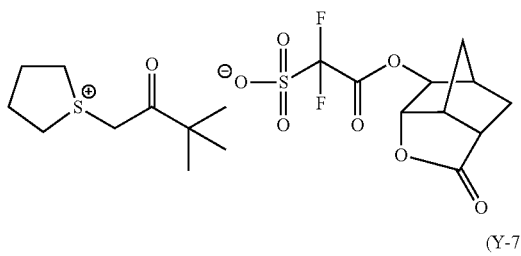

(Y-70) 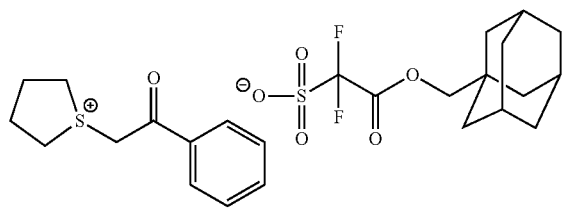

(Y-71) 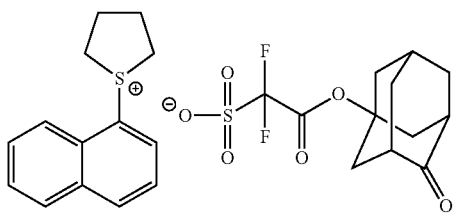

(Y-72) 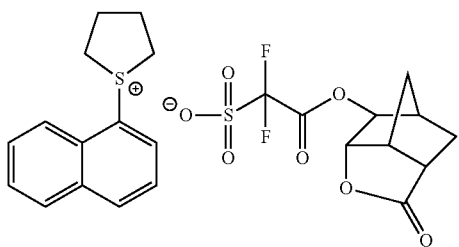

(Y-73) 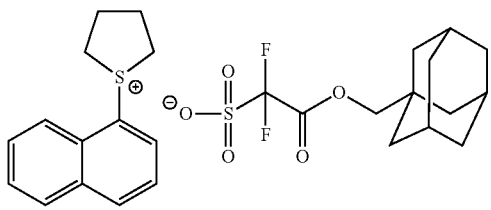

(Y-74) 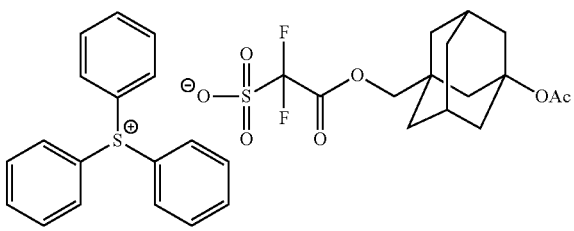

(Y-75) 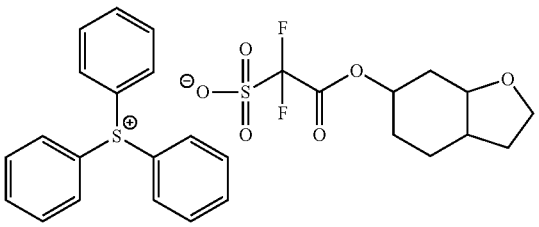

The compound represented by formula (I) can be synthesized by a known method, for example, can be synthesized in accordance with the method described in JPA-2007-161707.

As for the compound represented by formula (I), one kind may be used, or two or more kinds may be used in combination.

One kind of an acid generator may be used alone, or two or more kinds of acid generators may be used in combination.

The content of the acid generator in the positive resist composition for immersion exposure is preferably from 0.1 to 20 mass %, more preferably from 0.5 to 10 mass %, still more preferably from 1 to 7 mass %, based on the entire solid content of the resist composition.

[3] (C) Resin Having at Least Either a Fluorine Atom or a Silicon Atom

The positive resist composition for immersion exposure of the present invention contains (C) a resin having at least either a fluorine atom or a silicon atom (hydrophobic resin (C)).

When the composition contains the resin (C), the resin (C) having at least either a fluorine atom or a silicon atom is unevenly distributed to the surface layer of the resist film and in the case of using water as the immersion medium, the resist film formed can be enhanced in the receding contact angle on the resist film surface for water as well as in the followability of the immersion liquid.

The receding contact angle of the resist film is preferably from 60 to 90°, more preferably 70° or more. The amount added of the resin may be appropriately adjusted so that the resist film can have a receding contact angle in the above-described range, but the resin is preferably used in an amount of 0.01 to 10 mass %, more preferably from 0.05 to 8 mass %, still more preferably from 0.1 to 5 mass %, based on the entire solid content of the resist composition.

The resin (C) having at least either a fluorine atom or a silicon atom is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again sucked into the needle. In general, the receding contact angle can be measured by a contact angle measuring method called an expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important and the resist is required to have a performance of allowing a liquid droplet to follow the high-speed scanning of an exposure head with no remaining of the liquid droplet.

The fluorine atom or silicon atom in the resin (C) having at least either a fluorine atom or a silicon atom may be present in the main chain of the resin or may be substituted to the side chain.

The resin (C) having at least either a fluorine atom or a silicon atom is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group is an aryl group (e.g., phenyl, naphthyl) with at least one hydrogen atom being substituted by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

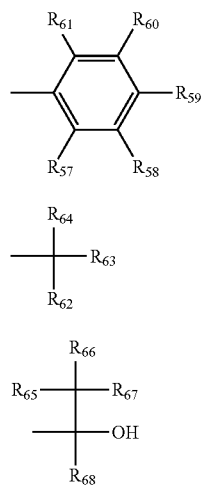

In formulae (F2) to (F4), each of $R_{57}$ to $R_{68}$ independently represents a hydrogen atom, a fluorine atom, an alkyl group, a cycloalkyl group or an aryl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4), cycloalkyl group or aryl group with at least one hydrogen atom being substituted by a fluorine atom. $R_{62}$ and $R_{63}$ may combine with each other to form a ring.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$.

$X_2$ represents —F or —CF$_3$.

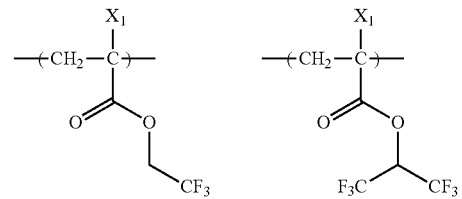

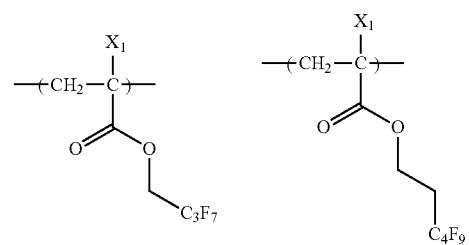

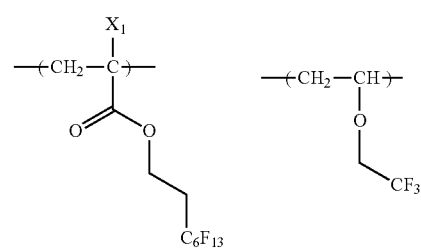

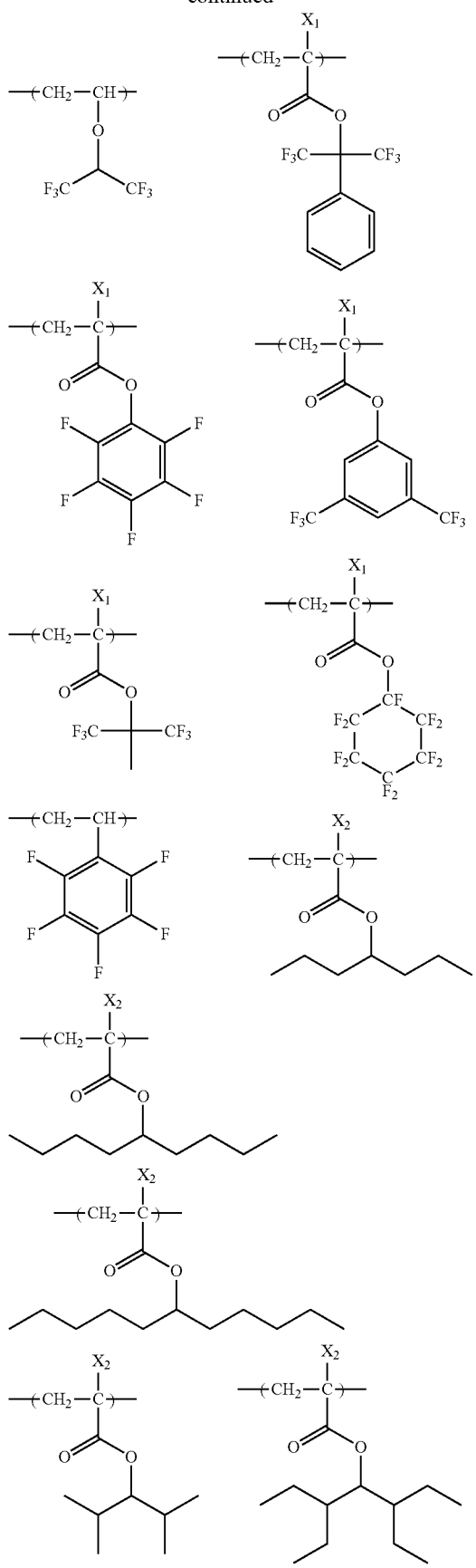
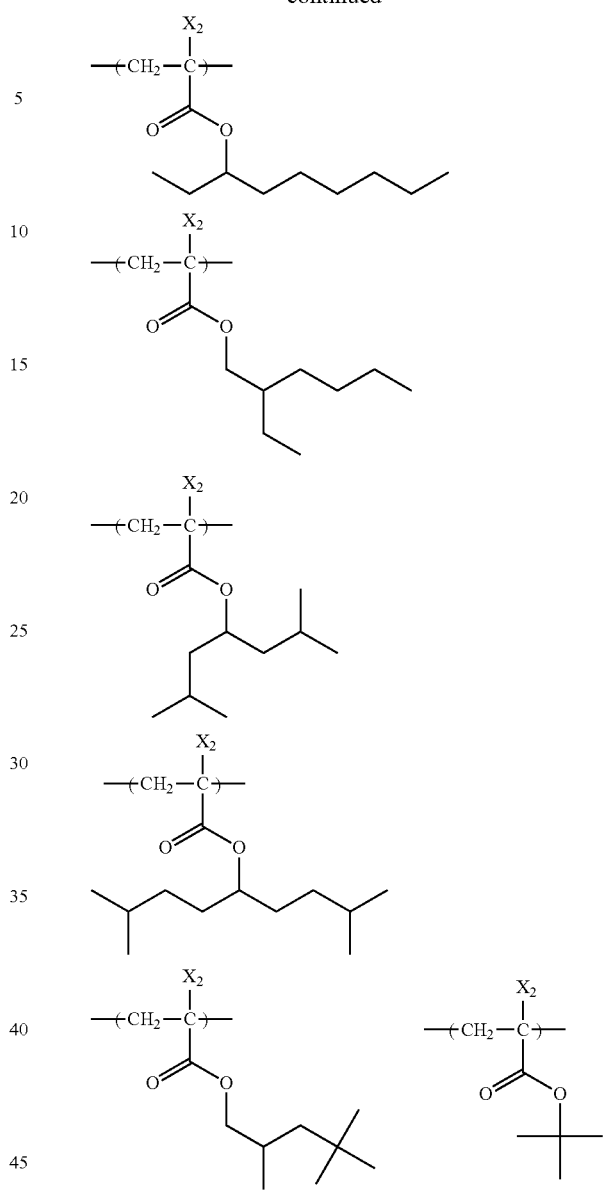

The resin (C) having at least either a fluorine atom or a silicon atom may contain a silicon atom and is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

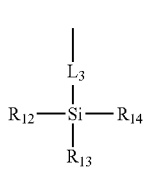

(CS-1)

(CS-2)

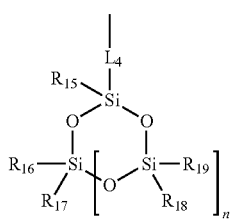

(CS-3)

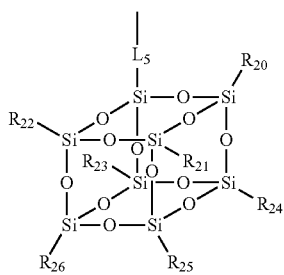

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a single group or a combination of two or more groups, selected from the group consisting of an alkylene group, a phenylene group, an ether group, a thioether group, a carbonyl group, an ester group, an amide group, a urethane group and a urea group.

n represents an integer of 1 to 5. n is preferably an integer of 2 to 4.

Specific examples of the repeating unit having a group represented by formula (CS-1) to (CS-3) are set forth below, but the present invention is not limited thereto. In specific examples, $X_1$ represents a hydrogen atom, —$CH_3$, —F or —$CF_3$.

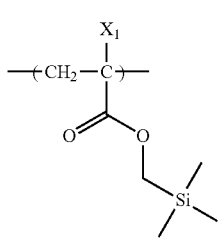 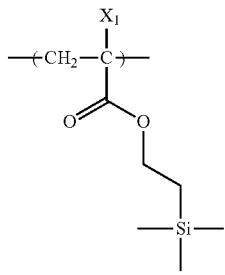

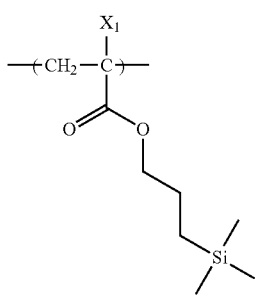 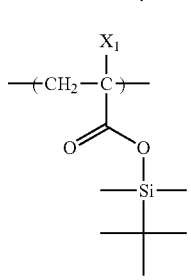

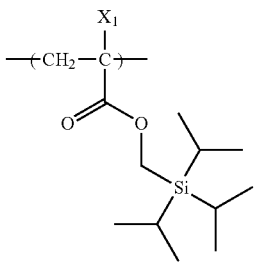

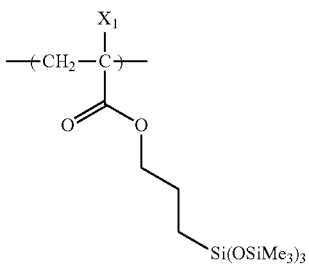

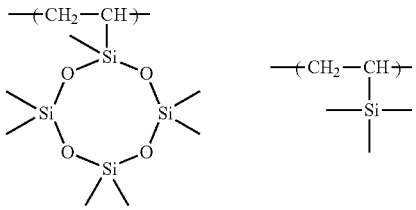

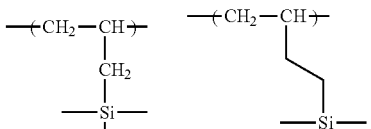

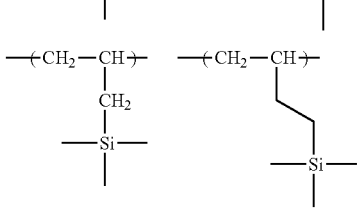

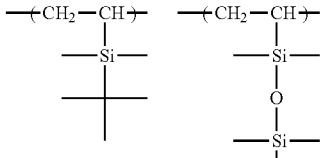

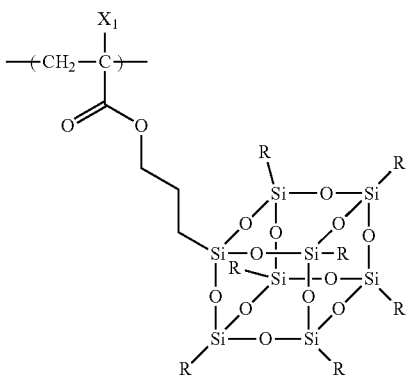

R = $CH_3$, $C_2H_5$, $C_3H_7$, $C_4H_9$ sulfonyl)imide group, a tris(alkylcarbonyl)methylene group and a tris(alkylsulfonyl)methylene group.

Preferred alkali-soluble groups include a fluorinated alcohol group (preferably hexafluoroisopropanol), a sulfonimide group and a bis(carbonyl)methylene group.

The repeating unit having (x) an alkali-soluble group includes a repeating unit where an alkali-soluble group is directly bonded to the resin main chain, such as repeating unit by an acrylic acid or a methacrylic acid, and a repeating unit where an alkali-soluble group is bonded to the resin main chain through a linking group. Furthermore, an alkali-soluble group may also be introduced into the polymer chain terminal by using an alkali-soluble group-containing polymerization initiator or chain transfer agent at the polymerization. All of these repeating units are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto. In the formulae, Rx represents H, $CH_3$, $CH_2OH$ or $CF_3$.

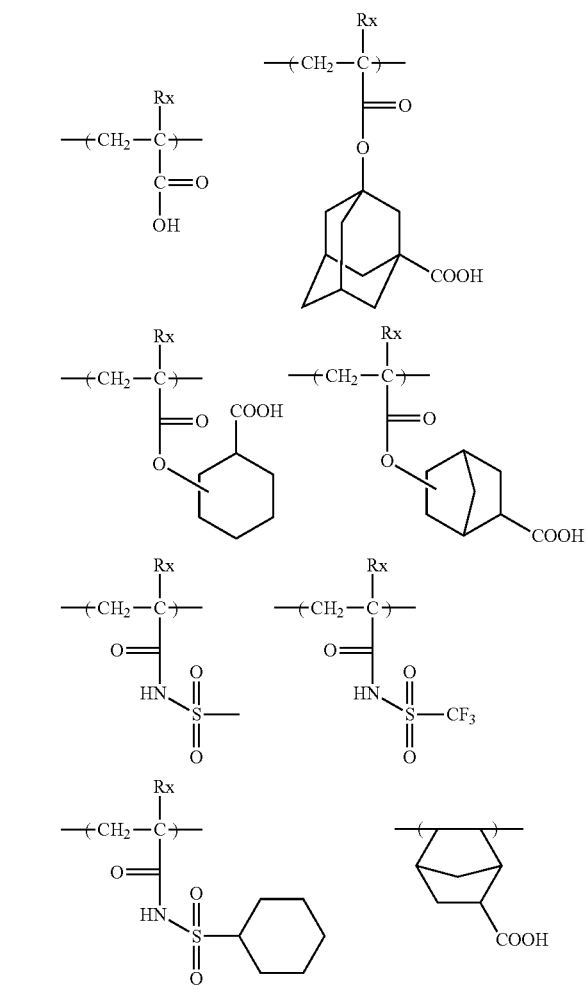

The resin (C) more preferably contains at least one kind of an acrylate or methacrylate-derived repeating unit having a group represented by any one of formulae (F2) to (F4) and (CS-1) to (CS-3).

Furthermore, the resin (C) having at least either a fluorine atom or a silicon atom may contain at least one group selected from the group consisting of the following (x) to (z):

(x) an alkali-soluble group, (y) a group capable of decomposing by the action of an alkali developer to increase the solubility in an alkali developer, and (z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkyl-

107
-continued
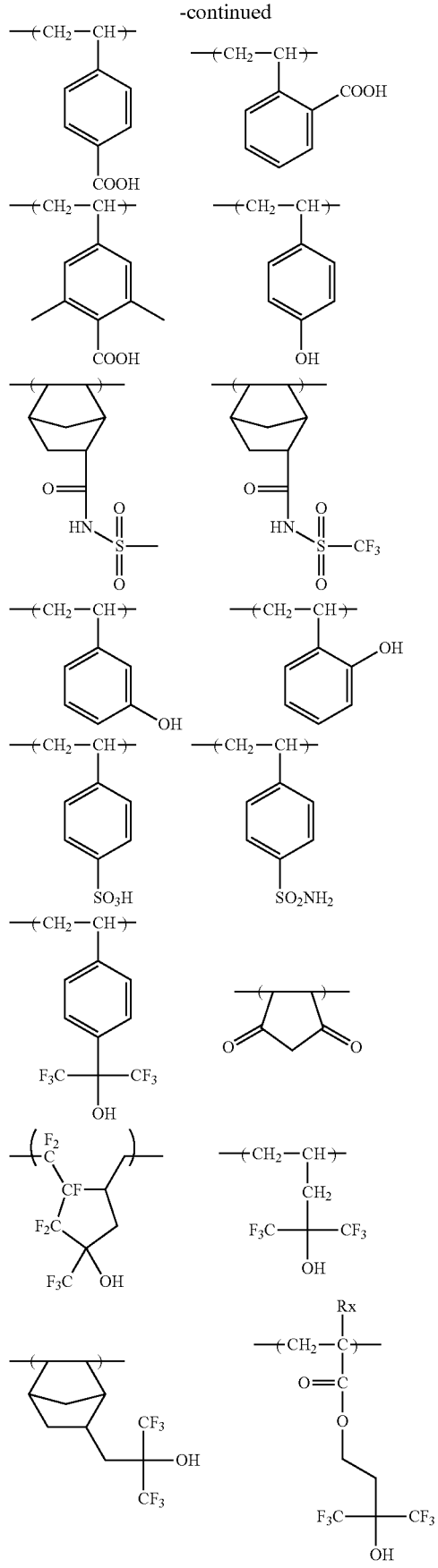
108
-continued
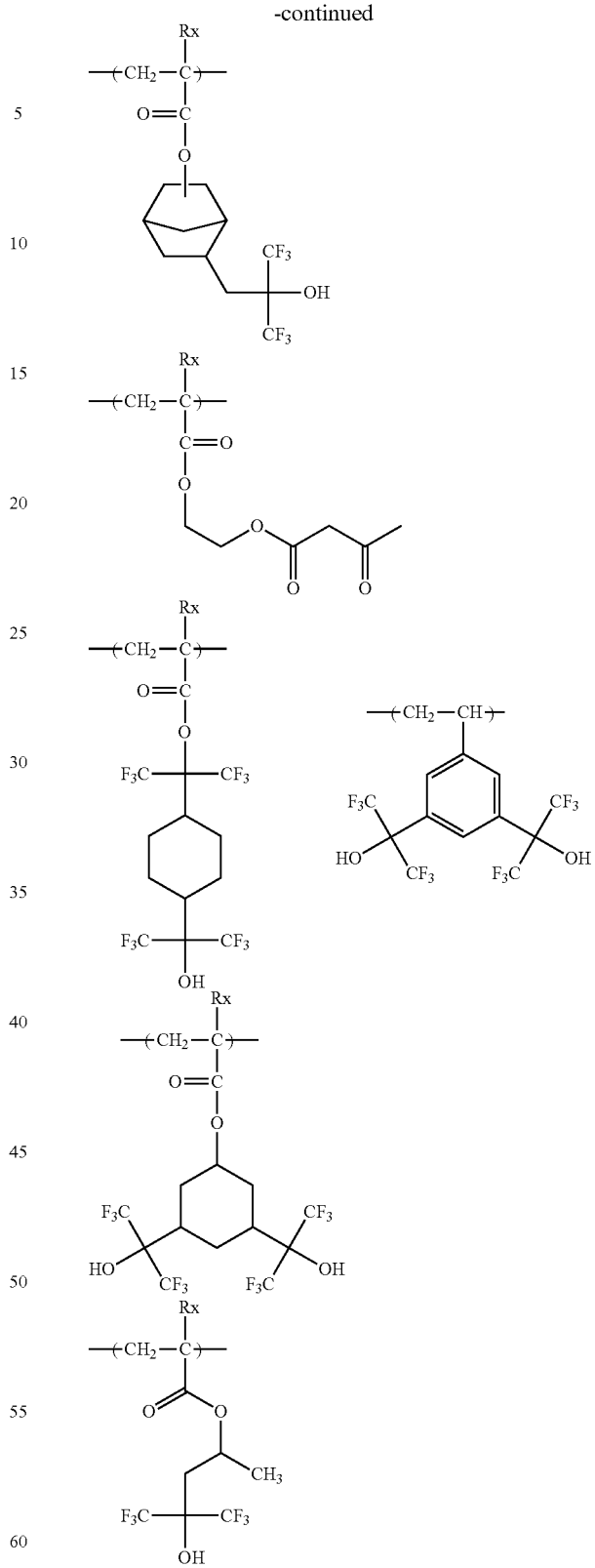
Examples of the (y) group capable of decomposing by the action of an alkali developer to increase the solubility in an alkali developer include a lactone structure-containing group, an acid anhydride group and an acid imide group, with a lactone structure-containing group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of resin, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing this group at the polymerization are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the polymer.

Specific examples of the repeating unit having (y) a group capable of increasing the solubility in an alkali developer are the same as those of the repeating unit having a lactone structure described for the resin as the component (B).

Examples of the repeating unit having (z) a group capable of decomposing by the action of an acid, contained in the resin (C) having at least either a fluorine atom or a silicon atom, are the same as those of the repeating unit having an acid-decomposable group described for the resin as the component (B). In the resin (C) having at least either a fluorine atom or a silicon atom, the content of the repeating unit having (z) a group capable of decomposing by the action of an acid is preferably from 1 to 80 mol %, more preferably from 10 to 80 mol %, still more preferably from 20 to 60 mol %, based on all repeating units in the polymer.

The resin (C) having at least either a fluorine atom or a silicon atom may further contain a repeating unit represented by the following formula (III):

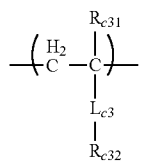

(III)

In formula (III), $R_{c31}$ represents a hydrogen atom, an alkyl group, an alkyl group which may be substituted by fluorine, a cyano group or —$CH_2$—O-$Rac_2$, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group or a cycloalkenyl group. Such a group may be substituted by a fluorine atom or a silicon atom.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$R_{c32}$ is preferably an unsubstituted alkyl group or an alkyl group substituted by a fluorine atom.

The divalent linking group of $L_{c3}$ is preferably an ester group, an alkylene group (preferably having a carbon number of 1 to 5), an oxy group, a phenylene group or an ester bond (a group represented by —COO—).

It is also preferred that the resin (C) having at least either a fluorine atom or a silicon atom further contains a repeating unit represented by the following formula (CII-AB).

(CII-AB)

In formula (CII-AB), each of $R_{c11}'$ and $R_{c12}'$ independently represents a hydrogen atom, a cyano group, a halogen atom or an alkyl group.

Zc' represents an atomic group for forming an alicyclic structure containing the two bonded carbon atoms (C—C).

Specific examples of the repeating units represented by formulae (VI) and (CII-AB) are set forth below, but the present invention is not limited thereto. In the formulae, Ra represents H, $CH_3$, $CH_2OH$, $CF_3$ or CN.

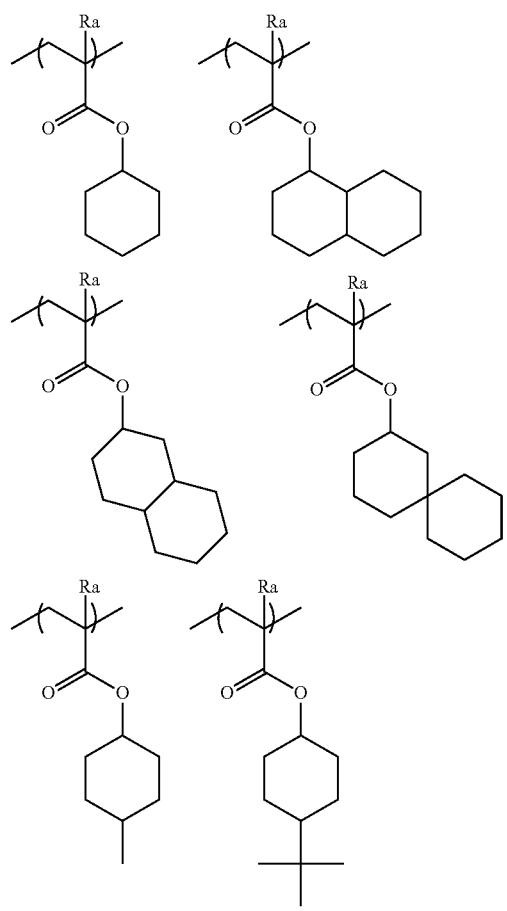

111
-continued
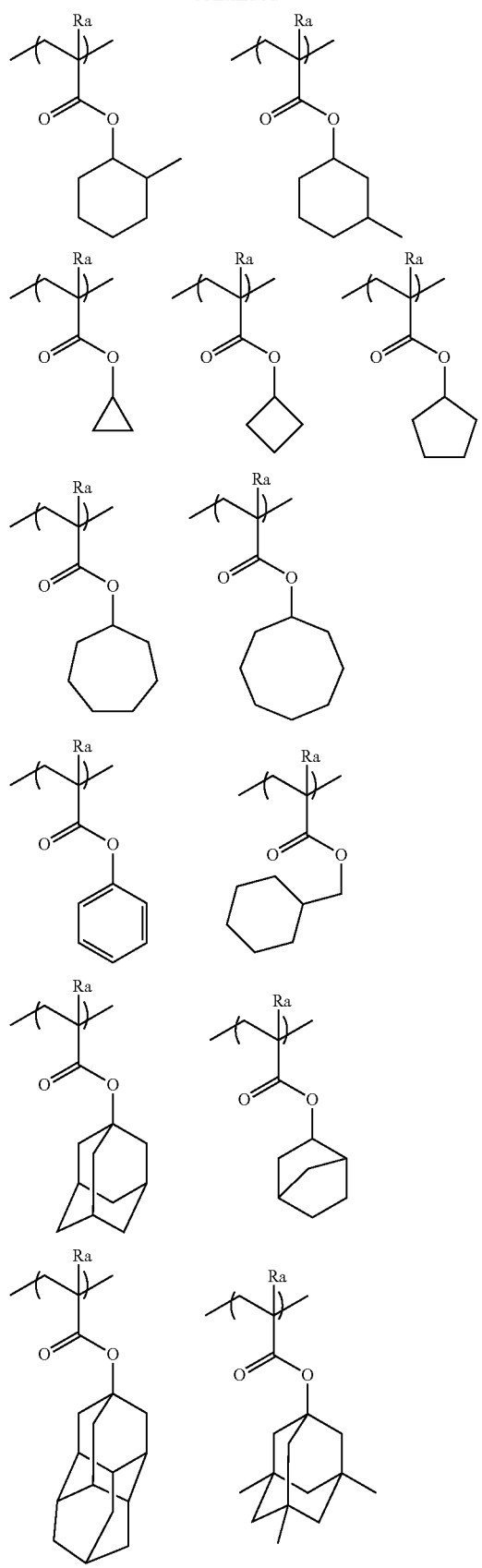
112
-continued
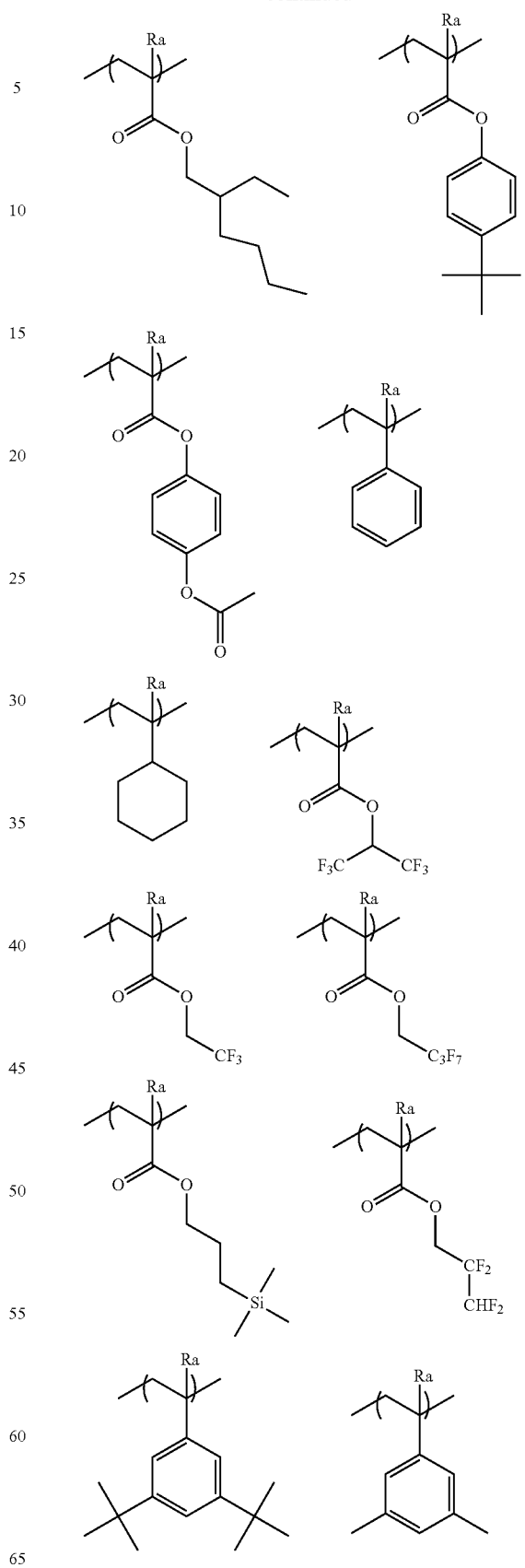

-continued

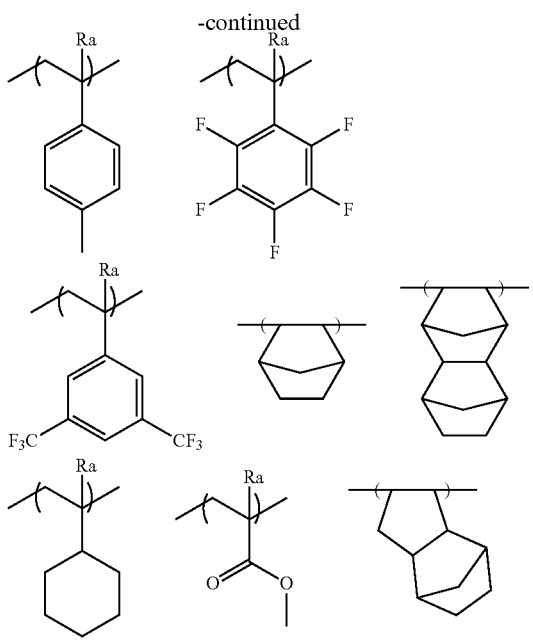

In the case where the resin (C) having at least either a fluorine atom or a silicon atom contains a fluorine atom, the fluorine atom content is preferably from 5 to 80 mass %, more preferably from 10 to 80 mass %, based on the molecular weight of the resin (C) having at least either a fluorine atom or a silicon atom. Also, the fluorine atom-containing repeating unit preferably occupies from 10 to 100 mass %, more preferably from 30 to 100 mass %, in the resin (C) having at least either a fluorine atom or a silicon atom.

In the case where the resin (C) having at least either a fluorine atom or a silicon atom contains a silicon atom, the silicon atom content is preferably from 2 to 50 mass %, more preferably from 2 to 30 mass %, based on the molecular weight of the resin (C) having at least either a fluorine atom or a silicon atom. Also, the silicon atom-containing repeating unit preferably occupies from 10 to 100 mass %, more preferably from 20 to 100 mass %, in the resin (C) having at least either a fluorine atom or a silicon atom.

The standard polystyrene-reduced weight average molecular of the resin (C) having at least either a fluorine atom or a silicon atom is preferably from 1,000 to 100,000, more preferably from 1,000 to 50,000, still more preferably from 2,000 to 15,000.

Similarly to the resin as the component (B), in the resin (C) having at least either a fluorine atom or a silicon atom, it is of course preferred that the amount of impurities such as metal is small, and also, the content of the residual monomers or oligomer components is preferably from 0 to 10 mass %, more preferably from 0 to 5 mass %, still more preferably from 0 to 1 mass %. By satisfying these conditions, a resist free of extraneous substances in the liquid or change with aging in the sensitivity and the like can be obtained. Furthermore, in view of resolution, resist profile, side wall of resist pattern, roughness and the like, the molecular weight distribution (Mw/Mn, also called polydispersity) is preferably from 1 to 5, more preferably from 1 to 3, still more preferably from 1 to 2.

As for the resin (C) having at least either a fluorine atom or a silicon atom, various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition for immersion exposure of the present invention. By the use of the same solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only those having a molecular weight not more than a specific value; a reprecipitation method of adding dropwise the resin solution in a poor solvent to solidify the resin in the poor solvent and thereby remove residual monomers and the like; and a purification method in a solid state, such as a method of subjecting a resin slurry separated by filtration to washing with a poor solvent. For example, the resin is precipitated as a solid by contacting the reaction solution with a solvent in which the resin is sparingly soluble or insoluble (poor solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

Specific examples of the resin (C) having at least either a fluorine atom or a silicon atom are set forth below. Also, the molar ratio of repeating units (corresponding to repeating units from the left), weight average molecular weight and polydispersity of each resin are shown in Table 1 below.

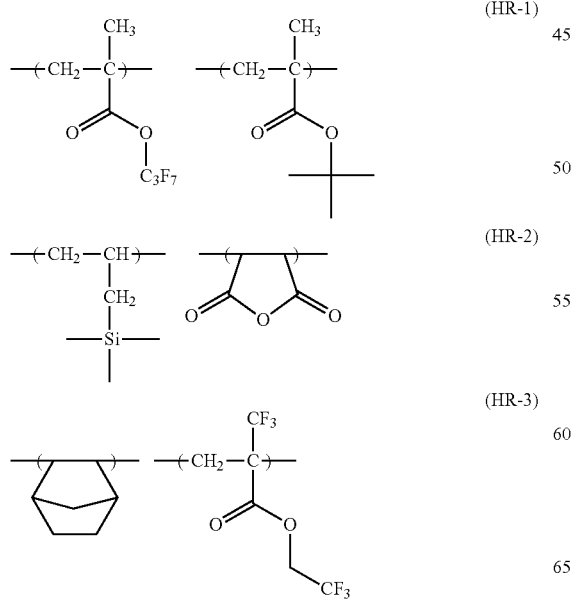

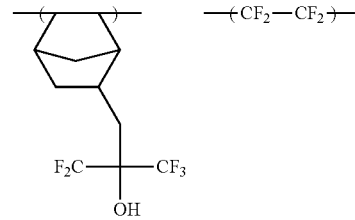

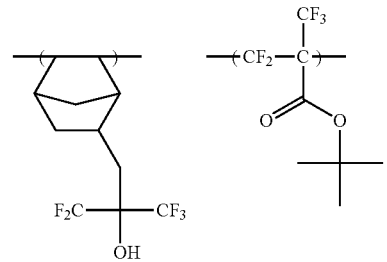

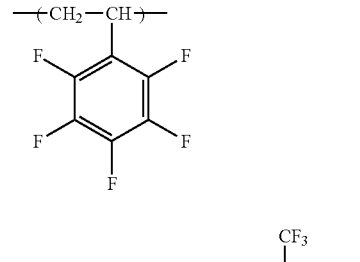

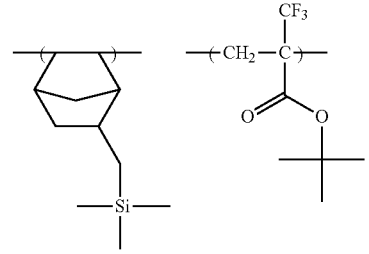

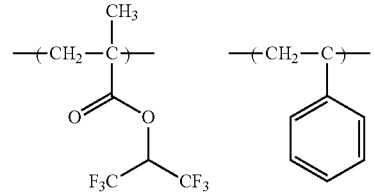

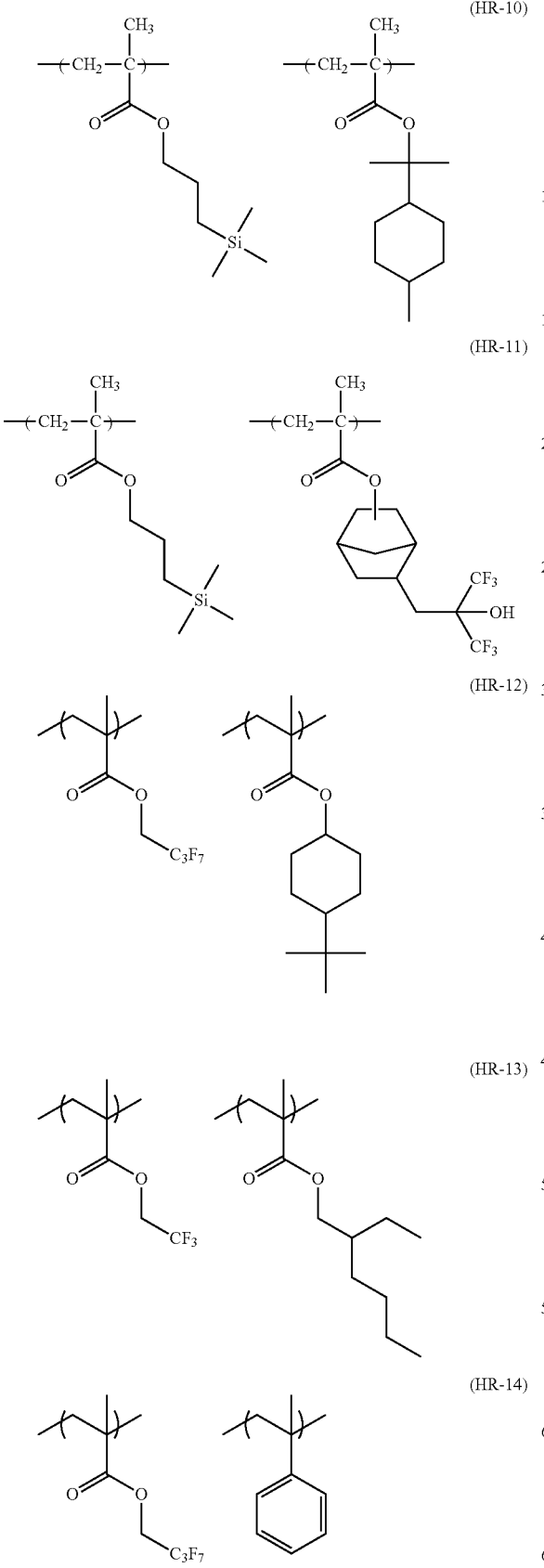

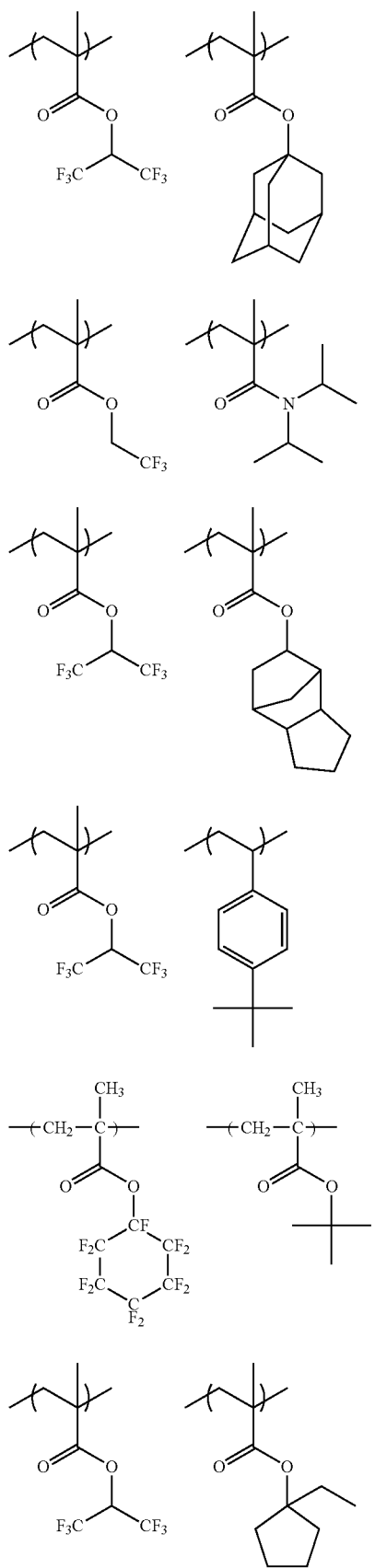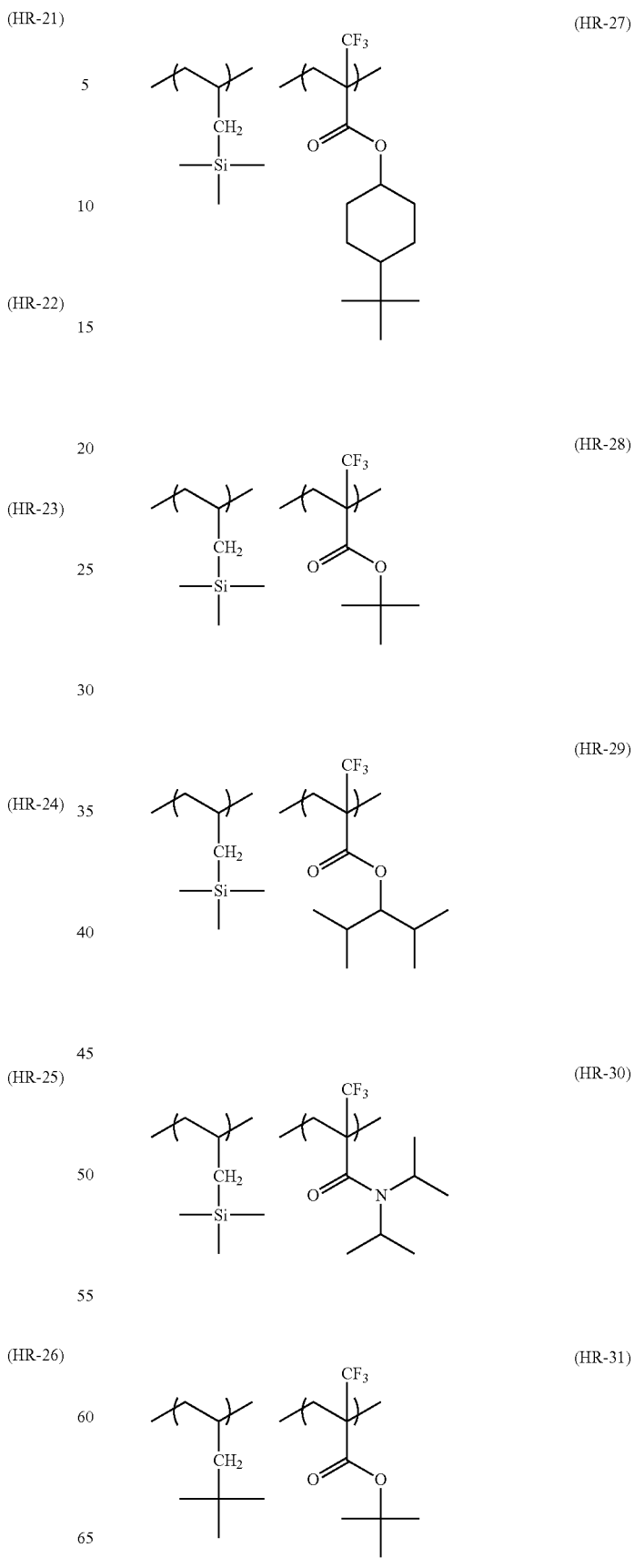

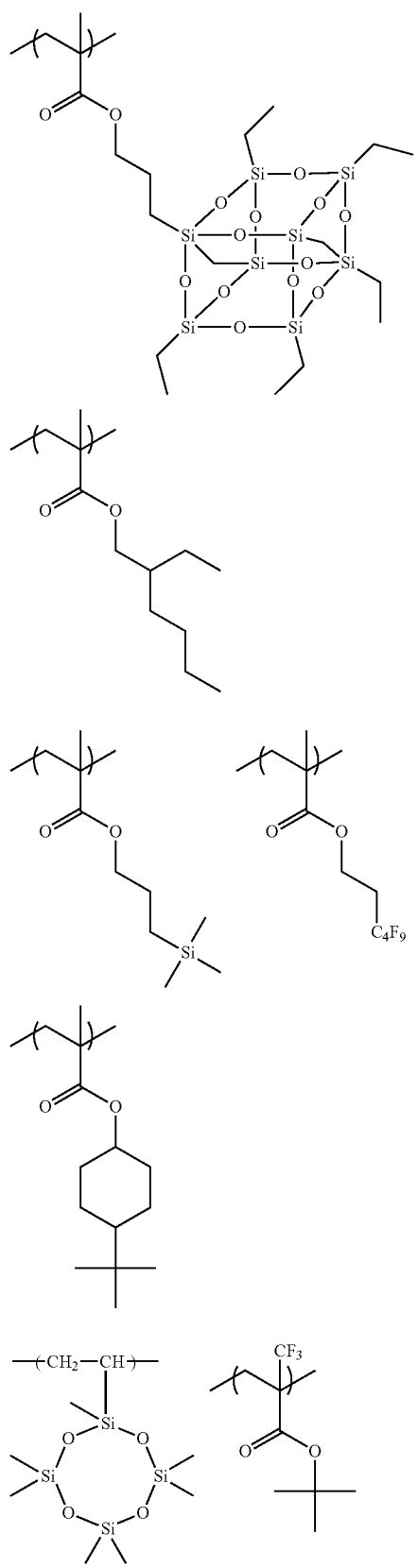
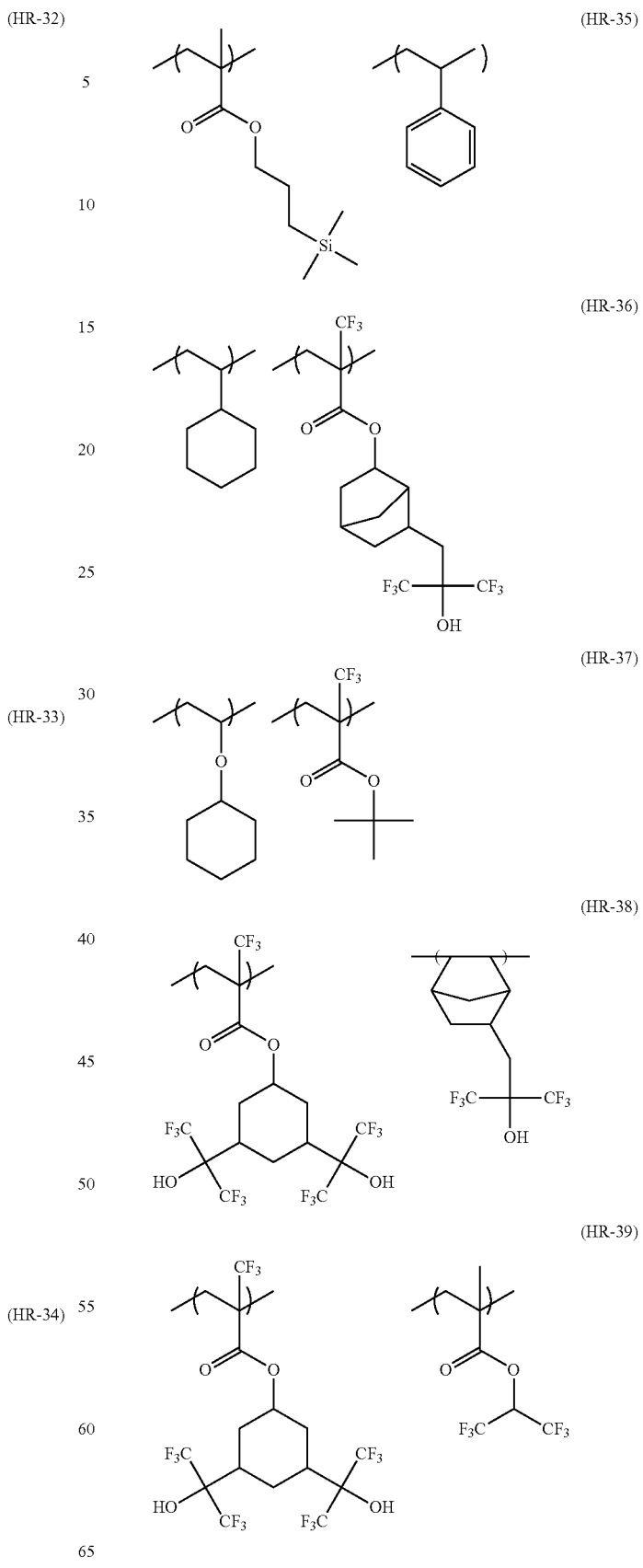

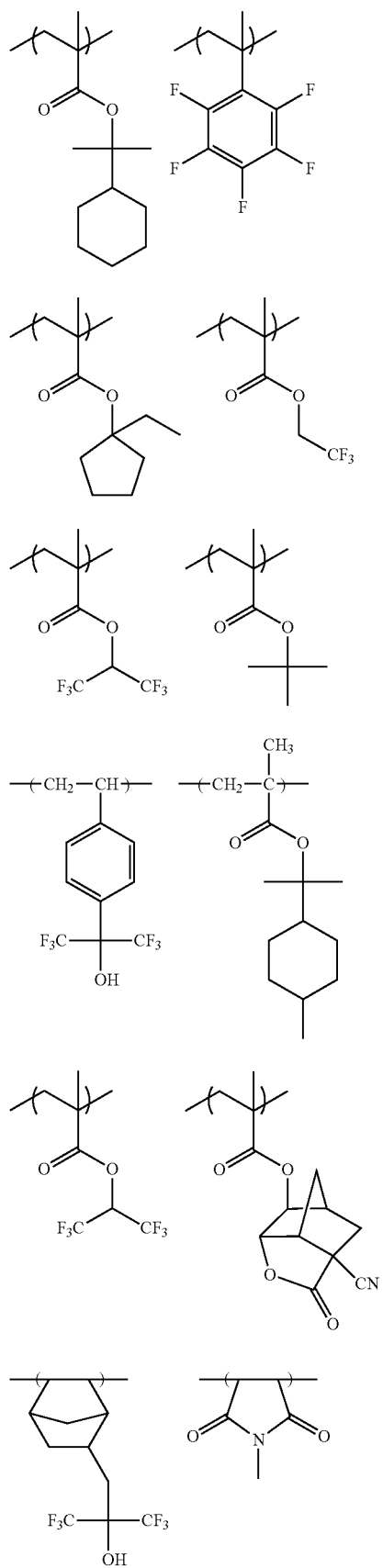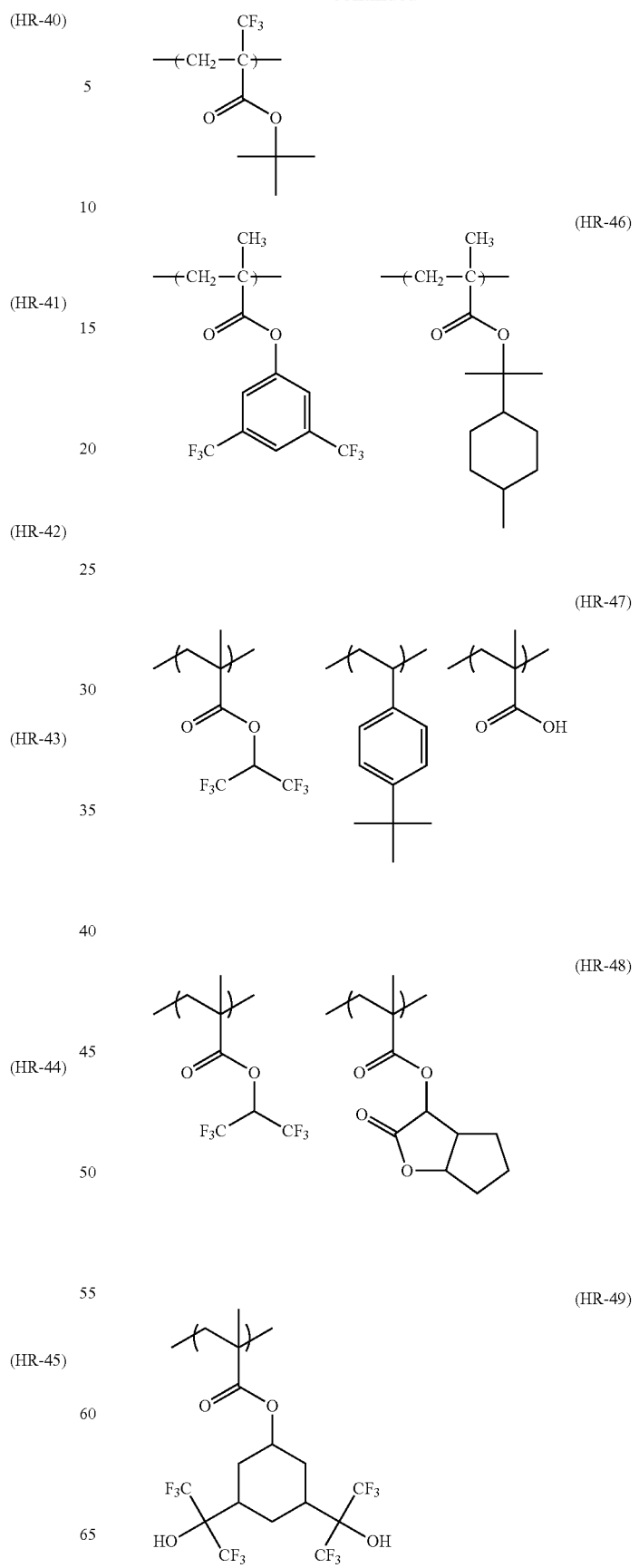

(HR-50)
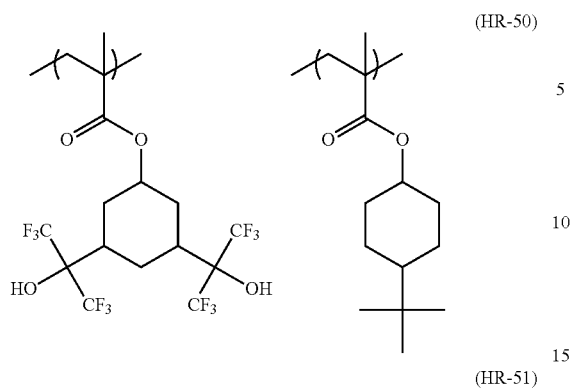
(HR-51)
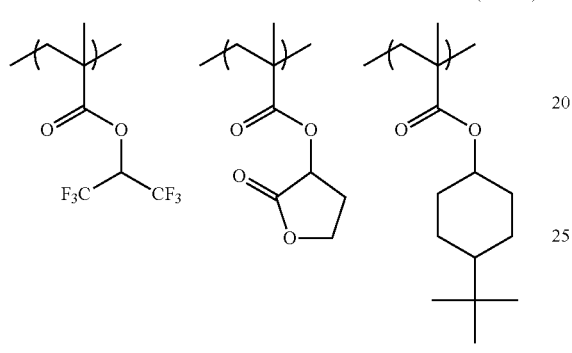
(HR-52)
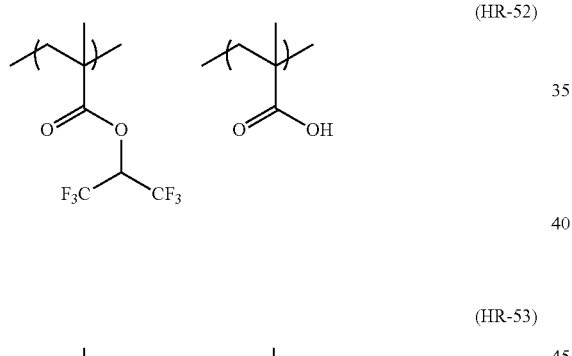
(HR-53)
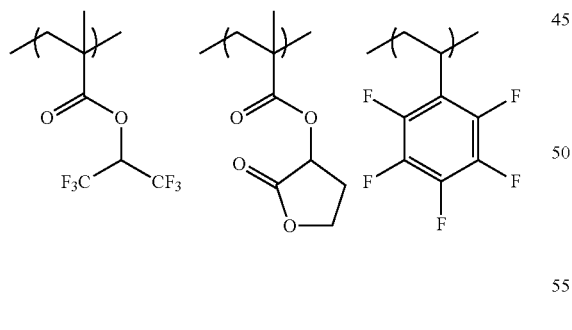
(HR-54)
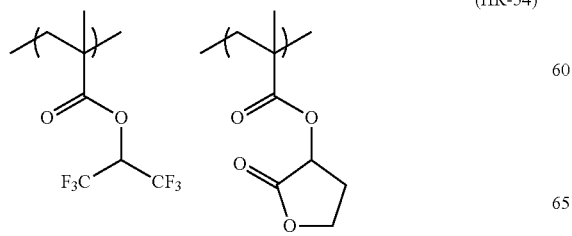
(HR-55)
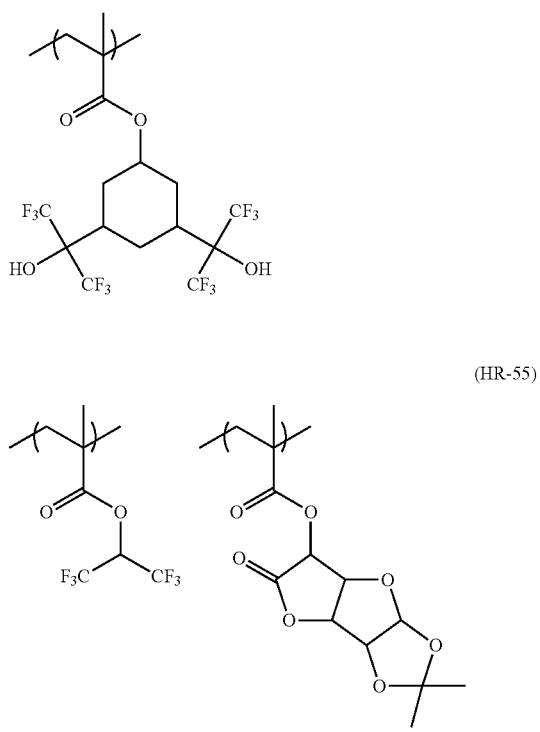
(HR-56)
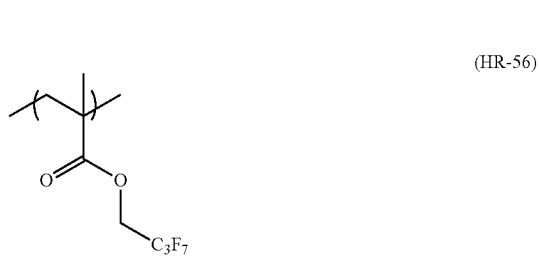
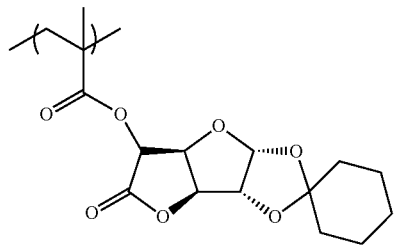

(HR-57)
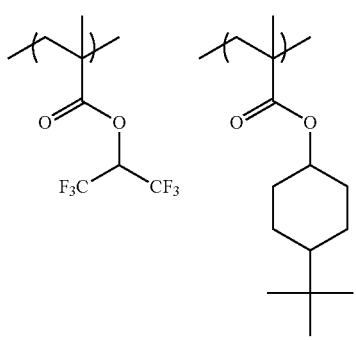
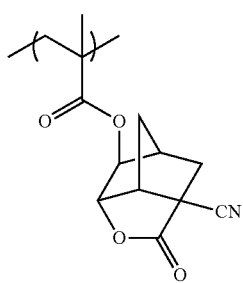
(HR-58)
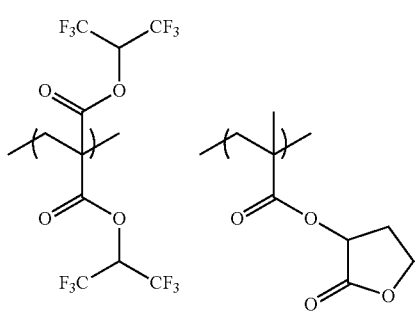
(HR-59)
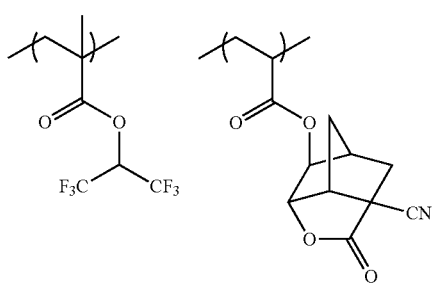
(HR-60)
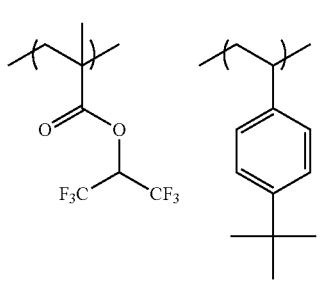
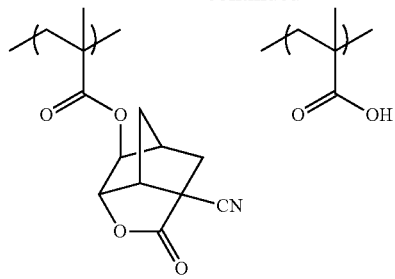
(HR-61)
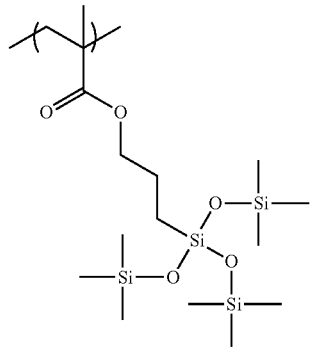
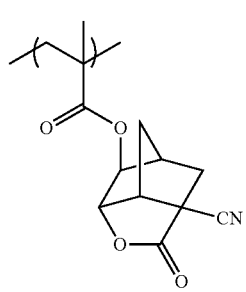
(HR-62)
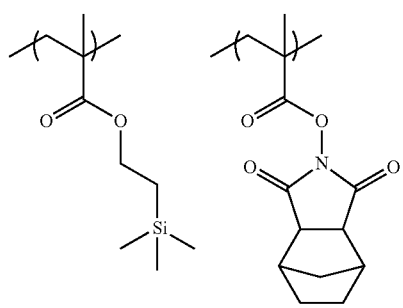
(HR-63)
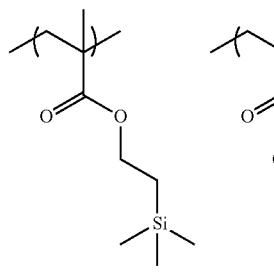

-continued

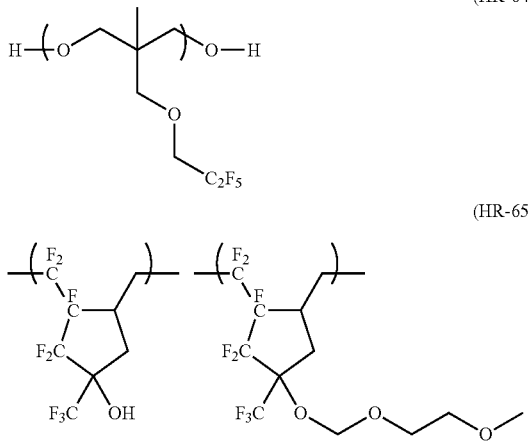

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

[4] (D) Solvent

The positive resist composition for immersion exposure of the present invention contains (D) a mixed solvent containing at least one kind of a solvent selected from the group consisting of solvents represented by any one of the following formulae (S1) to (S3). Thanks to this mixed solvent, the receding contact angle of the resist film with the immersion liquid can be made large.

In the mixed solvent (D), from the standpoint of preventing a development defect, the amount in total (total amount) of the solvent(s) represented by any one of formulae (S1) to (S3) is from 3 to 20 mass %, preferably from 3 to 10 mass %, based on all solvents.

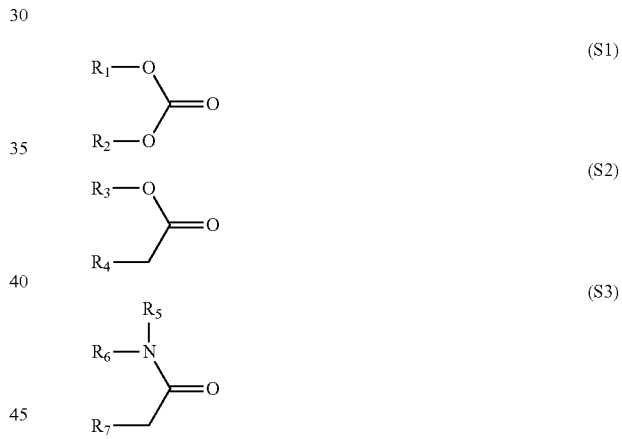

In formulae (S1) to (S3), each of $R_1$ to $R_7$ independently represents an alkyl group, a cycloalkyl group or an aryl group, and $R_1$ and $R_2$, $R_3$ and $R_4$, or $R_6$ and $R_7$ may combine with each other to form a ring.

In formulae (S1) to (S3), $R_1$ to $R_7$ are preferably an alkyl group, and it is more preferred that $R_1$ and $R_2$, $R_3$ and $R_4$, or $R_6$ and $R_7$ are combined together to form a ring.

The solvent represented by any one of formulae (S1) to (S3) is preferably a solvent having a boiling point (at 1 atm) of 150 to 250° C., more preferably from 180 to 250° C. Among the solvents represented by any one of formulae (S1) to (S3), the solvents represented by formula (S1) or (S2) are more preferred, and the solvents represented by formula (S1) are most preferred.

As the solvents represented by any one of formulae (S1) to (S3), for example, a solvent having a lactone structure, such as γ-butyrolactone, a solvent having an alkylene carbonate structure, such as ethylene carbonate, propylene carbonate and butylene carbonate, and N-methylpyrrolidone are preferred, a solvent having a lactone structure and a solvent having an alkylene carbonate structure are more preferred, γ-butyrolactone and propylene carbonate are still more preferred, and propylene carbonate is most preferred.

The solvent other than the solvents represented by any one of formulae (S1) to (S3), which can be contained in the solvent (D) for use in the present invention, is not particularly limited but includes, for example, a hydroxyl group-containing solvent and a hydroxyl group-free solvent described below.

Examples of the hydroxyl group-containing solvent include ethylene glycol, ethylene glycol monomethyl ether, ethylene glycol monoethyl ether, propylene glycol, propylene glycol monomethyl ether (PGME, also known as 1-methoxy-2-propanol), propylene glycol monoethyl ether and ethyl lactate. Among these, propylene glycol monomethyl ether and ethyl lactate are preferred.

Examples of the hydroxy group-free solvent include propylene glycol monomethyl ether acetate (PGMEA, also known as 1-methoxy-2-acetoxypropane), ethyl ethoxypropionate, 2-heptanone, cyclohexanone, butyl acetate, N,N-dimethylacetamide and dimethyl sulfoxide. Among these, propylene glycol monomethyl ether acetate, ethyl ethoxypropionate, 2-heptanone, cyclohexanone and butyl acetate are preferred, and propylene glycol monomethyl ether acetate, ethyl ethoxypropionate and 2-heptanone are most preferred.

A mixed solvent containing the hydroxy group-free solvent in a proportion of 50 mass % or more is particularly preferred in view of coating uniformity.

The solvent (D) preferably contains propylene glycol monomethyl ether acetate.

The solvent (D) is more preferably a mixed solvent containing a hydroxyl group-containing solvent, a hydroxyl group-free solvent and at least one solvent selected from the group consisting of solvents represented by any one of formulae (S1) to (S3), still more preferably a mixed solvent containing an alkylene glycol monoalkyl ether acetate, an alkylene glycol monoalkyl ether and at least one solvent selected from the group consisting of solvents represented by any one of formulae (S1) to (S3).

[5] Basic Compound:

The positive resist composition for immersion exposure of the present invention preferably contains a basic compound for reducing the change of performance with aging from exposure to heating.

Preferred examples of the basic compound include compounds having a structure represented by any one of the following formulae (A) to (E):

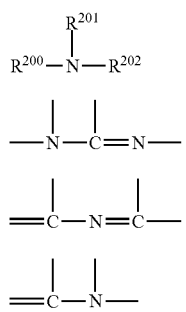

-continued

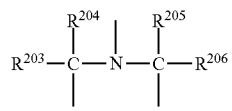

In formulae (A) and (E), each of $R^{200}$, $R_{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in these formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

One of these basic compounds may be used alone, or two or more kinds thereof may be used in combination.

The amount of the basic compound used is usually from 0.001 to 10 mass %, preferably from 0.01 to 5 mass %, based on the solid content of the resist composition.

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure to heat treatment. The acid generator/basic compound (by mol) is more preferably from 5.0 to 200, still more preferably from 7.0 to 150.

[6] Surfactant:

The positive resist composition for immersion exposure of the present invention may further contain a surfactant. As for the surfactant, the composition preferably contains any one of fluorine-containing and/or silicon-containing surfactants (a fluorine-containing surfactant, a silicon-containing surfactant and a surfactant containing both a fluorine atom and a silicon atom), or two or more kinds thereof.

The amount added of the surfactant is 10 ppm or less, and by setting as such, the resin (C) having at least either a fluorine atom or a silicon atom can be more unevenly distributed on the surface, whereby the resist film surface can be more hydrophobic and in turn, followability of water at the immersion exposure can be enhanced.

By incorporating the above-described surfactant into the positive resist composition for immersion exposure of the present invention, a resist pattern with good performance in terms of sensitivity, resolution and adherence as well as less development defect can be provided when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JPA-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and OF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of such surfactants may be used alone, or some of these may be used in combination.

The amount of the surfactant used is preferably from 0 to 2 mass %, more preferably from 0.001 to 1 mass %, based on the entire amount of the resist composition (excluding the solvent).

[7] Onium Carboxylate:

The positive resist composition for immersion exposure of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably the carboxylate anion above with the alkyl group being partially or entirely fluorine-substituted. The alkyl chain may contain an oxygen atom. Thanks to such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

[8] Dissolution Inhibiting Compound Capable of Decomposing by the Action of an Acid to Increase the Solubility in an Alkali Developer and Having a Molecular Weight of 3,000 or Less The positive resist composition for immersion exposure of the present invention may contain a dissolution inhibiting compound capable of decomposing by the action of an acid to increase the solubility in an alkali developer and having a molecular weight of 3,000 or less (hereinafter, sometimes referred to as a "dissolution inhibiting compound"). As the dissolution inhibiting compound, an alicyclic or aliphatic compound containing an acid-decomposable group, such as acid-decomposable group-containing cholic acid derivative described in Proceeding of SPIE, 2724, 355 (1996), so as not to reduce the transparency to light at 220 nm or less is preferred. Examples of the acid-decomposable group and alicyclic structure are the same as those described above with respect to the resin as the component (B).

In the case where the positive resist composition for immersion exposure of the present invention is exposed by a KrF excimer laser or irradiated with an electron beam, the composition preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the resist composition.

Specific examples of the dissolution inhibiting compound are set forth below, but the present invention is not limited thereto.

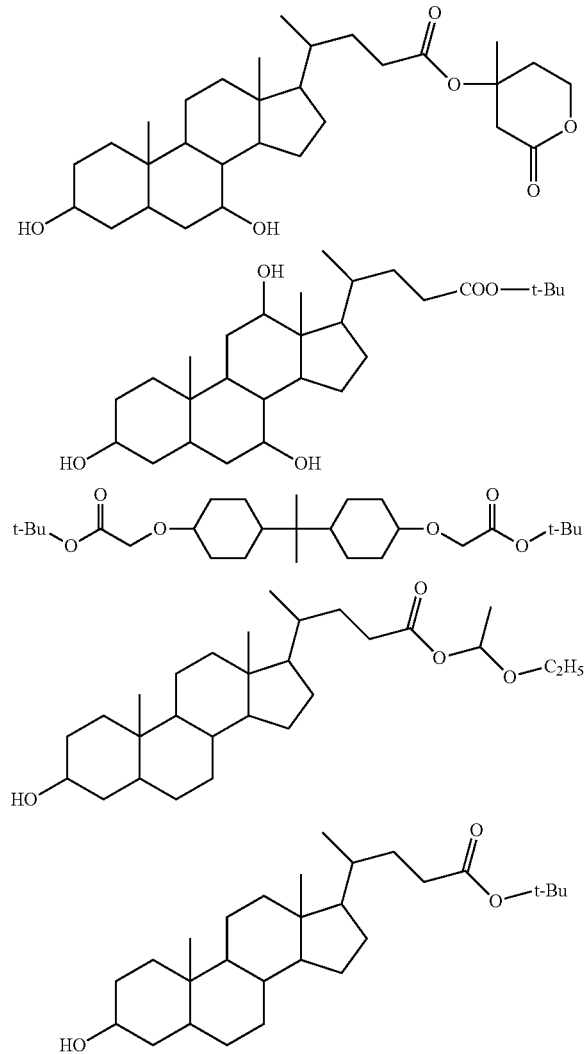

-continued

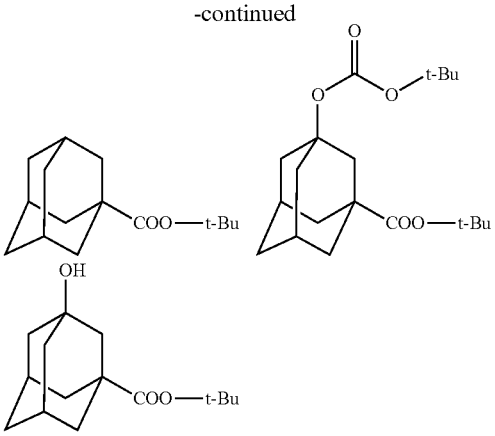

Other Additives:

The positive resist composition for immersion exposure of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method:

The positive resist composition for immersion exposure of the present invention is preferably used in a film thickness of 30 to 250 nm, more preferably from 30 to 200 nm, from the standpoint of enhancing the resolution. Such a film thickness can be attained by setting the solid content concentration in the positive resist composition to an appropriate range, thereby imparting an appropriate viscosity and enhancing the coatability and film-forming property.

The entire solid content concentration in the positive resist composition is generally from 1 to 10 mass %, preferably from 1 to 8.0 mass %, more preferably from 1.0 to 6.0 mass %.

The positive resist composition for immersion exposure of the present invention is used by dissolving the components above in a predetermined organic solvent, preferably in the above-described mixed solvent, filtering the solution, and coating it on a predetermined support as follows. The filter used for filtering is preferably a polytetrafluoroethylene-, polyethylene- or nylon-made filter having a pore size of 0.1 µm or less, more preferably 0.05 µm or less, still more preferably 0.03 µm or less.

For example, the resist composition is coated on such a substrate (e.g., silicon/silicon dioxide-coated substrate) as used in the production of a precision integrated circuit device, by an appropriate coating method such as spinner or coater and dried to form a resist film.

The resist film is irradiated with an actinic ray or radiation through a predetermined mask, preferably baked (heated) and then subjected to development and rinsing, whereby a good pattern can be obtained.

Examples of the actinic ray or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam, with ArF excimer laser light, $F_2$ excimer laser light, EUV (13 nm) and electron beam being preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type comprising a light absorber and a polymer material. Also, the organic antireflection film may be a commercially available organic antireflection film such as DUV30 Series and DUV-40 Series produced by Brewer Science, Inc., and AR-2, AR-3 and AR-5 produced by Shipley Co., Ltd.

In the development step, an alkali developer is used as follows. The alkali developer which can be used to the positive resist composition for immersion exposure is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as di ethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, a treatment of removing the developer or rinsing solution adhering on the pattern by a supercritical fluid may be performed.

In the exposure process after forming a film by using the resist composition, exposure (immersion exposure) may be performed by filling a liquid (immersion medium) having a refractive index higher than that of air between the resist film and a lens at the irradiation with an actinic ray or radiation. By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the under-surface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by raising the refractive index of the immersion liquid. From such a standpoint, an additive for raising the refractive index may be added to water, or deuterium water ($D_2O$) may be used in place of water.

In order to prevent the resist film from directly contacting with the immersion liquid, an immersion liquid sparingly soluble film (hereinafter, sometimes referred to as a "topcoat") may be provided between the immersion liquid and the resist film formed from the positive resist composition for immersion exposure of the present invention. The functions required of the topcoat are suitability for coating on the resist upper layer part, transparency to radiation particularly at 193 nm, and difficult solubility in the immersion liquid. It is preferred that the topcoat does not intermix with the resist and can be uniformly coated on the resist upper layer.

In view of transparency to light at 193 nm, the topcoat is preferably an aromatic-free polymer, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The resin (C) having at least either a fluorine atom or a silicon atom may also be suitable as the topcoat. If impurities dissolve out into the immersion liquid from the topcoat, the optical lens is contaminated. For this reason, the residual monomer components of the polymer are preferably less contained in the topcoat.

On peeling off the topcoat, a developer may be used or a releasing agent may be separately used. The releasing agent is preferably a solvent less permeating the resist film. From the standpoint that the peeling step can be performed simultaneously with the resist development step, the topcoat is preferably peelable with an alkali developer and for the peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced.

In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably free of intermixing with the resist film and further with the immersion liquid. From this standpoint, when the immersion liquid is water, the topcoat solvent is preferably a medium which is sparingly soluble in the resist solvent and is water-insoluble. On the other hand, when the immersion liquid is an organic solvent, the topcoat may be either water-soluble or water-insoluble.

EXAMPLES

The present invention is described in greater detail below by referring to Examples, but the present invention should not be construed as being limited thereto.

Synthesis Example 1

Synthesis of Resin (1)

In a nitrogen stream, 8.6 g of cyclohexanone was charged into a three-neck flask and heated at 80° C. Thereto, a solution obtained by dissolving 8.0 g of norbornane lactone methacrylate, 4.0 g of dihydroxyadamantyl methacrylate, 9.0 g of 2-adamantyl-isopropyl methacrylate and a polymerization initiator V-601 (produced by Wako Pure Chemical Industries, Ltd.) in a concentration of 8 mol % based on the monomers, in 70 g of cyclohexanone was added dropwise over 6 hours. After the completion of dropwise addition, the reaction was further allowed to proceed at 80° C. for 2 hours. The resulting reaction solution was left standing to cool and then, added dropwise to a mixed solution of 800 ml of hexane/200 ml of ethyl acetate over 20 minutes, and the powder precipitated was collected by filtration and dried, as a result, 17 g of Resin (1) was obtained. The weight average molecular weight of the obtained Resin was 8,500 in terms of standard polystyrene and the polydispersity (Mw/Mn) was 1.8.

Acid-Decomposable Resins (2) to (20) were synthesized in the same manner as in Synthesis Example 1.

Structures of Acid-Decomposable Resins (1) to (20) and the molar ratio of repeating units (from the left in the structural formula), weight average molecular weight and polydispersity in each resin are shown in Table 2 below.

TABLE 2

| No. | Monomer (1) | Monomer (2) | Monomer (3) | Monomer (4) | Compositional Ratio (by mol) | Mw | Mw/Mn |
|---|---|---|---|---|---|---|---|
| 1 | | | | — | 50/20/30 | 8500 | 1.8 |
| 2 | | | | — | 40/30/30 | 9000 | 1.7 |
| 3 | | | | | 40/10/40/10 | 9200 | 1.7 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 4 | | | | — | 50/20/30 | 10100 | 1.7 |
| 5 | | | | — | 40/10/50 | 8700 | 1.8 |
| 6 | | | | | 40/20/30/10 | 8800 | 1.8 |
| 7 | | | | | 40/10/30/20 | 10500 | 1.9 |
| 8 | | | | | 40/20/30/10 | 9600 | 1.8 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 9 | (structure) | (structure) | (structure) | — | 50/10/40 | 9300 | 1.9 |
| 10 | (structure) | (structure) | (structure) | — | 50/20/30 | 9100 | 2.0 |
| 11 | (structure) | (structure) | (structure) | (structure) | 40/10/30/20 | 8000 | 1.8 |
| 12 | (structure) | (structure) | (structure) | (structure) | 40/15/40/5 | 8300 | 2.0 |
| 13 | (structure) | (structure) | (structure) | (structure) | 30/20/40/10 | 8400 | 1.8 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 14 | (structure) | (structure) | (structure) | — | 40/20/40 | 8100 | 1.8 |
| 15 | (structure) | (structure) | (structure) | (structure) | 40/10/25/25 | 6800 | 2.0 |
| 16 | (structure) | (structure) | (structure) | (structure) | 40/10/25/25 | 8100 | 1.8 |
| 17 | (structure) | (structure) | (structure) | — | 40/30/30 | 7800 | 2.0 |
| 18 | (structure) | (structure) | (structure) | — | 40/30/30 | 9000 | 1.7 |

TABLE 2-continued

| No. | Monomer (1) | Monomer (2) | Monomer (3) | Monomer (4) | Compositional Ratio (by mol) | Mw | Mw/Mn |
|---|---|---|---|---|---|---|---|
| 19 | | | | | 40/10/20/30 | 9100 | 2.0 |
| 20 | | | | — | 40/20/40 | 9600 | 1.7 |

Synthesis Example 2

Synthesis of Resin (HR-17)

Hexafluoroisopropyl acrylate (produced by Wako Pure Chemical Industries, Ltd.) (43 g) was dissolved in propylene glycol monomethyl ether acetate to prepare 150 g of a solution having a solid content concentration of 20 mass %. To this solution, 8 mmol % (3.68 g) of a polymerization initiator, V-601, produced by Wako Pure Chemical Industries, Ltd. was added. The resulting solution was added dropwise to 20.0 g of propylene glycol monomethyl ether acetate heated to 80° C., over 4 hours in a nitrogen atmosphere. After the completion of dropwise addition, the reaction solution was stirred for 2 hours to obtain Reaction Solution (1). After the completion of reaction, Reaction Solution (1) was cooled to room temperature and added dropwise to a 20-fold amount of a methanol/water=8/1 mixed solvent. The oily compound separated was recovered by decantation to obtain 22 g of the objective Resin (HR-17).

The weight average molecular weight in terms of standard polystyrene determined by GPC was 4,400, and the polydispersity was 1.3.

Each resin shown in Resin (C) of Table 3 was synthesized in the same manner as in Synthesis Example 2.

Examples and Comparative Examples

<Preparation of Resist>

The components shown in Tables below were dissolved in a solvent to prepare a solution having a solid content concentration of 4 mass %, and the obtained solution was filtered through a polyethylene filter having a pore size of 0.05 μm to prepare a positive resist solution for immersion exposure. The resist compositions prepared were evaluated by the following methods, and the results are shown in the same Tables. As for each component in the Tables, when a plurality of species were used, the ratio is a ratio by mass.

The amount added of the resin (C) is mass % based on the entire solid content of the resist composition.

[Image Performance Test]
[Exposure Condition]

This condition is to form a resist pattern by an immersion exposure method using pure water.

An organic antireflection film, ARC29A (produced by Nissan Chemical Industries, Ltd.), was coated on a silicon wafer and baked at 205° C. for 60 seconds to form an antireflection film of 78 nm in thickness, and the positive resist composition for immersion exposure prepared above was coated thereon and baked at 100° C. for 60 seconds to form a resist film of 100 nm in thickness. The obtained wafer was subjected to pattern exposure using an ArF excimer laser immersion scanner (NA: 1.20). The immersion liquid used was ultrapure water. Thereafter, the resist film was heated at 100° C. for 60 seconds, developed with an aqueous tetramethylammonium hydroxide solution (2.38 mass %) for 30 seconds, rinsed with pure water and spin-dried to obtain a resist pattern.

[Watermark Defect (WM Defect)]

The exposure dose for reproducing a 1:1 line-and-space mask pattern with a line width of 65 nm was taken as an optimal exposure dose, and the wafer after pattern formation at an optimal exposure dose was evaluated by a defect inspection apparatus 2360 (manufactured by KLA Tencol K.K. Development defects detected were observed by S9380II (manufactured by Hitachi, Ltd.), and the number of WM defects in all development defects was evaluated.

The sample was rated A when the number of WM defects per wafer (one sheet of a 12-inch wafer) is from 0 to 10, rated B when from 11 to 20, and rated C when more than 20. A smaller number of WM defects indicates higher suitability for immersion exposure.

[Evaluation of Receding Contact Angle]

The positive resist composition of immersion exposure prepared above was spin-coated on a silicon wafer and baked on a hot plate to form a 100-nm resist film. The receding contact angle(°) of a water droplet was measured using a dynamic contact angle meter (manufactured by Kyowa Interface Science Co., Ltd.) by an expansion-contraction method. A droplet having an initial droplet size of 35 μL was suctioned at a rate of 6 μL/sec for 5 seconds at a room temperature of 23±3° C. and a humidity of 45±5%, and a value when the dynamic contact angle during suction was stabilized was taken as the receding contact angle.

TABLE 3

|  | Resin (A) (2 g) | Acid Generator (mg) | Resin (C) (mass %) | Solvent (ratio by mass) | Basic Compound (mg) | Surfactant (mg) | Receding Contact Angle (°) | WM Defect |
| --- | --- | --- | --- | --- | --- | --- | --- | --- |
| Example 1 | 1 | z2 (80) | HR-17 (0.3) | SL-1/SL-6 (95/5) | N-1 (7) | W-1 (3) | 74 | A |
| Example 2 | 2 | z80 (70) | HR-39 (2.0) | SL-1/SL-2/SL-6 (60/37/3) | N-2 (11) | W-2 (3) | 75 | A |
| Example 3 | 3 | z79 (60) | HR-26 (0.7) | SL-1/SL-3/SL-6 (70/22/8) | N-3 (6) | W-3 (3) | 73 | A |
| Example 4 | 4 | z68 (110) | HR-28 (0.3) | SL-1/SL-4/SL-6 (55/40/5) | N-1 (7) | W-3 (3) | 75 | A |
| Example 5 | 5 | z66 (100) | HR-47 (0.4) | SL-4/SL-6 (90/10) | N-1 (7) | W-3 (3) | 75 | A |
| Example 6 | 1 | z2 (80) | HR-17 (0.3) | SL-1/SL-7 (95/5) | N-1 (9) | W-3 (3) | 76 | A |
| Example 7 | 2 | z80 (70) | HR-39 (2.0) | SL-1/SL-2/SL-7 (60/37/3) | N-1 (7) | W-3 (3) | 77 | A |
| Example 8 | 3 | z79 (60) | HR-26 (0.7) | SL-1/SL-3/SL-7 (70/22/8) | N-1 (6) | W-3 (3) | 76 | A |
| Example 9 | 4 | z68 (110) | HR-28 (0.3) | SL-1/SL-4/SL-7 (55/40/5) | N-1 (7) | W-3 (3) | 77 | A |
| Example 10 | 5 | z66 (100) | HR-47 (0.4) | SL-4/SL-7 (90/10) | N-1 (8) | W-3 (3) | 77 | A |
| Example 11 | 1 | z2 (80) | HR-17 (0.3) | SL-1/SL-8 (95/5) | N-1 (7) | W-3 (3) | 71 | A |
| Example 12 | 2 | z80 (70) | HR-39 (2.0) | SL-1/SL-2/SL-8 (60/37/3) | N-1 (7) | W-3 (3) | 72 | A |
| Example 13 | 3 | z79 (60) | HR-26 (0.7) | SL-1/SL-3/SL-8 (70/22/8) | N-1 (7) | W-3 (3) | 70 | A |
| Example 14 | 4 | z68 (110) | HR-28 (0.3) | SL-1/SL-4/SL-8 (55/40/5) | N-1 (7) | W-3 (3) | 71 | A |
| Example 15 | 5 | z66 (100) | HR-47 (0.4) | SL-4/SL-8 (90/10) | N-1 (7) | W-3 (3) | 72 | A |
| Example 16 | 6 | z2 (80) | HR-50 (2.0) | SL-1/SL-2/SL-7 (60/35/5) | N-1 (7) | W-1 (3) | 73 | A |
| Example 17 | 7 | z80 (70) | HR-42 (0.5) | SL-1/SL-2/SL-7 (60/37/3) | N-2 (11) | W-2 (3) | 76 | A |
| Example 18 | 8 | z79 (60) | HR-29 (0.3) | SL-1/SL-2/SL-7 (60/37/3) | N-3 (6) | W-3 (3) | 75 | A |
| Example 19 | 9 | z68 (110) | HR-24 (0.4) | SL-1/SL-2/SL-7 (60/37/3) | N-1 (7) | W-3 (3) | 75 | A |
| Example 20 | 10 | z66 (100) | HR-26 (0.7) | SL-1/SL-2/SL-7 (60/37/3) | N-1 (7) | W-3 (3) | 77 | A |
| Example 21 | 11 | z60 (80) | HR-39 (2.0) | SL-1/SL-2/SL-7 (60/37/3) | N-1 (9) | W-3 (3) | 76 | A |
| Example 22 | 12 | z2 (80) | HR-47 (0.4) | SL-1/SL-2/SL-7 (60/37/3) | N-1 (7) | W-3 (3) | 72 | A |
| Example 23 | 13 | z2 (80) | HR-47 (0.4) | SL-1/SL-2/SL-7 (60/37/3) | N-1 (6) | W-3 (3) | 74 | A |
| Example 24 | 14 | z80 (70) | HR-26 (0.7) | SL-1/SL-2/SL-7 (60/37/3) | N-1 (7) | W-3 (3) | 75 | A |
| Example 25 | 15 | z79 (60) | HR-47 (0.4) | SL-1/SL-2/SL-7 (60/37/3) | N-1 (8) | W-3 (3) | 77 | A |
| Example 26 | 16 | z68 (110) | HR-17 (0.3) | SL-1/SL-2/SL-7 (60/37/3) | N-1 (7) | W-3 (3) | 75 | A |
| Example 27 | 17 | z66 (100) | HR-39 (2.0) | SL-1/SL-2/SL-7 (60/37/3) | N-1 (7) | W-3 (3) | 73 | A |
| Example 28 | 18 | z60 (80) | HR-26 (0.7) | SL-1/SL-2/SL-7 (60/37/3) | N-1 (7) | W-3 (3) | 73 | A |
| Example 29 | 19 | z2 (80) | HR-28 (0.3) | SL-1/SL-2/SL-7 (60/37/3) | N-1 (7) | W-3 (3) | 74 | A |
| Example 30 | 20 | z2 (80) | HR-47 (0.4) | SL-1/SL-2/SL-7 (60/37/3) | N-1 (7) | W-3 (3) | 76 | A |
| Example 31 | 6 | z2 (80) | HR-50 (2.0) | SL-1/SL-2/SL-6 (60/37/3) | N-1 (7) | W-3 (3) | 71 | A |
| Example 32 | 7 | z2 (80) | HR-42 (0.5) | SL-1/SL-2/SL-6 (60/37/3) | N-1 (7) | W-3 (3) | 74 | A |
| Example 33 | 8 | z2 (80) | HR-29 (0.3) | SL-1/SL-2/SL-6 (60/37/3) | N-1 (7) | W-3 (3) | 74 | A |
| Example 34 | 9 | z2 (80) | HR-24 (0.4) | SL-1/SL-2/SL-6 (60/37/3) | N-1 (7) | W-3 (3) | 73 | A |
| Example 35 | 10 | z2 (80) | HR-26 (0.7) | SL-1/SL-2/SL-6 (60/37/3) | N-1 (7) | W-3 (3) | 75 | A |
| Example 36 | 11 | z2 (80) | HR-39 (2.0) | SL-1/SL-2/SL-6 (60/37/3) | N-1 (7) | W-3 (3) | 74 | A |

TABLE 3-continued

| | Resin (A) (2 g) | Acid Generator (mg) | Resin (C) (mass %) | Solvent (ratio by mass) | Basic Compound (mg) | Surfactant (mg) | Receding Contact Angle (°) | WM Defect |
|---|---|---|---|---|---|---|---|---|
| Example 37 | 12 | z2 (80) | HR-47 (0.4) | SL-1/SL-2/SL-6 (60/37/3) | N-1 (7) | W-3 (3) | 70 | A |
| Example 38 | 13 | z2 (80) | HR-47 (0.4) | SL-1/SL-2/SL-6 (60/37/3) | N-1 (7) | W-3 (3) | 72 | A |
| Example 39 | 14 | z2 (80) | HR-26 (0.7) | SL-1/SL-2/SL-6 (60/37/3) | N-1 (7) | W-3 (3) | 72 | A |
| Example 40 | 15 | z2 (80) | HR-47 (0.4) | SL-1/SL-2/SL-6 (60/37/3) | N-1 (7) | W-3 (3) | 74 | A |
| Example 41 | 16 | z2 (80) | HR-17 (0.3) | SL-1/SL-2/SL-6 (60/37/3) | N-1 (7) | W-3 (3) | 74 | A |
| Example 42 | 17 | z2 (80) | HR-39 (2.0) | SL-1/SL-2/SL-6 (60/37/3) | N-1 (7) | W-3 (3) | 72 | A |
| Example 43 | 18 | z2 (80) | HR-26 (0.7) | SL-1/SL-2/SL-6 (60/37/3) | N-1 (7) | W-3 (3) | 71 | A |
| Example 44 | 19 | z2 (80) | HR-28 (0.3) | SL-1/SL-2/SL-6 (60/37/3) | N-1 (7) | W-3 (3) | 73 | A |
| Example 45 | 20 | z2 (80) | HR-47 (0.4) | SL-1/SL-2/SL-6 (60/37/3) | N-1 (7) | W-3 (3) | 74 | A |
| Example 46 | 1 | z2 (80) | HR-17 (0.3) | SL-1/SL-2/SL-6 (97/1/2) | N-1 (7) | W-1 (3) | 74 | A |
| Example 47 | 5 | z66 (100) | HR-47 (0.4) | SL-4/SL-6 (85/15) | N-1 (7) | W-3 (3) | 71 | A |
| Example 48 | 5 | z66 (100) | HR-47 (0.4) | SL-4/SL-7 (85/15) | N-1 (8) | W-3 (3) | 72 | A |

| | Resin (A) (g) | Acid Generator (mg) | Resin (C) (mass %) | Solvent (ratio by mass) | Basic Compound (mg) | Surfactant (mg) | Receding Contact Angle (°) | WM Defect |
|---|---|---|---|---|---|---|---|---|
| Example 49 | 3/4 (1/1) | z80 (70) | HR-39 (2.0) | SL-1/SL-2/SL-7 (60/37/3) | N-1 (7) | W-3 (3) | 76 | A |
| Example 50 | 1/7 (1/1) | z68 (110) | HR-28 (0.3) | SL-1/SL-4/SL-6 (55/40/5) | N-1 (7) | W-3 (3) | 76 | A |
| Example 51 | 3/4 (1/1) | z80 (70) | HR-39 (2.0) | SL-1/SL-2/SL-7 (60/37/3) | N-1 (7) | — | 76 | A |
| Example 52 | 1/7 (1/1) | z68 (110) | HR-28 (0.3) | SL-1/SL-4/SL-6 (55/40/5) | N-1 (7) | — | 76 | A |

| | Resin (A) (2 g) | Acid Generator (mg) | Resin (C) (mass %) | Solvent (ratio by mass) | Basic Compound (mg) | Surfactant (mg) | Receding Contact Angle (°) | WM Defect |
|---|---|---|---|---|---|---|---|---|
| Comparative Example 1 | 1 | z2 (80) | HR-17 (0.3) | SL-1 (100) | N-1 (7) | W-1 (3) | 61 | C |
| Comparative Example 2 | 2 | z80 (70) | HR-39 (2.0) | SL-1/SL-2 (60/40) | N-2 (8) | W-3 (3) | 62 | C |
| Comparative Example 3 | 3 | z79 (60) | HR-26 (0.7) | SL-1/SL-3 (70/30) | N-3 (6) | W-3 (3) | 61 | C |
| Comparative Example 4 | 4 | z68 (110) | HR-28 (0.3) | SL-1/SL-4 (60/40) | N-1 (8) | W-3 (3) | 62 | C |
| Comparative Example 5 | 5 | z66 (100) | HR-47 (0.4) | SL-4 (100) | N-1 (8) | W-3 (3) | 62 | C |
| Comparative Example 6 | 1 | z2 (80) | HR-17 (0.3) | SL-1/SL-6 (99/1) | N-1 (8) | W-3 (3) | 60 | C |
| Comparative Example 7 | 2 | z80 (70) | HR-39 (2.0) | SL-1/SL-2/SL-7 (60/39/1) | N-1 (8) | W-3 (3) | 62 | C |
| Comparative Example 8 | 3 | z79 (60) | HR-26 (0.7) | SL-1/SL-3/SL-7 (70/29/1) | N-1 (8) | W-3 (3) | 60 | C |
| Comparative Example 9 | 4 | z68 (110) | HR-28 (0.3) | SL-1/SL-4/SL-7 (55/44/1) | N-1 (8) | W-3 (3) | 62 | C |
| Comparative Example 10 | 5 | z66 (100) | HR-47 (0.4) | SL-4/SL-8 (99/1) | N-1 (8) | W-3 (3) | 62 | C |
| Comparative Example 11 | 1 | z2 (80) | HR-17 (0.3) | SL-1/SL-6 (50/50) | N-1 (8) | W-3 (3) | 66 | B |
| Comparative Example 12 | 2 | z80 (70) | HR-39 (2.0) | SL-1/SL-2/SL-7 (50/10/40) | N-1 (8) | W-3 (3) | 65 | B |
| Comparative Example 13 | 3 | z79 (60) | HR-26 (0.7) | SL-1/SL-3/SL-7 (50/20/30) | N-1 (8) | W-3 (3) | 66 | B |
| Comparative Example 14 | 4 | z68 (110) | HR-28 (0.3) | SL-1/SL-4/SL-7 (20/30/50) | N-1 (8) | W-3 (3) | 67 | B |
| Comparative Example 15 | 5 | z66 (100) | HR-47 (0.4) | SL-4/SL-8 (75/25) | N-1 (8) | W-3 (3) | 65 | B |
| Comparative Example 16 | 1 | z2 (80) | HR-17 (0.3) | SL-1/SL-4 (95/5) | N-1 (8) | W-3 (3) | 62 | C |
| Comparative Example 17 | 2 | z80 (70) | HR-39 (2.0) | SL-1/SL-2/SL-3 (60/37/3) | N-1 (8) | W-3 (3) | 62 | C |
| Comparative Example 18 | 3 | z79 (60) | HR-26 (0.7) | SL-1/SL-3/SL-5 (70/22/8) | N-1 (8) | W-3 (3) | 61 | C |
| Comparative Example 19 | 4 | z68 (110) | HR-28 (0.3) | SL-1/SL-4/SL-4 (55/40/5) | N-1 (8) | W-3 (3) | 62 | C |

TABLE 3-continued

| | | | | | | | | |
|---|---|---|---|---|---|---|---|---|
| Comparative Example 20 | 5 | z66 (100) | HR-47 (0.4) | SL-4/SL-2 (90/10) | N-1 (8) | W-3 (3) | 62 | C |
| Comparative Example 21 | 6 | z2 (80) | HR-50 (2.0) | SL-1/SL-2 (60/40) | N-1 (7) | W-1 (3) | 62 | C |
| Comparative Example 22 | 7 | z80 (70) | HR-42 (0.5) | SL-1/SL-2 (60/40) | N-2 (11) | W-2 (3) | 63 | C |
| Comparative Example 23 | 8 | z79 (60) | HR-29 (0.3) | SL-1/SL-2 (60/40) | N-3 (6) | W-3 (3) | 62 | C |
| Comparative Example 24 | 9 | z68 (110) | HR-24 (0.4) | SL-1/SL-2 (60/40) | N-1 (7) | W-3 (3) | 61 | C |
| Comparative Example 25 | 10 | z66 (100) | HR-26 (0.7) | SL-1/SL-2 (60/40) | N-1 (7) | W-3 (3) | 65 | B |
| Comparative Example 26 | 11 | z60 (80) | HR-39 (2.0) | SL-1/SL-2 (60/40) | N-1 (9) | W-3 (3) | 63 | C |
| Comparative Example 27 | 12 | z2 (80) | HR-47 (0.4) | SL-1/SL-2 (60/40) | N-1 (7) | W-3 (3) | 61 | C |
| Comparative Example 28 | 13 | z2 (80) | HR-47 (0.4) | SL-1/SL-2 (60/40) | N-1 (6) | W-3 (3) | 60 | C |
| Comparative Example 29 | 14 | z80 (70) | HR-26 (0.7) | SL-1/SL-2 (60/40) | N-1 (7) | W-3 (3) | 61 | C |
| Comparative Example 30 | 15 | z79 (60) | HR-47 (0.4) | SL-1/SL-2 (60/40) | N-1 (8) | W-3 (3) | 62 | C |
| Comparative Example 31 | 16 | z68 (110) | HR-17 (0.3) | SL-1/SL-2 (60/40) | N-1 (7) | W-3 (3) | 62 | C |
| Comparative Example 32 | 17 | z66 (100) | HR-39 (2.0) | SL-1/SL-2 (60/40) | N-1 (7) | W-3 (3) | 61 | C |
| Comparative Example 33 | 18 | z60 (80) | HR-26 (0.7) | SL-1/SL-2 (60/40) | N-1 (7) | W-3 (3) | 60 | C |
| Comparative Example 34 | 19 | z2 (80) | HR-28 (0.3) | SL-1/SL-2 (60/40) | N-1 (7) | W-3 (3) | 63 | C |
| Comparative Example 35 | 20 | z2 (80) | HR-47 (0.4) | SL-1/SL-2 (60/40) | N-1 (7) | W-3 (3) | 64 | C |
| Comparative Example 36 | 6 | z2/z40 (40/120) | HR-26 (1.0) | SL-1/SL-6 (98/2) | N-3 (6) | W-1 (3) | 65 | B |

The denotations in Tables are as follows. The acid generators are corresponding to those described above.
N-1: N,N-Dibutylaniline
N-2: 2,6-Diisopropylaniline
N-3: 2-Phenylbenzimidazole
W-1: Megaface F176 (produced by Dainippon Ink & Chemicals, Inc.) (fluorine-containing)
W-2: Troysol S-366 (produced by Troy Chemical)
W-3: PF6320 (produced by OMNOVA, fluorine-containing)
SL-1: Propylene glycol monomethyl ether acetate (PGMEA)
SL-2: Propylene glycol monomethyl ether (PGME)
SL-3: Ethyl lactate
SL-4: Cyclohexanone
SL-5: 2-Heptanone
SL-6: γ-Butyrolactone
SL-7: Propylene carbonate
SL-8: N-methylpyrrolidone

INDUSTRIAL APPLICABILITY

According to the present invention, a positive resist composition for immersion exposure, ensuring that the receding contact angle for immersion liquid at the immersion exposure can be more improved and the watermark (WM) defect can be reduced, and a pattern forming method using the same are provided.

This makes it possible to perform scanning at a high speed even in the exposure using a scan-type immersion exposure machine, thereby improving the productivity of immersion exposure, and also raise the reliability because of reduction in the WM defect.

This application is based on Japanese patent application JP 2008-249216, filed on Sep. 26, 2008, the entire content of which is hereby incorporated by reference, the same as if set forth at length.

The invention claimed is:

1. A positive resist composition for immersion exposure, comprising the following (A) to (D):
   (A) a resin capable of decomposing by an action of an acid to increase a solubility of the resin in an alkali developer;
   (B) a compound capable of generating an acid upon irradiation with an actinic ray or radiation;
   (C) a resin having at least either one of a fluorine atom and a silicon atom; and
   (D) a mixed solvent containing at least one kind of a solvent selected from the group consisting of solvents represented by any one of the following formulae (S1) to (S3), in which a total amount of the at least one kind of the solvent is from 3 to 20 mass % based on all solvents of the mixed solvent (D):

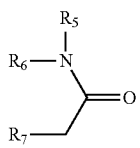

(S3)

wherein each of $R_1$ to $R_7$ independently represents an alkyl group, a cycloalkyl group or an aryl group; and $R_1$ and $R_2$, $R_3$ and $R_4$, and $R_6$ and $R_7$ may combine with each other to form a ring, respectively, the resin (C) contains at least one group selected from the group consisting of the following (x) to (z):

(x) an alkali-soluble group, (y) a group capable of decomposing by the action of an alkali developer to increase the solubility in an alkali developer, and (z) a group capable of decomposing by the action of an acid, polydispersity of the resin (C) is from 1 to 2, the compound (B) is a compound represented by the following formula (ZI):

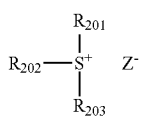

ZI wherein $R_{202}$ and $R_{203}$ independently represents an organic group, $Z^-$ is an aliphatic sulfonate anion substituted by a fluorine atom at the α-position of the sulfonic acid, and the resin (A) contains at least one repeating unit represented by formula (1):

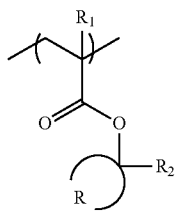

(1)

wherein $R_1$ represents a hydrogen atom, a methyl group or a group represented by —$CH_2$—$R_9$, and $R_9$ represents a monovalent organic group, $R_2$ represents an alkyl group or a cycloalkyl group, and each R independently represents an atomic group necessary for forming an alicyclic structure together with the carbon atom;

wherein the resin (C) is an organic polymer.

2. The positive resist composition for immersion exposure according to claim 1, wherein the resin (A) contains at least two kinds of repeating units represented by formula (1):

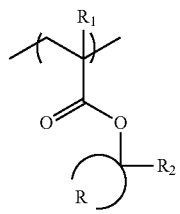

(1)

wherein $R_1$ represents a hydrogen atom, a methyl group or a group represented by —$CH_2$—$R_9$, and $R_9$ represents a monovalent organic group, $R_2$ represents an alkyl group or a cycloalkyl group, and each R independently represents an atomic group necessary for forming an alicyclic structure together with the carbon atom.

3. The positive resist composition for immersion exposure according to claim 1, wherein the resin (A) contains at least one repeating unit represented by formula (1) and at least one repeating unit represented by formula (2):

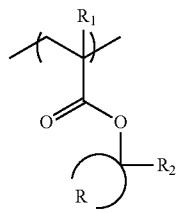

(1)

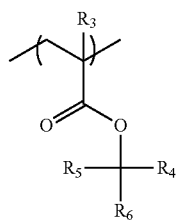

(2)

wherein each of $R_1$ and $R_3$ independently represents a hydrogen atom, a methyl group or a group represented by —$CH_2$—$R_9$ and $R_9$ represents a monovalent organic group, each of $R_2$, $R_4$, $R_5$ and $R_6$ independently represents an alkyl group or a cycloalkyl group, and each R independently represents an atomic group necessary for forming an alicyclic structure together with the carbon atom.

4. The positive resist composition for immersion exposure according to claim 1, wherein the resin (A) contains a lactone structure-containing repeating unit represented by the following formula (3):

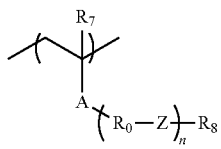
(3)

wherein A represents an ester bond (a group represented by —COO—), or a group represented by —CONH—, $R_0$ represents, in the case where a plurality of $R_0$'s are present, each independently represents, an alkylene group, a cycloalkylene group or a combination thereof, Z represents, in the case where a plurality of Z's are present, each independently represents, an ether bond, an ester bond, an amide bond, a urethane bond or a urea bond, $R_8$ represents a monovalent organic group having a lactone structure, n is a repetition number of the structure represented by —$R_0$—Z— in the repeating unit represented by formula (3) and represents an integer of 1 to 5, and $R_7$ represents a hydrogen atom, a halogen atom or an alkyl group.

5. The positive resist composition for immersion exposure according to claim 1,
wherein the aliphatic sulfonate anion in the compound (B) is substituted by a monovalent group having a polycyclic cycloalkyl group.

6. The positive resist composition for immersion exposure according to claim 1,
wherein the resin (C) contains (x) an alkali-soluble group.

7. The positive resist composition for immersion exposure according to claim 1,
wherein the resin (C) contains (y) a group capable of decomposing by the action of an alkali developer to increase the solubility in an alkali developer.

8. The positive resist composition for immersion exposure according to claim 1,
wherein the resin (C) contains (z) a group capable of decomposing by the action of an acid.

9. The positive resist composition for immersion exposure according to claim 1,
wherein the amount added of the resin (C) is in an amount of 0.01 to 10 mass %, based on the entire solid content of the resist composition.

10. The positive resist composition for immersion exposure according to claim 1,
wherein the composition further contains an onium carboxylate.

11. The positive resist composition for immersion exposure according to claim 1,
wherein the mixed solvent (D) further contains cyclohexanone.

12. The positive resist composition for immersion exposure according to claim 1, wherein the resin (C) contains a carbon atom in the backbone chain.

13. The positive resist composition for immersion exposure according to claim 1, wherein, in the resin (C), the backbone chain is constituted by only a carbon atom.

14. The positive resist composition for immersion exposure according to claim 1, wherein the resin (C) contains at least one repeating unit derived from a monomer selected from the group consisting of (meth)acrylic acid, styrene, ethylene, norbornene, and derivatives thereof.

15. The positive resist composition for immersion exposure according to claim 1, wherein the resin (C) contains a repeating unit derived from a (meth)acrylic acid derivative, and the repeating unit contains at least one of fluorine atom or silicon atom in the side chain.

16. The positive resist composition for immersion exposure according to claim 1, wherein the resin (C) contains a repeating unit derived from a (meth)acrylic acid derivative, and the repeating unit contains fluorine atom in the side chain.

17. The positive resist composition for immersion exposure according to claim 1, wherein the resin (C) only consists of a repeating unit derived from a monomer selected from the group consisting of (meth)acrylic acid, styrene, ethylene, norbornene, and derivatives thereof.

18. A positive resist composition for immersion exposure, comprising the following (A) to (D):
(A) a resin capable of decomposing by an action of an acid to increase a solubility of the resin in an alkali developer;
(B) a compound capable of generating an acid upon irradiation with an actinic ray or radiation;
(C) a resin having at least either one of a fluorine atom and a silicon atom; and
(D) a mixed solvent containing at least one kind of a solvent selected from the group consisting of solvents represented by any one of the following formulae (S1) to (S3), in which a total amount of the at least one kind of the solvent is from 3 to 20 mass % based on all solvents of the mixed solvent (D):

(S1)

(S2)

(S3)

wherein each of $R_1$ to $R_7$ independently represents an alkyl group, a cycloalkyl group or an aryl group; and
$R_1$ and $R_2$, $R_3$ and $R_4$, and $R_6$ and $R_7$ may combine with each other to form a ring, respectively,
the resin (C) contains at least one group selected from the group consisting of the following (x) to (z):
(x) an alkali-soluble group,
(y) a group capable of decomposing by the action of an alkali developer to increase the solubility in an alkali developer, and
(z) a group capable of decomposing by the action of an acid, and
the mixed solvent (D) further contains at least one selected from the group consisting of ethyl lactate, cyclohexanone and 2-heptanone.

19. The positive resist composition for immersion exposure according to claim 18,
wherein the mixed solvent (D) further contains propylene glycol monomethyl ether acetate.

20. The positive resist composition for immersion exposure according to claim 18,
wherein the mixed solvent (D) contains γ-butyrolactone as the solvent represented by formula (S2).

21. The positive resist composition for immersion exposure according to claim 18,
wherein the mixed solvent (D) contains cyclohexanone.

22. A positive resist composition for immersion exposure, comprising the following (A) to (D):
(A) a resin capable of decomposing by an action of an acid to increase a solubility of the resin in an alkali developer;
(B) a compound capable of generating an acid upon irradiation with an actinic ray or radiation;
(C) a resin having at least either one of a fluorine atom and a silicon atom; and
(D) a mixed solvent containing at least one kind of a solvent selected from the group consisting of solvents represented by any one of the following formulae (S1) to (S3), in which a total amount of the at least one kind of the solvent is from 3 to 20 mass % based on all solvents of the mixed solvent (D):

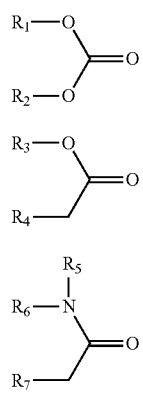

wherein each of $R_1$ to $R_7$ independently represents an alkyl group, a cycloalkyl group or an aryl group; and
$R_1$ and $R_2$, $R_3$ and $R_4$, and $R_6$ and $R_7$ may combine with each other to form a ring, respectively,
the resin (C) contains at least one group selected from the group consisting of the following (x) to (z):
(x) an alkali-soluble group,
(y) a group capable of decomposing by the action of an alkali developer to increase the solubility in an alkali developer, and
(z) a group capable of decomposing by the action of an acid, and
the compound (B) is a compound represented by the following formula (I):

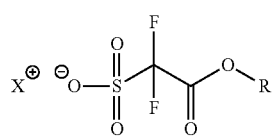

wherein $X^+$ represents an organic counter ion, and
R represents a hydrogen atom or an organic group.

23. The positive resist composition for immersion exposure according to claim 22,
wherein the organic group of R is an organic group represented by the following formula (II):

$$-(CH_2)_n-Rc-(Y)_m \quad (II)$$

wherein Rc represents a monocyclic or polycyclic organic group having a carbon number of 3 to 30 which may contain a cyclic ether, cyclic thioether, cyclic ketone, cyclic carbonate ester, lactone or lactam structure,
Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8;
m=from 0 to 6; when a plurality of Y's are present, each Y may be the same as or different from every other Y, and
n=from 0 to 10.

24. The positive resist composition for immersion exposure according to claim 23,
wherein Rc in formula (II) is a polycyclic organic group.

25. The positive resist composition for immersion exposure according to claim 23,
wherein Rc in formula (II) is an adamantyl group.

26. A resist film formed by coating a resist composition on a substrate and drying the coated resist composition, the resist composition comprising the following (A) to (D):
(A) a resin capable of decomposing by an action of an acid to increase a solubility of the resin in an alkali developer;
(B) a compound capable of generating an acid upon irradiation with an actinic ray or radiation;
(C) a resin having at least either one of a fluorine atom and a silicon atom; and
(D) a mixed solvent containing at least one kind of a solvent selected from the group consisting of solvents represented by any one of the following formulae (S1) to (S3), in which a total amount of the at least one kind of the solvent is from 3 to 20 mass % based on all solvents of the mixed solvent (D):

wherein each of $R_1$ to $R_7$ independently represents an alkyl group, a cycloalkyl group or an aryl group; and
$R_1$ and $R_2$, $R_3$ and $R_4$, and $R_6$ and $R_7$ may combine with each other to form a ring, respectively,
the resin (C) contains at least one group selected from the group consisting of the following (x) to (z):

(x) an alkali-soluble group,
(y) a group capable of decomposing by the action of an alkali developer to increase the solubility in an alkali developer, and
(z) a group capable of decomposing by the action of an acid, and the mixed solvent (D) further contains at least one selected from the group consisting of ethyl lactate, cyclohexanone and 2-heptanone.

27. A resist film formed by coating a resist composition on a substrate and drying the coated resist composition, the resist composition comprising the following (A) to (D):
   (A) a resin capable of decomposing by an action of an acid to increase a solubility of the resin in an alkali developer;
   (B) a compound capable of generating an acid upon irradiation with an actinic ray or radiation;
   (C) a resin having at least either one of a fluorine atom and a silicon atom; and
   (D) a mixed solvent containing at least one kind of a solvent selected from the group consisting of solvents represented by any one of the following formulae (S1) to (S3), in which a total amount of the at least one kind of the solvent is from 3 to 20 mass % based on all solvents of the mixed solvent (D):

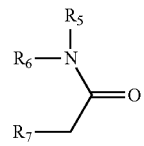
(S1)

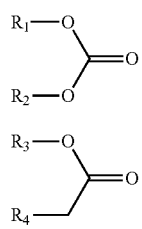
(S2)

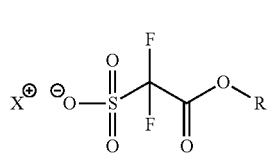
(S3)

wherein each of $R_1$ to $R_7$ independently represents an alkyl group, a cycloalkyl group or an aryl group; and
$R_1$ and $R_2$, $R_3$ and $R_4$, and $R_6$ and $R_7$ may combine with each other to form a ring, respectively, the resin (C) contains at least one group selected from the group consisting of the following (x) to (z):
(x) an alkali-soluble group,
(y) a group capable of decomposing by the action of an alkali developer to increase the solubility in an alkali developer, and
(z) a group capable of decomposing by the action of an acid, and the compound (B) is a compound represented by the following formula (I):

(I)

wherein $X^+$ represents an organic counter ion, and
R represents a hydrogen atom or an organic group.

* * * * *